United States Patent
Ahn et al.

(10) Patent No.: US 10,580,876 B2
(45) Date of Patent: Mar. 3, 2020

(54) INTEGRATED CIRCUIT DEVICES

(71) Applicant: Samsung Electronics Co., Ltd., Suwon-si, Gyeonggi-do (KR)

(72) Inventors: Jun-hyeok Ahn, Hwaseong-si (KR); Eun-jung Kim, Daegu (KR); Hui-jung Kim, Seongnam-si (KR); Ki-seok Lee, Hwaseong-si (KR); Bong-soo Kim, Yongin-si (KR); Myeong-dong Lee, Seoul (KR); Sung-hee Han, Hwaseong-si (KR); Yoo-sang Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/914,611

(22) Filed: Mar. 7, 2018

(65) Prior Publication Data
US 2019/0097007 A1  Mar. 28, 2019

(30) Foreign Application Priority Data

Sep. 22, 2017  (KR) .......................... 10-2017-0122881

(51) Int. Cl.
*H01L 29/423* (2006.01)
*H01L 21/74* (2006.01)
(Continued)

(52) U.S. Cl.
CPC ........ *H01L 29/4236* (2013.01); *H01L 21/743* (2013.01); *H01L 21/76224* (2013.01);
(Continued)

(58) Field of Classification Search
CPC ............. H01L 21/743; H01L 21/76224; H01L 29/0649; H01L 29/401; H01L 29/4236;
(Continued)

(56) References Cited

U.S. PATENT DOCUMENTS 8,148,260 B2  4/2012 Shin
8,796,141 B2  8/2014 Yu
(Continued)

FOREIGN PATENT DOCUMENTS

CN    106158794 A    11/2016
JP    2016-082182 A    5/2016

OTHER PUBLICATIONS

Singapore Search Report and Written Opinion dated Sep. 3, 2018 issued in corresponding Singapore Patent Application No. 10201803879X.

*Primary Examiner* — Matthew C Landau
*Assistant Examiner* — Priya M Rampersaud
(74) *Attorney, Agent, or Firm* — Harness, Dickey & Pierce, P.L.C.

(57) ABSTRACT

An integrated circuit device may include a pair of line structures. Each line structure may include a pair of conductive lines extending over a substrate in a first horizontal direction and a pair of insulating capping patterns respectively covering the pair of conductive lines. The integrated circuit device may include a conductive plug between the pair of line structures and a metal silicide film contacting a top surface of the conductive plug between the pair of insulating capping patterns. The conductive plug may have a first width between the pair of conductive lines and a second width between the pair of insulating capping patterns, in a second horizontal direction perpendicular to the first horizontal direction, where the second width is greater than the first width.

19 Claims, 66 Drawing Sheets

(51) Int. Cl.
*H01L 21/762* (2006.01)
*H01L 29/06* (2006.01)
*H01L 29/40* (2006.01)
*H01L 29/66* (2006.01)

(52) U.S. Cl.
CPC ........ *H01L 29/0649* (2013.01); *H01L 29/401* (2013.01); *H01L 29/42364* (2013.01); *H01L 29/66621* (2013.01)

(58) Field of Classification Search
CPC ......... H01L 29/42364; H01L 29/66621; H01L 21/3086; H01L 27/10817; H01L 27/10876; H01L 27/10885; H01L 21/76264; H01L 21/7682; H01L 21/76897; H01L 23/4821; H01L 23/5222; H01L 23/53295; H01L 27/10814; H01L 27/10855; H01L 21/76816; H01L 21/76877; H01L 23/5226; H01L 23/528; H01L 23/5329; H01L 28/00
See application file for complete search history.

(56) References Cited

U.S. PATENT DOCUMENTS

| | | | |
|---|---|---|---|
| 9,012,321 B1 | 4/2015 | Kim et al. | |
| 9,099,343 B2 | 8/2015 | Kim et al. | |
| 9,117,696 B2 | 8/2015 | Kim et al. | |
| 9,165,934 B2 | 10/2015 | Choi et al. | |
| 9,230,612 B2 | 1/2016 | Park | |
| 9,419,000 B2 | 8/2016 | Kim et al. | |
| 9,589,898 B2 | 3/2017 | Chun | |
| 2007/0059931 A1 | 3/2007 | Park et al. | |
| 2013/0292847 A1 | 11/2013 | Choi et al. | |
| 2013/0328199 A1* | 12/2013 | Yun | H01L 23/49866 257/754 |
| 2014/0231892 A1* | 8/2014 | Song | H01L 21/76897 257/296 |
| 2014/0299989 A1* | 10/2014 | Lim | H01L 23/48 257/751 |
| 2014/0327063 A1 | 11/2014 | Park | |
| 2015/0171214 A1* | 6/2015 | Han | H01L 29/4236 257/330 |
| 2015/0179651 A1* | 6/2015 | Park | H01L 27/10885 257/296 |
| 2015/0214146 A1* | 7/2015 | Kim | H01L 27/10855 257/741 |
| 2015/0333069 A1 | 11/2015 | Kim et al. | |
| 2016/0276349 A1 | 9/2016 | Kwon | |
| 2017/0005097 A1 | 1/2017 | Kim et al. | |
| 2017/0062347 A1 | 3/2017 | Kim et al. | |
| 2018/0040560 A1 | 2/2018 | Kim et al. | |
| 2018/0190656 A1* | 7/2018 | Ho | H01L 27/1085 |

* cited by examiner

LC – LC'

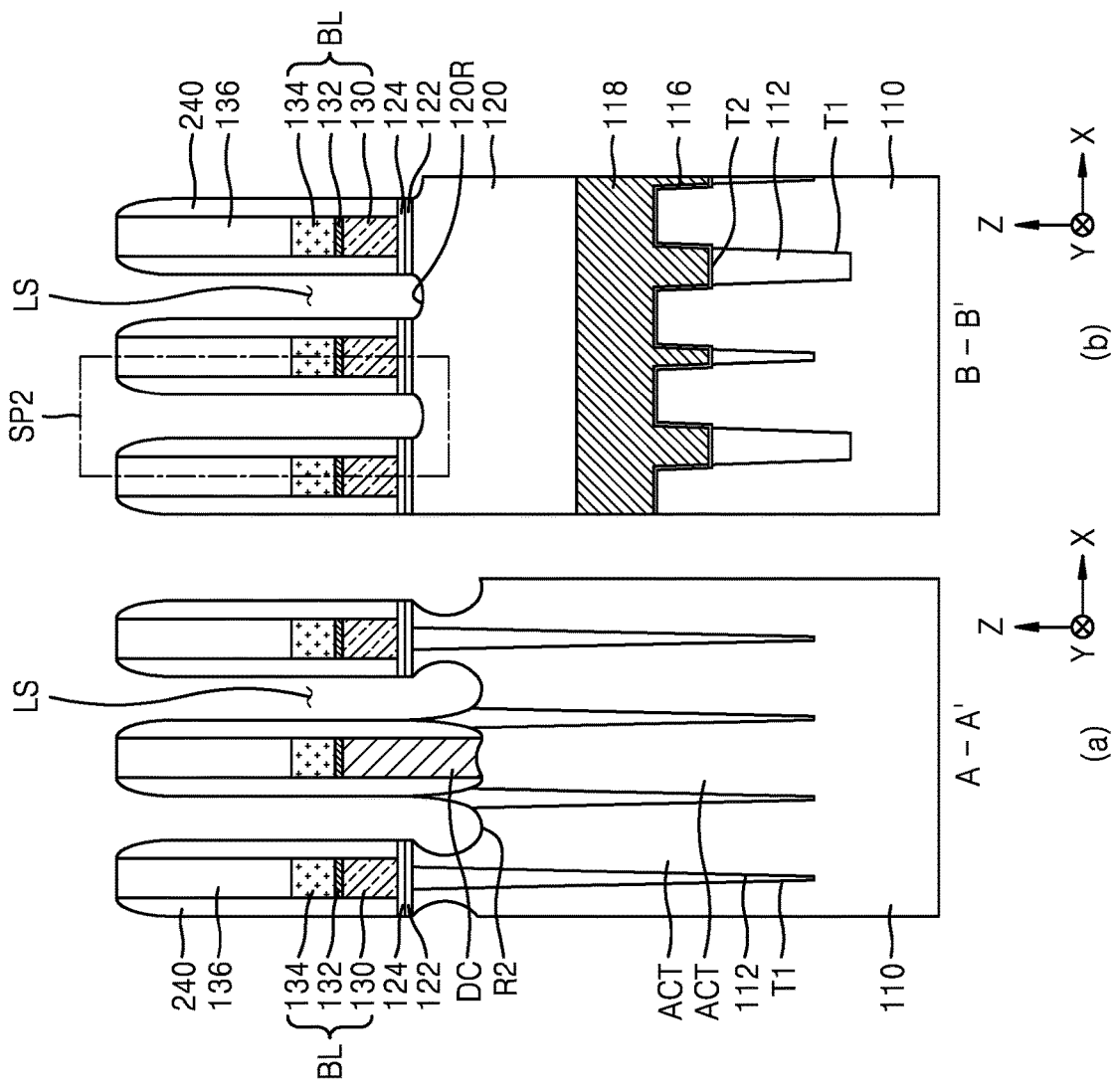

INTEGRATED CIRCUIT DEVICES

CROSS-REFERENCE TO RELATED APPLICATION

This application claims the benefit, under 35 U.S.C. § 119, of Korean Patent Application No. 10-2017-0122881, filed on Sep. 22, 2017, in the Korean Intellectual Property Office, the disclosure of which is incorporated herein in its entirety by reference.

BACKGROUND

The inventive concepts relate to integrated circuit devices, and more particularly, to integrated circuit devices including a plurality of conductive patterns adjacent to each other.

Recently, as integrated circuit devices are rapidly downscaled, intervals between a plurality of wiring lines are reduced. Thus, since an area occupied by a plurality of contact plugs arranged between the plurality of wiring lines (such an area being referred to herein as a "contact area") is gradually reduced, it is difficult to ensure that an integrated circuit device includes a sufficient contact area.

SUMMARY

Some example embodiments provide integrated circuit devices having a structure which may ensure a sufficient contact area to support a plurality of contact plugs arranged between a plurality of wiring lines.

The inventive concepts provide an integrated circuit device having a structure which reduces contact resistance by increasing contact areas of contact plugs as much as possible, the contact plugs being formed within a limited area in an integrated circuit device having a smaller unit cell size due to down-scaling of the integrated circuit device.

According to some example embodiments of the inventive concepts, an integrated circuit device may include a pair of line structures including a pair of conductive lines extending over a substrate in a first horizontal direction, and a pair of insulating capping patterns respectively covering the pair of conductive lines. The integrated circuit device may include a conductive plug between the pair of line structures, the conductive plug having a first width between the pair of conductive lines and a second width between the pair of insulating capping patterns. The first width and the second width may be in a second horizontal direction perpendicular to the first horizontal direction, and the second width may be greater than the first width. The integrated circuit device may include a metal silicide film contacting a top surface of the conductive plug between the pair of insulating capping patterns.

According to some example embodiments of the inventive concepts, an integrated circuit device may include a pair of line structures including a pair of conductive lines extending over a substrate in a first horizontal direction, and a pair of insulating capping patterns respectively covering the pair of conductive lines. The integrated circuit device may include a plurality of contact structures arranged in a line between the pair of line structures and a plurality of insulating fences arranged sequentially between adjacent contact structures of the plurality of contact structures between the pair of line structures. Each contact structure of the plurality of contact structures may include a conductive plug having a first width between the pair of conductive lines in a second horizontal direction and a second width between the pair of insulating capping patterns in the second horizontal direction. The second horizontal direction may be perpendicular to the first horizontal direction, where the second width is greater than the first width. The integrated circuit device may include a metal silicide film contacting a top surface of the conductive plug.

BRIEF DESCRIPTION OF THE DRAWINGS

Embodiments of the inventive concepts will be more clearly understood from the following detailed description taken in conjunction with the accompanying drawings in which:

FIGS. 19A to 19G are cross-sectional views illustrating sequential processes of a method of fabricating an integrated circuit device, according to some example embodiments of the inventive concepts;

DETAILED DESCRIPTION OF THE EMBODIMENTS

Figure 1:
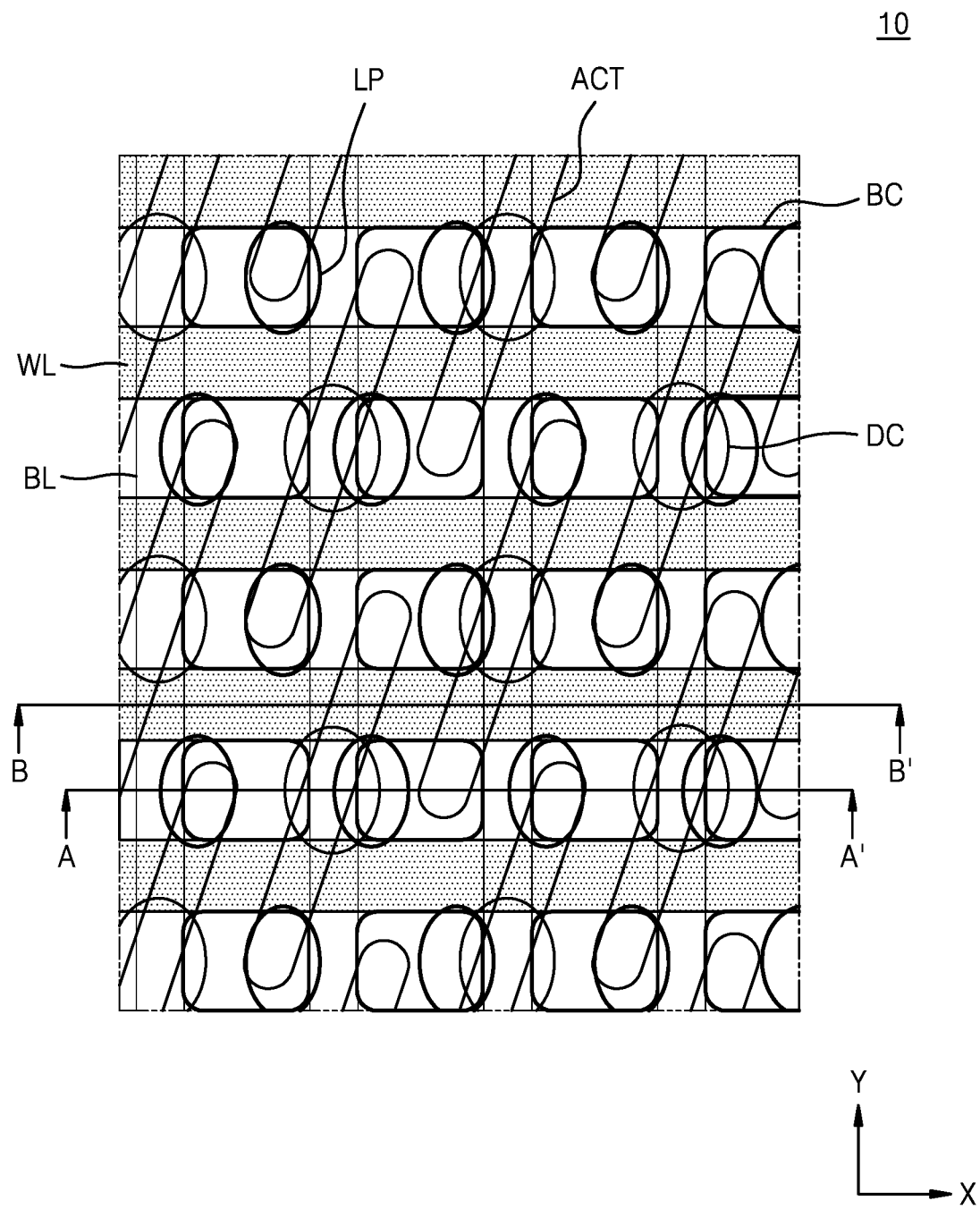
FIG. 1 is a schematic planar layout illustrating main configurations of a memory cell array region of an integrated circuit device according to some example embodiments of the inventive concepts.

Hereinafter, example embodiments of the inventive concepts will be described in detail with reference to the accompanying drawings. Like components will be denoted by like reference numerals throughout the specification, and repeated descriptions thereof will be omitted.

FIG. 1 is a schematic planar layout illustrating main configurations of a memory cell array region of an integrated circuit device 10 according to some example embodiments of the inventive concepts.

Referring to FIG. 1, in the integrated circuit device 10, a plurality of active regions ACT may be arranged to horizontally extend in an oblique direction with respect to an X direction and a Y direction on a plane. A plurality of word lines WL may extend parallel to each other along the X direction across the plurality of active regions ACT. On the plurality of word lines WL, a plurality of bit lines BL may extend parallel to each other along the Y direction intersecting the X direction. The plurality of bit lines BL may be connected to the plurality of active regions ACT via direct contacts DC.

A plurality of buried contacts BC may be formed between two bit lines BL adjacent to each other among the plurality of bit lines BL. A plurality of conductive landing pads LP may be formed on the plurality of buried contacts BC. The plurality of buried contacts BC and the plurality of conductive landing pads LP may connect bottom electrodes (not shown) of capacitors formed over the plurality of bit lines BL to the active regions ACT. Each of the plurality of conductive landing pads LP may be arranged to at least partially overlap a buried contact BC.

Figure 2A:
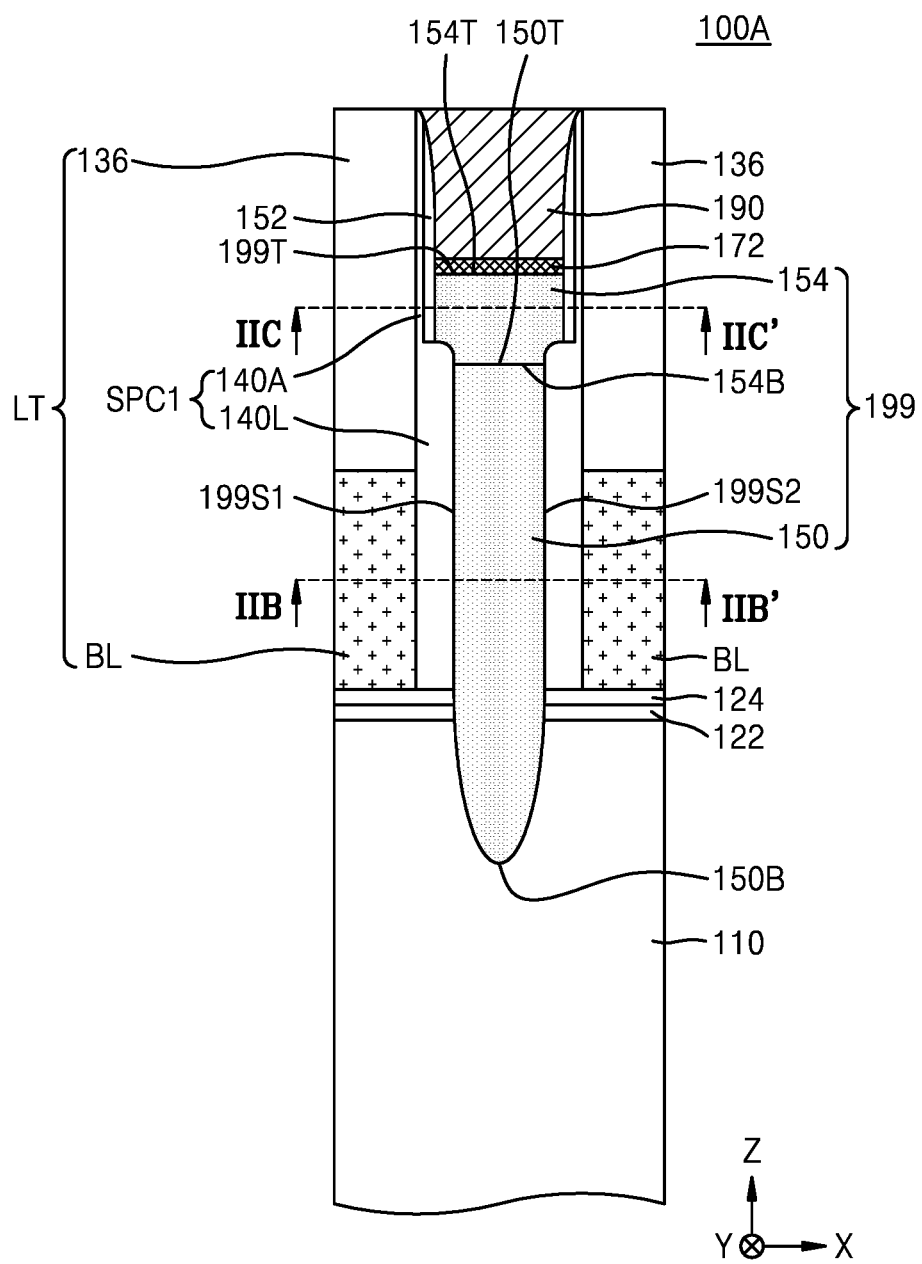
FIG. 2A is a main-portion cross-sectional view illustrating an integrated circuit device according to some example embodiments of the inventive concepts.
Figure 2B:
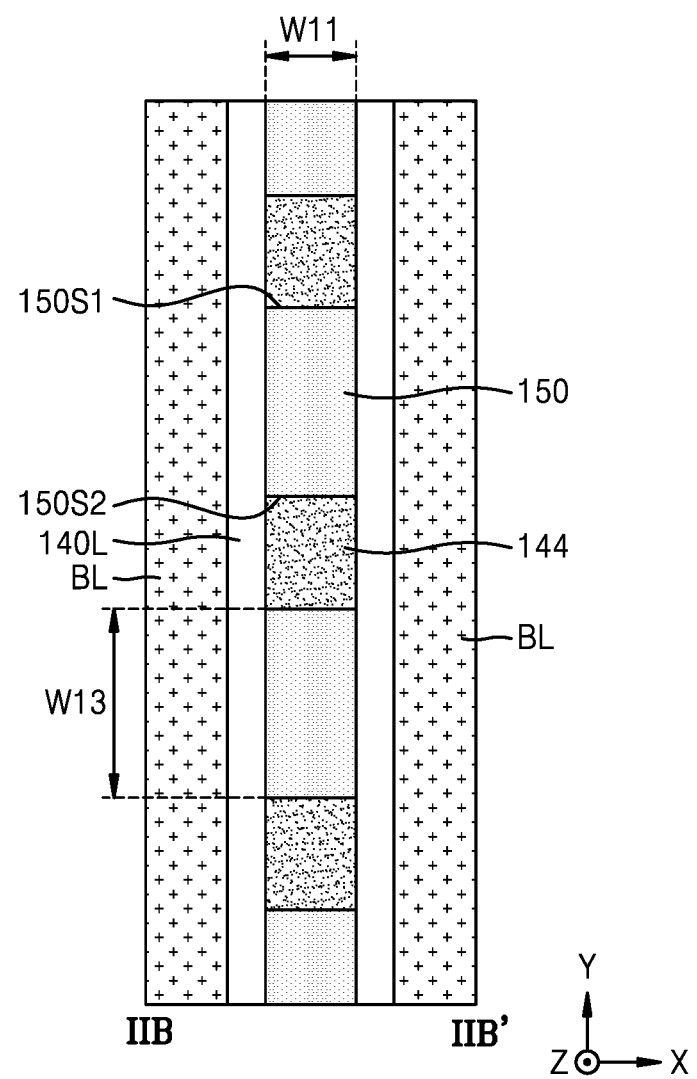
FIGS. 2B and 2C are respectively plan views of partial regions of FIG. 2A.
Figure 2C:
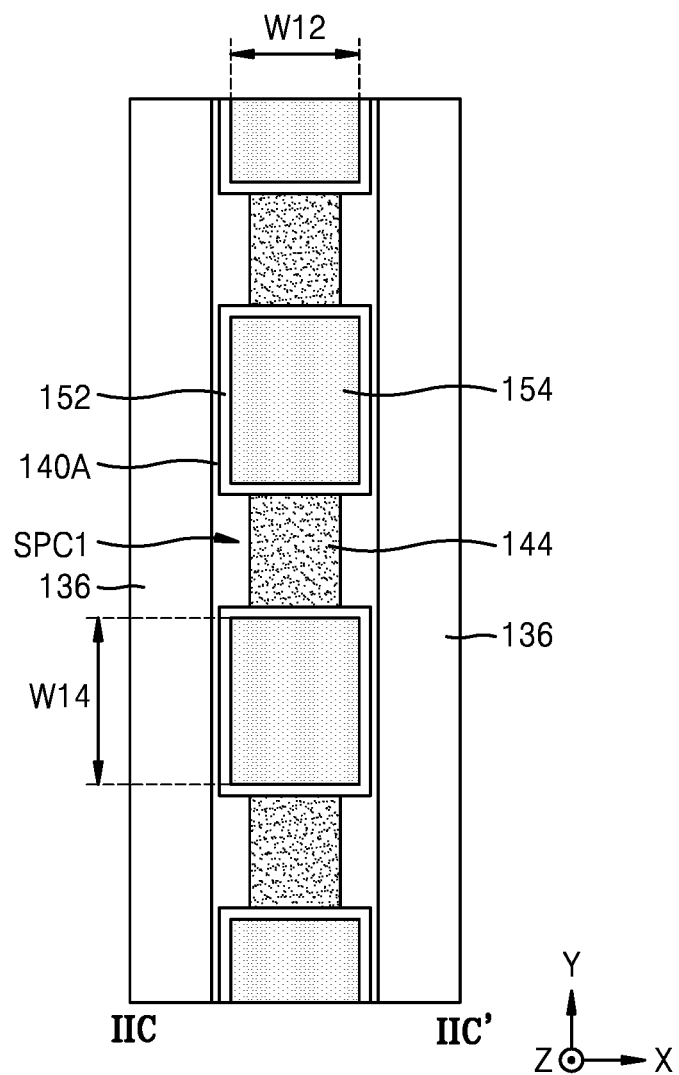

FIG. 2A is a main-portion cross-sectional view illustrating an integrated circuit device 100A according to some example embodiments of the inventive concepts, FIG. 2B is a plan view of a partial region at a cross-sectional view line IIB-IIB' of FIG. 2A, and FIG. 2C is a plan view of a partial region at a cross-sectional view line IIC-IIC' of FIG. 2A. The integrated circuit device 100A shown in FIGS. 2A to 2C may constitute a portion of the integrated circuit device 10 shown in FIG. 1.

Referring to FIGS. 2A to 2C, the integrated circuit device 100A includes a plurality of line structures BL and 136 and a plurality of contact structures 150, 154, and 172 arranged in a line along the Y direction between a pair of adjacent line structures BL and 136 among the plurality of line structures BL and 136, the plurality of line structures BL and 136 including a plurality of bit lines BL horizontally extending over a substrate 110 along one direction (Y direction in FIGS. 2A to 2C) and a plurality of insulating capping patterns 136 covering the plurality of bit lines BL. A plurality of insulating fences 144 (e.g., at least a pair of the insulating fences 144) may be arranged between the pair of adjacent line structures BL and 136, and may also be arranged one by one (e.g., sequentially, in an alternating pattern, etc.) between separate, adjacent contact structures of the plurality of contact structures 150, 154, and 172. As shown in at least FIG. 2B, a pair of insulating fences 144 may respectively contact separate, opposite sidewalls of a first sidewall 150S1 and a second sidewall 150S2 among sidewalls of a conductive plug 199. Restated, the conductive plug 199 may include two sidewalls 150S1 and 150S2 contacting two adjacent insulating fences 144 among the plurality of insulating fences 144, and each sidewall of the two sidewalls 150S1 and 150S2 may extend flat from a region between the pair of conductive lines BL to a region between the pair of insulating capping patterns 136.

As shown in at least FIG. 2C, a pair of insulating fences 144 may not contact (e.g., directly contact) the conductive plug 199 in at least a partial region between the pair of insulating capping patterns 136 (e.g., in a plane extending with the cross-sectional view line IIC-IIC'. The plurality of contact structures 150, 154, and 172 arranged in a line along the Y direction may be insulated from each other by the plurality of insulating fences 144. As referred to herein, each bit line BL may be referred to as a "conductive line." As shown in FIGS. 2A-2C, an integrated circuit device may include a pair of "conductive lines" BL and a pair of insulating capping patterns 136 respectively covering the pair of conductive lines BL. Each separate conductive line BL and insulating capping pattern 136 thereon may be referred to collectively as a "line structure" LT. Thus, as shown in FIGS. 2A-2C, the integrated circuit device 100A may include a pair of "line structures" LT, where each separate line structure LT includes a separate conductive line BL of a pair of conductive lines BL and a separate insulating capping pattern 136 of a pair of insulating capping patters respectively covering the pair of conductive lines BL. As shown in FIGS. 2A-2C, the pair of conductive lines BL may extend over a substrate 110 in a first horizontal direction. In some example embodiments, including the example embodiments shown in FIGS. 2A-2C, the upper insulating spacer 152 may include a portion between the top surface 154T of the enlarged conductive plug 154 and each insulating fence 144.

In some embodiments, the substrate 110 may include silicon, for example, single-crystalline silicon, polycrystalline silicon, or amorphous silicon. In some other embodiments, the substrate 110 may include at least one selected from among Ge, SiGe, SiC, GaAs, InAs, and InP. The substrate 110 may include a conductive region, for example, an impurity-doped well, or an impurity-doped structure.

A first insulating film 122 and a second insulating film 124 are formed on the substrate 110 in this stated order. Each of the first insulating film 122 and the second insulating film 124 may include silicon oxide, silicon nitride, or combinations thereof.

The plurality of bit lines BL may extend parallel to each other in the Y direction, on the second insulating film 124. Each of the plurality of bit lines BL may include conductive polysilicon, TiN, TiSiN, W, tungsten silicide, or combinations thereof, without being limited thereto. Each of the plurality of insulating capping patterns 136 may include a silicon nitride film. Each of the plurality of insulating fences 144 may include a silicon nitride film.

Each contact structure of the plurality of contact structures 150, 154, and 172 may include a lower conductive plug 150, an enlarged conductive plug 154, and a metal silicide film 172, which are stacked on the substrate 110 in this stated order. As shown in FIG. 2A, the lower conductive plug 150 and the enlarged conductive plug 154 may be collectively referred to as the "conductive plug" 199. As shown in FIGS. 2A-2C, the conductive plug 199 may have a first width W11 (e.g., along the cross-sectional line IIB-IIB' as shown in FIG. 2A) between the pair of conductive lines BL and a second width W12 (e.g., along the cross-sectional line IIC-IIC' as shown in FIG. 2A) between the pair of insulating capping patterns 136. For example, the lower conductive plug 150 may have the first width and the enlarged conductive plug 154 may have the second width. As shown in FIGS. 2A-2C, the first width and the second width may be in a second horizontal direction that is perpendicular to the first horizontal direction as referred to above. As further shown in FIGS. 2A-2C, the second width may be greater than the first width. As further shown in at least FIG. 2A, the metal silicide film 172 may contact a top surface 199T of the conductive plug 199 between the pair of insulating capping patterns 136. As shown, the top surface 199T of the conductive plug 199 may be a top surface 154T of the enlarged conductive plug 154.

As shown in FIGS. 2B-2C, the conductive plug 199 may have a third width W13 between the pair of conductive lines BL and a fourth width W14 between the pair of insulating capping patterns 136, the third width W13 and the fourth width W14 being in the first horizontal direction, the fourth width W14 being smaller ("less") than the third width W13.

As shown in FIGS. 2A-2C, the conductive plug 199 may include a lower conductive plug 150 between the pair of conductive lines BL, where the lower conductive plug 150 has a top surface 150T isolated from direct contact with ("spaced apart from") the metal silicide film 172. The conductive plug 199 may further include an enlarged conductive plug 154 between the pair of insulating capping patterns 136, where the enlarged conductive plug 154 has a bottom surface 154B contacting (e.g., "directly contacting") a top surface of the lower conductive plug and a top surface 154T contacting the metal silicide film 172.

As shown in FIG. 2A, a width of a top surface 154T of the enlarged conductive plug 154 in a second horizontal direction (e.g., the X direction) may be greater than a width of a top surface 150T of the lower conductive plug 150 in the second horizontal direction.

Each of a plurality of lower conductive plugs 150 may penetrate the first insulating film 122 and the second insulating film 124 and extend to a lower level than a top surface of the substrate 110. Each of the plurality of lower conductive plugs 150 may have a bottom surface 150B at a lower level than the top surface of the substrate 110 and a top surface 150T at a higher level than top surfaces of the plurality of bit lines BL. The top surface 150T of the lower conductive plug 150 is spaced apart from the metal silicide film 172. A portion of the lower conductive plug 150 between a pair of adjacent bit lines BL, for example, a portion thereof at line IIB-IIB' may have a first width W11 in the X direction perpendicular to the Y direction.

A bottom surface 154B of the enlarged conductive plug 154 may contact the top surface 150T of the lower conductive plug 150, and a top surface 154T of the enlarged conductive plug 154 may contact the metal silicide film 172.

The enlarged conductive plug 154 is enlarged toward a pair of insulating capping patterns 136 on both sides thereof in the X direction, and a width of the top surface 154T of the enlarged conductive plug 154 is greater than a width of the bottom surface 154B thereof. Thus, the width of the top surface 154T of the enlarged conductive plug 154 may be greater than a width of the top surface 150T of the lower conductive plug 150, in the X direction. A portion of the enlarged conductive plug 154 between the pair of insulating capping patterns 136, for example, a portion thereof at line IIC-IIC' may have a second width W12 greater than the first width W11, in the X direction. Each of the lower conductive plug 150 and the enlarged conductive plug 154 may include doped polysilicon.

The metal silicide film 172 may include cobalt silicide, nickel silicide, or manganese silicide, without being limited thereto.

As shown in FIGS. 2A-2C, the conductive plug 199 may have respective first and second sidewalls 199S1 and 199S2 that are opposite to each other and each extend in the aforementioned first horizontal direction (the first horizontal direction may be the Y direction, for example). As shown in FIG. 2A each sidewall of the first and second sidewalls 199S1 and 199S2 may extend without a step from a region between the pair of conductive lines BL (e.g., at the point of the cross-sectional view line IIB-IIB') to a region between the pair of insulating capping patterns 136 (e.g., a region of the enlarged conductive plug 154 that is above the bottom surface 154B.

An insulating spacer SPC1 is arranged between a bit line BL and the lower conductive plug 150 (and thus between each conductive line BL and the conductive plug 199) and between the bit line BL and an insulating fence 144, and an upper insulating spacer 152 is arranged between each insulating capping pattern 136 and the enlarged conductive plug 154 (and thus between each insulating capping pattern 136 and the conductive plug 199). A portion of the insulating spacer SPC1, which is arranged between the bit line BL and the lower conductive plug 150, may constitute a lower insulating spacer 140L. A width of the upper insulating spacer 152 is less than a width of the lower insulating spacer 140L, in the X direction (e.g., the aforementioned second horizontal direction). As shown in at least FIGS. 2B-2C, the lower insulating spacer 140L may have a line shape extending side by side (e.g., in parallel) with the plurality of bit lines BL in the Y direction, and the upper insulating spacer 152 may have a ring shape surrounding (e.g., configured to surround) the enlarged conductive plug 154. The bottom surface 154B of the enlarged conductive plug 154 may be at a lower level than a top surface of the lower insulating spacer 140L. Thus, an interface between the lower conductive plug 150 and the enlarged conductive plug 154 may be at a lower level than the top surface of the lower insulating spacer 140L.

The insulating spacer SPC1 may have a multilayer structure including an insulating liner 140A. In some embodiments, the insulating spacer SPC1 may include the insulating liner 140A and at least one insulating film covering the insulating liner 140A, the insulating liner 140A and the at least one insulating film being arranged on a sidewall of the bit line BL in this stated order. The at least one insulating film may include an oxide film, a nitride film, an air spacer, or combinations thereof. Of the insulating spacer SPC1, only the insulating liner 140A may be in a region between the insulating capping pattern 136 and the enlarged conductive plug 154 as shown in FIG. 2C. The upper insulating spacer 152 may be arranged between the insulating liner 140A and the enlarged conductive plug 154. The upper insulating spacer 152 may include a silicon nitride film.

As shown in FIG. 2B, at the first level, each of the plurality of insulating fences 144 may contact both sidewalls opposite to each other in the Y direction among sidewalls of the lower conductive plugs 150. On the other hand, since the upper insulating spacer 152 has a ring shape surrounding the enlarged conductive plug 154, each of the plurality of insulating fences 144 may not contact portions of both sidewalls opposite to each other in the Y direction among sidewalls of the enlarged conductive plugs 154, as shown in FIG. 2C. As described below with reference to FIG. 16B, both sidewalls opposite to each other in the Y direction among the sidewalls of the enlarged conductive plugs 154 may include portions contacting each of the plurality of insulating fences 144.

In a contact space defined by two adjacent insulating fences 144 in a region between two adjacent insulating capping patterns 136, the metal silicide film 172 may be formed to contact the top surface 154T of the enlarged conductive plug 154 having a relatively large surface area. Thus, contact resistance may be reduced.

A space over the metal silicide film 172 may be filled with a conductive landing pad 190. The conductive landing pad 190 may be connected to the enlarged conductive plug 154 via the metal silicide film 172. The conductive landing pad 190 may constitute a conductive landing pad LP shown in FIG. 1.

Although FIG. 2A illustrates an example in which the conductive landing pad 190 has a structure filling the region between the two adjacent insulating capping patterns 136, the inventive concepts is not limited thereto. For example, the conductive landing pad 190 may have a structure filling the region between the two adjacent insulating capping patterns 136 and simultaneously extending over a top surface of the insulating capping pattern 136 to vertically overlap a portion of each of the plurality of bit lines BL. The conductive landing pad 190 includes a conductive barrier film and a conductive layer. The conductive layer may be arranged on the conductive barrier film to fill a space between the insulating capping patterns 136. The conductive barrier film may include a Ti/TiN stacked structure. The conductive layer may include doped polysilicon, a metal, a metal silicide, a conductive metal nitride, or combinations thereof. For example, the conductive layer may include tungsten (W). The conductive landing pad 190 may have a pattern shape of an island in a plan view.

Figure 3A:
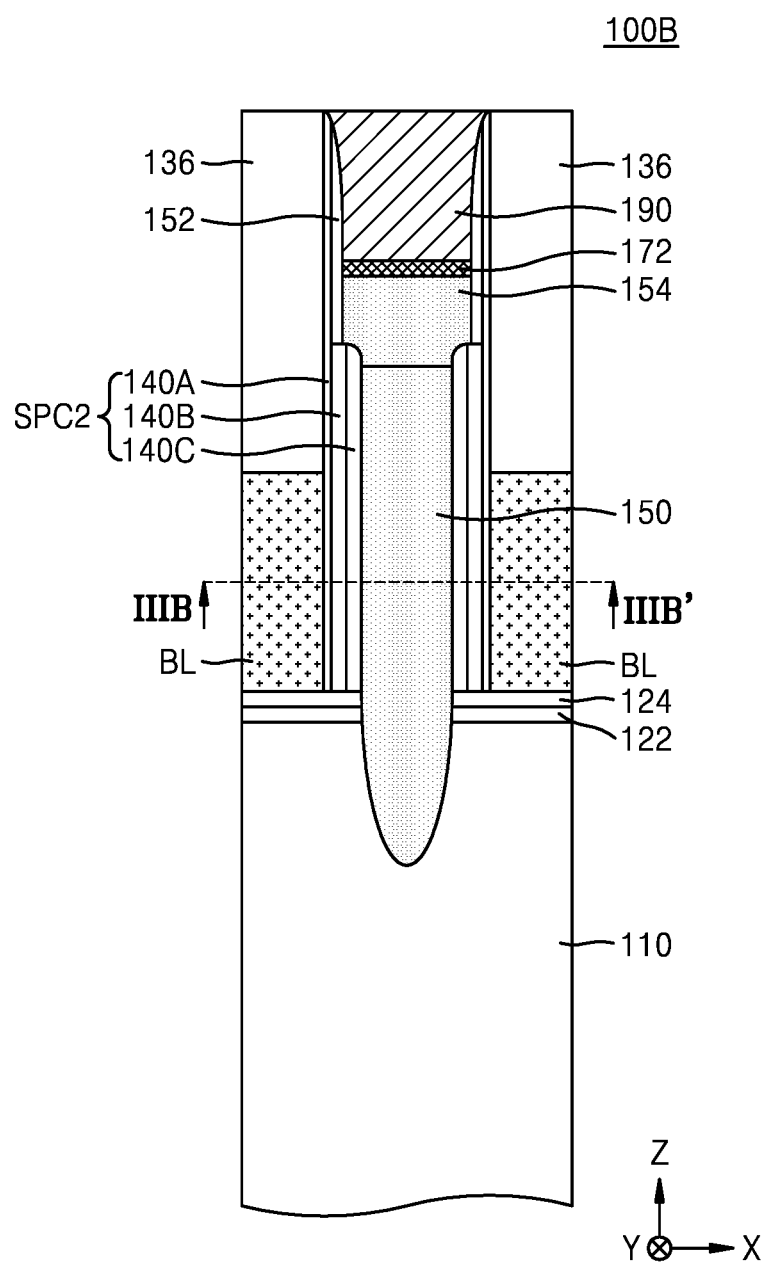
FIG. 3A is a main-portion cross-sectional view illustrating an integrated circuit device according to some example embodiments of the inventive concepts.
Figure 3B:
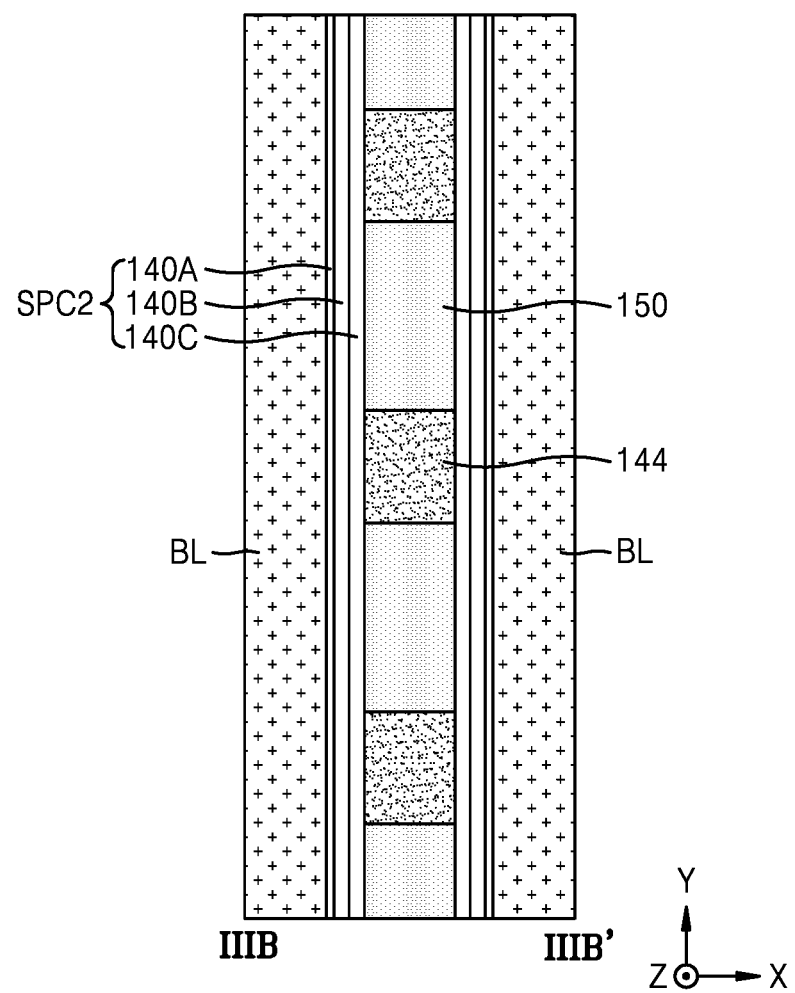
FIG. 3B is a plan view of a partial region of FIG. 3A.

FIG. 3A is a main-portion cross-sectional view illustrating an integrated circuit device 100B according to some example embodiments of the inventive concepts, and FIG. 3B is a plan view of a partial region at cross-sectional view line IIIB-IIIB' of FIG. 3A. The integrated circuit device 100B shown in FIGS. 3A and 3B may constitute a portion of the integrated circuit device 10 shown in FIG. 1. In FIGS. 3A and 3B, the same reference numerals as in FIGS. 2A to 2C respectively denote the same members, and repeated descriptions thereof will be omitted.

Referring to FIGS. 3A and 3B, the integrated circuit device 100B has a substantially identical configuration to the integrated circuit device 100A shown in FIGS. 2A to 2C. However, an insulating spacer SPC2 having a three-layer structure is arranged between the bit line BL and the lower conductive plug 150 and between the bit line BL and the insulating fence 144. A portion of the insulating spacer SPC2, which is arranged between the bit line BL and the lower conductive plug 150, may constitute a lower insulating spacer. A width of the upper insulating spacer 152 is less than a width of the insulating spacer SPC2, in the X direction. The insulating spacer SPC2 has a line shape extending (e.g., configured to extend) side by side with the plurality of bit lines BL in the Y direction.

The insulating spacer SPC2 may include the insulating liner 140A, a first insulating spacer 140B, and a second insulating spacer 140C, which are arranged on the sidewall of the bit line BL in this stated order. Of the insulating spacer SPC2, only the insulating liner 140A may be in the region between the insulating capping pattern 136 and the enlarged conductive plug 154 similar as in FIG. 2C. Each of the insulating liner 140A and the second insulating spacer 140C may include a silicon nitride film, and the first insulating spacer 140B may include a silicon oxide film.

Figure 4A:
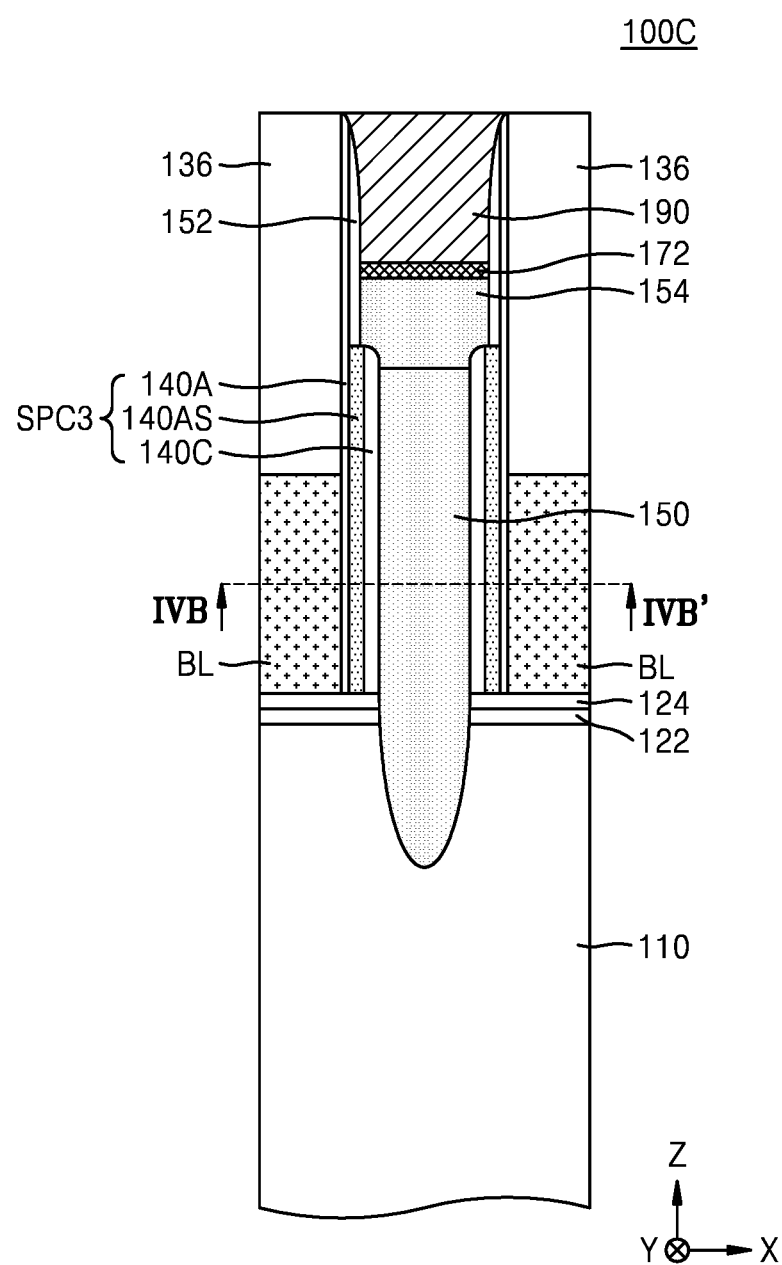
FIG. 4A is a main-portion cross-sectional view illustrating an integrated circuit device according to some example embodiments of the inventive concepts.
Figure 4B:
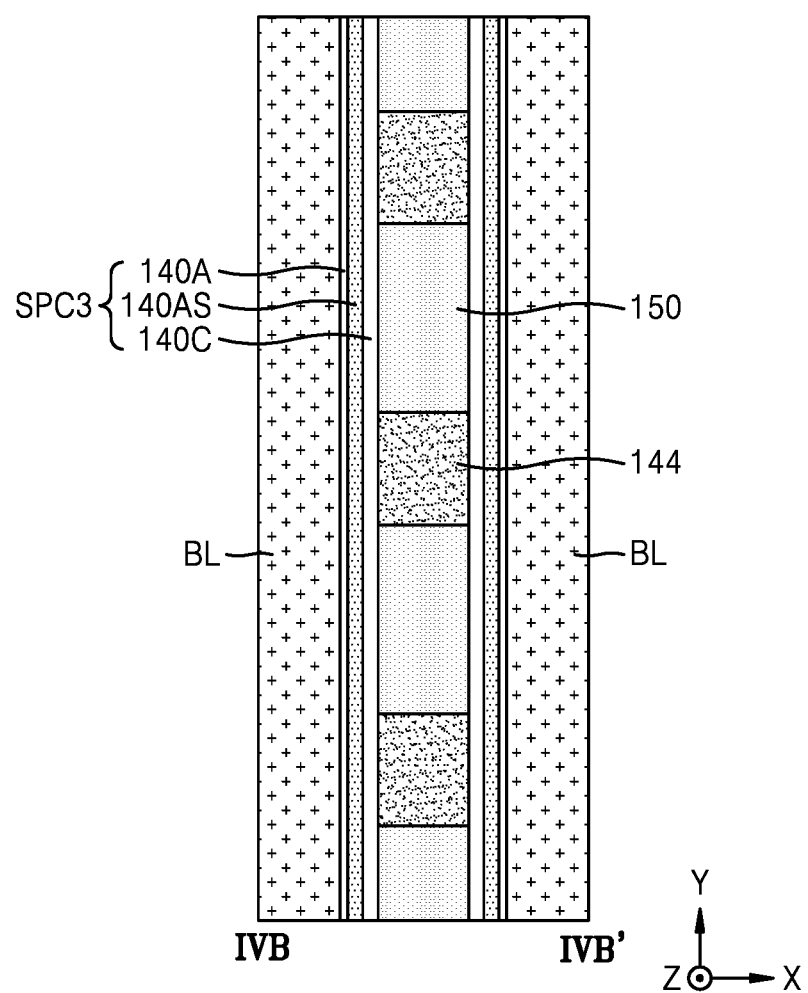
FIG. 4B is a plan view of a partial region of FIG. 4A.

FIG. 4A is a main-portion cross-sectional view illustrating an integrated circuit device 100C according to some example embodiments of the inventive concepts, and FIG. 4B is a plan view of a partial region at cross-sectional view line IVB-IVB' of FIG. 4A. The integrated circuit device 100C shown in FIGS. 4A and 4B may constitute a portion of the integrated circuit device 10 shown in FIG. 1. In FIGS. 4A and 4B, the same reference numerals as in FIGS. 2A to 3B respectively denote the same members, and repeated descriptions thereof will be omitted.

Referring to FIGS. 4A and 4B, the integrated circuit device 100C has a substantially identical configuration to the integrated circuit device 100B shown in FIGS. 3A to 3B. However, an insulating spacer SPC3 including a lower air spacer 140AS is arranged between the bit line BL and the lower conductive plug 150 and between the bit line BL and the insulating fence 144. A portion of the insulating spacer SPC3, which is arranged between the bit line BL and the lower conductive plug 150, may constitute the lower insulating spacer. A width of the upper insulating spacer 152 is less than a width of the insulating spacer SPC3, in the X direction. The insulating spacer SPC3 has a line shape extending side by side with the plurality of bit lines BL in the Y direction.

The insulating spacer SPC3 may include the insulating liner 140A, the lower air spacer 140AS, and the second insulating spacer 140C, which are arranged on the sidewall of the bit line BL in this stated order. Of the insulating spacer SPC3, only the insulating liner 140A may be in the region between the insulating capping pattern 136 and the enlarged conductive plug 154 as in FIG. 2C.

Figure 5A:
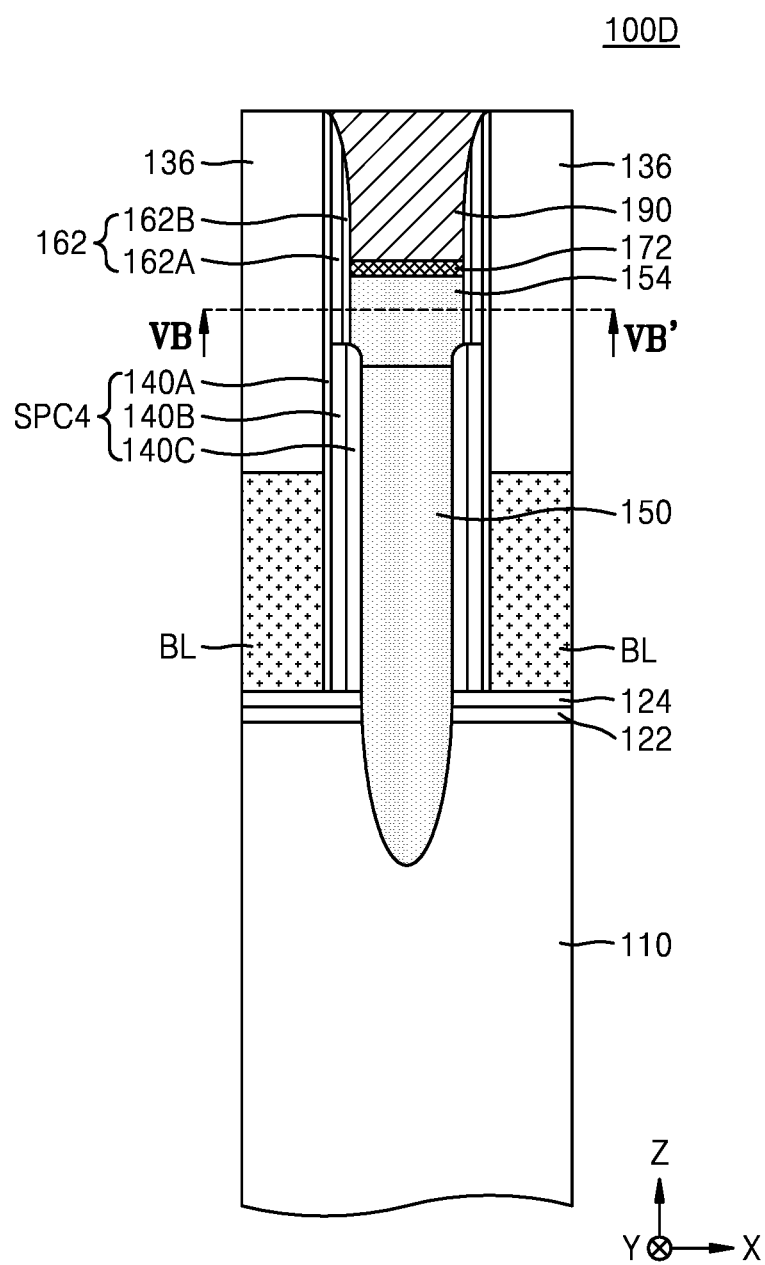
FIG. 5A is a main-portion cross-sectional view illustrating an integrated circuit device according to some example embodiments of the inventive concepts.
Figure 5B:
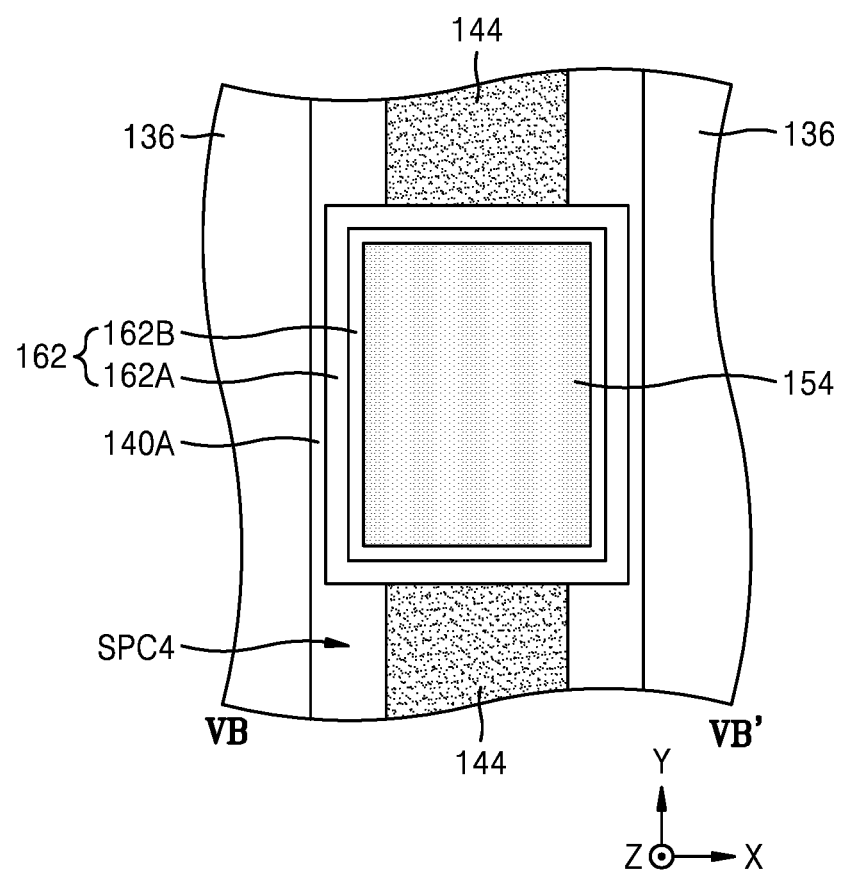
FIG. 5B is a plan view of a partial region of FIG. 5A.

FIG. 5A is a main-portion cross-sectional view illustrating an integrated circuit device 100D according to some example embodiments of the inventive concepts, and FIG. 5B is a plan view of a partial region at cross-sectional view line VB-VB' of FIG. 5A. The integrated circuit device 100D shown in FIGS. 5A and 5B may constitute a portion of the integrated circuit device 10 shown in FIG. 1. In FIGS. 5A and 5B, the same reference numerals as in FIGS. 2A to 3B respectively denote the same members, and repeated descriptions thereof will be omitted.

Referring to FIGS. 5A and 5B, the integrated circuit device 100D has a substantially identical configuration to the integrated circuit device 100B shown in FIGS. 3A to 3B. However, an insulating spacer SPC4 having a three-layer structure is arranged between the bit line BL and the lower conductive plug 150 and between the bit line BL and the insulating fence 144, and an upper insulating spacer 162 having a two-layer structure is arranged between the insulating capping pattern 136 and the enlarged conductive plug 154.

Like the insulating spacer SPC2 shown in FIGS. 3A and 3B, the insulating spacer SPC4 may include the insulating liner 140A, the first insulating spacer 140B, and the second insulating spacer 140C, which are arranged on the sidewall of the bit line BL in this stated order. A portion of the insulating spacer SPC4, which is arranged between the bit line BL and the lower conductive plug 150, may constitute the lower insulating spacer. A width of the upper insulating spacer 162 is less than a width of the insulating spacer SPC4, in the X direction. The insulating spacer SPC4 has a line shape extending side by side with the plurality of bit lines BL in the Y direction.

The upper insulating spacer 162 has a substantially identical configuration to the upper insulating spacer 152 shown in FIGS. 2A and 2C. However, the upper insulating spacer 162 includes an oxide spacer 162A and a nitride spacer 162B, which cover a sidewall of the insulating capping pattern 136 in this stated order. The oxide spacer 162A may include silicon oxide, and the nitride spacer 162B may include silicon nitride, without being limited thereto.

Figure 6A:
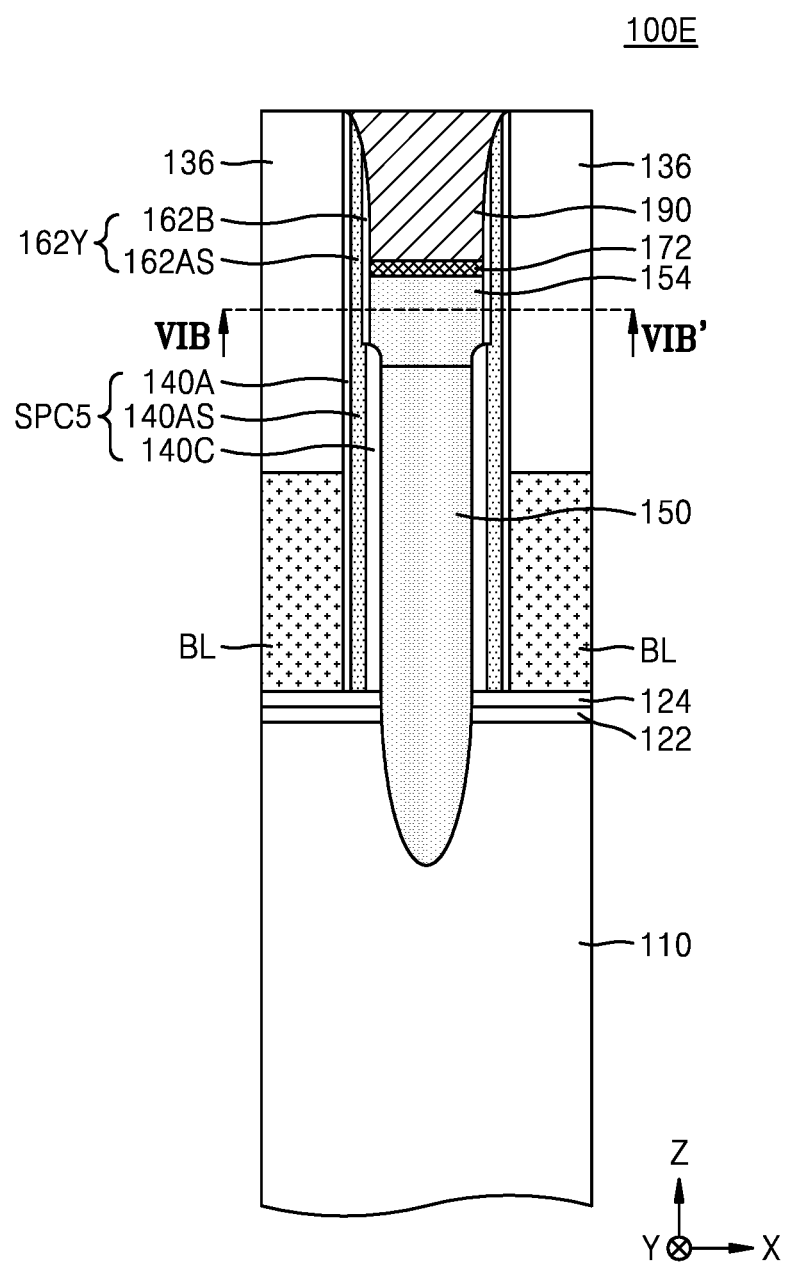
FIG. 6A is a main-portion cross-sectional view illustrating an integrated circuit device according to some example embodiments of the inventive concepts.
Figure 6B:
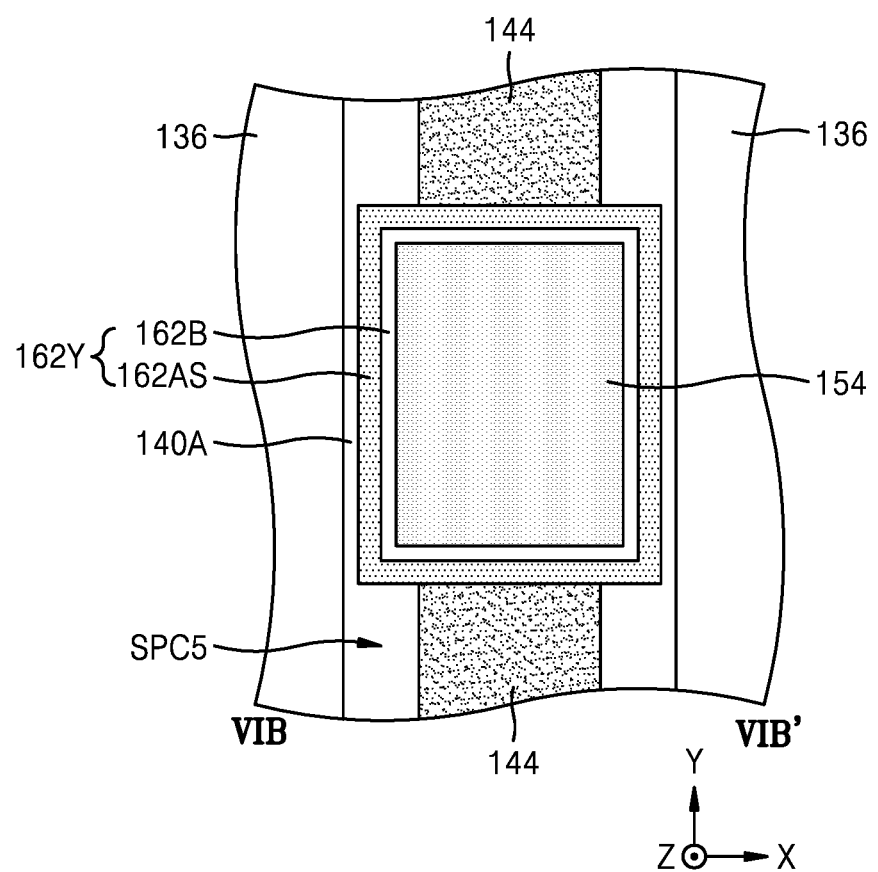
FIG. 6B is a plan view of a partial region of FIG. 6A.

FIG. 6A is a main-portion cross-sectional view illustrating an integrated circuit device 100E according to some example embodiments of the inventive concepts, and FIG. 6B is a plan view of a partial region at cross-sectional view line VIB-VIB' of FIG. 6A. The integrated circuit device 100E shown in FIGS. 6A and 6B may constitute a portion of the integrated circuit device 10 shown in FIG. 1. In FIGS. 6A and 6B, the same reference numerals as in FIGS. 2A to 5B respectively denote the same members, and repeated descriptions thereof will be omitted.

Referring to FIGS. 6A and 6B, the integrated circuit device 100E has a substantially identical configuration to the integrated circuit device 100D shown in FIGS. 5A to 5B. However, an insulating spacer SPC5 including the lower air spacer 140AS shown in FIGS. 4A and 4B is arranged between the bit line BL and the lower conductive plug 150 and between the bit line BL and the insulating fence 144. A portion of the insulating spacer SPC5, which is arranged between the bit line BL and the lower conductive plug 150, may constitute the lower insulating spacer. An upper insulating spacer 162Y of a two-layer structure including an upper air spacer 162AS is arranged between the insulating capping pattern 136 and the enlarged conductive plug 154.

A width of the upper insulating spacer 162Y is less than a width of the insulating spacer SPC5, in the X direction. The insulating spacer SPC5 has a line shape extending side by side with the plurality of bit lines BL in the Y direction. The insulating spacer SPC5 may include the insulating liner 140A, the lower air spacer 140AS, and the second insulating spacer 140C, which are arranged on the sidewall of the bit line BL in this stated order. Of the insulating spacer SPC5, only the insulating liner 140A may be in the region between the insulating capping pattern 136 and the enlarged conductive plug 154 as shown in FIG. 5B.

The upper insulating spacer 162Y may include the upper air spacer 162AS and the nitride spacer 162B, which cover the sidewall of the insulating capping pattern 136 in this stated order.

The upper air spacer 162AS may communicate with the lower air spacer 140AS. Restated, the upper air spacer 162AS and the lower air spacer 140AS may comprise an individual, continuous air spacer. A width of the upper air spacer 162AS may be less than a width of the lower air spacer 140AS, in the X direction. Referring back to FIG. 4B, the lower air spacer 140AS may have a line shape extending side by side (e.g., in parallel) with the bit line BL in the Y direction, and the upper air spacer 162AS may have a ring shape surrounding the enlarged conductive plug 154 (e.g., as shown in FIG. 6B) and thus surrounding a conductive plug 199 that includes the enlarged conductive plug 154.

Figure 7A:
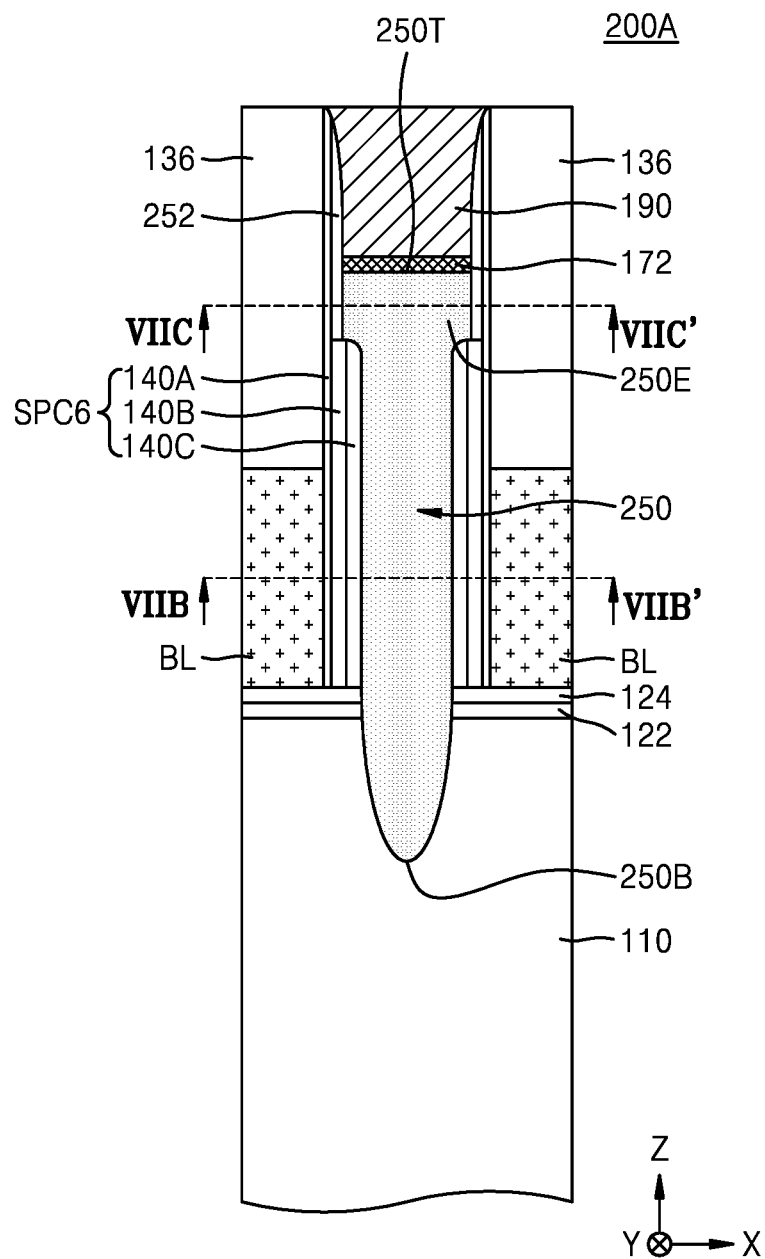
FIG. 7A is a main-portion cross-sectional view illustrating an integrated circuit device according to some example embodiments of the inventive concepts.
Figure 7B:
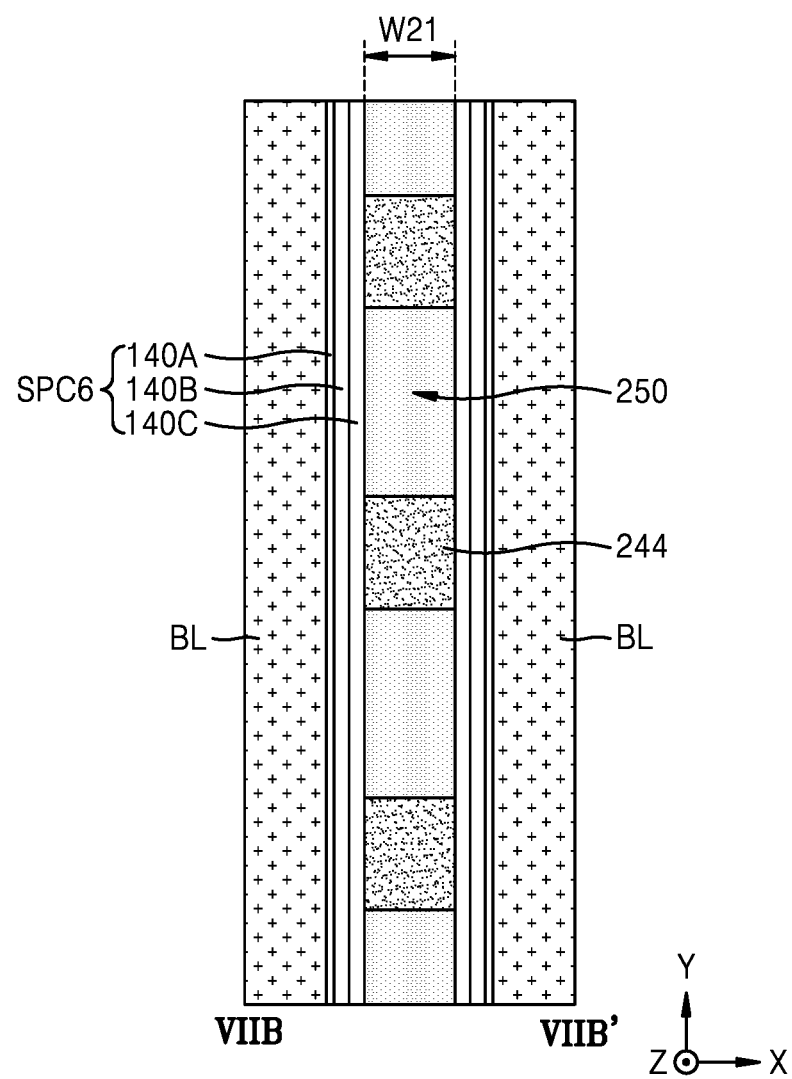
FIGS. 7B and 7C are respectively plan views of partial regions of FIG. 7A.
Figure 7C:
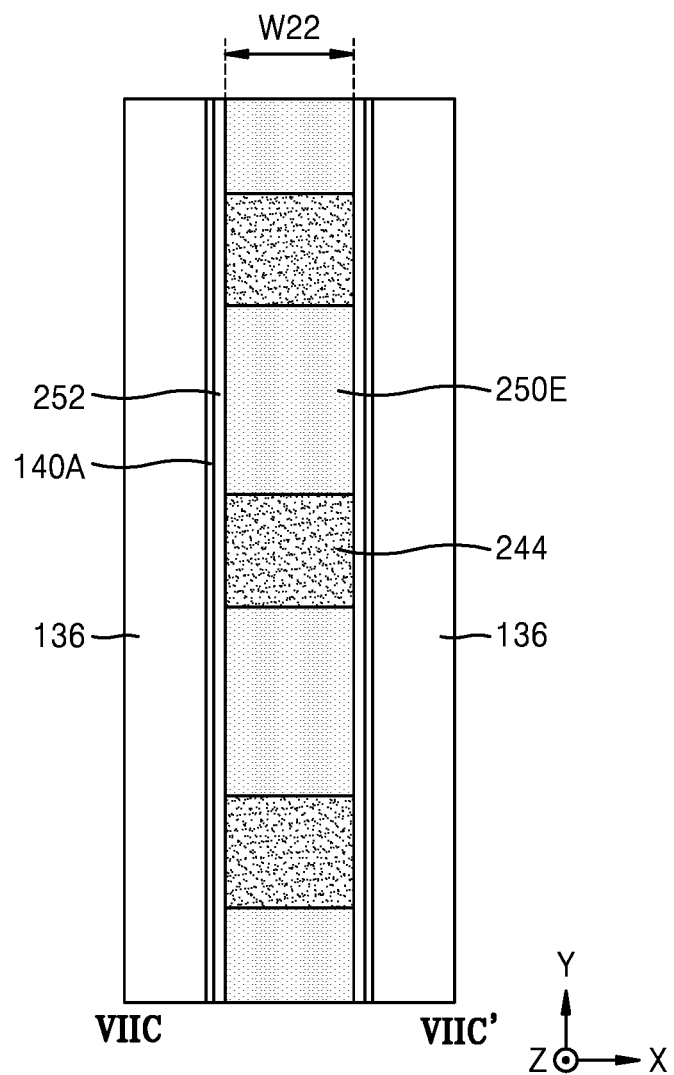

FIG. 7A is a main-portion cross-sectional view illustrating an integrated circuit device 200A according to some example embodiments of the inventive concepts, FIG. 7B is a plan view of a partial region at cross-sectional view line VIIB-VIIB' of FIG. 7A, and FIG. 7C is a plan view of a partial region at cross-sectional view line VIIC-VIIC' of FIG. 7A. The integrated circuit device 200A shown in FIGS. 7A to 7C may constitute a portion of the integrated circuit device 10 shown in FIG. 1. In FIGS. 7A to 7C, the same reference numerals as in FIGS. 2A to 6B respectively denote the same members, and repeated descriptions thereof will be omitted.

Referring to FIGS. 7A to 7C, the integrated circuit device 200A includes the plurality of line structures BL and 136 and a plurality of contact structures 250 and 172 arranged in a line along the Y direction between the pair of adjacent line structures BL and 136 among the plurality of line structures BL and 136, the plurality of line structures BL and 136 including the plurality of bit lines BL and the plurality of insulating capping patterns 136 covering the plurality of bit lines BL. Each of the plurality of contact structures 250 and 172 may include a conductive plug 250 and the metal silicide film 172, which are stacked on the substrate 110 in this stated order. The conductive plug 250 may be similar to the conductive plug 199, with a difference being that the conductive plug 250 includes an individual, continuous plug element instead of a combination of separate, contacting elements of the lower conductive plug 150 and the enlarged conductive plug 154 as shown in at least FIG. 2A. Thus, as shown in at least FIG. 7A, the top surface 250T of the conductive plug 250 may contact the metal silicide film 172, and the conductive plug 250 may integrally (e.g., continuously and without interface between separate elements of the conductive plug) extend from a space between the pair of conductive lines BL (e.g., along cross-sectional view line VIIB-VIIB') to a space between the pair of insulating capping patterns 136 (e.g., along cross-sectional view line VIIC-VIIC').

Each of a plurality of conductive plugs 250 may have a bottom surface 250B at a lower level than the top surface of the substrate 110, and a top surface 250T at a higher level than the top surfaces of the plurality of bit lines BL. The top surface 250T of the conductive plug 250 contacts the metal silicide film 172. A region of the conductive plug 250 between the pair of adjacent bit lines BL, for example, a region thereof at line VIIB-VIIB' may have a first width W21 in the X direction. A portion of the conductive plug 250 between the pair of insulating capping patterns 136 may at least partially include an enlarged upper portion 250E having a width that is greater than the first width W21. For example, a portion of the conductive plug 250 at line VIIC-VIIC' may have a second width W22 that is greater than the first width W21, in the X direction. Thus, a portion of the conductive plug 250 over the top surface of the substrate 110 may have an approximately T-like cross-sectional shape along the X direction. The conductive plug 250 may have a structure integrally extending from a space between a pair of bit lines BL to the top surface 250T contacting the metal silicide film 172. The conductive plug 250 may include doped polysilicon.

An insulating spacer SPC6 is arranged between the bit line BL and a lower portion of the conductive plug 250 having a relatively small width and between the bit line BL and an insulating fence 244, and an upper insulating spacer 252 is arranged between the insulating capping pattern 136 and the enlarged upper portion 250E of the conductive plug 250 and between the insulating capping pattern 136 and the insulating fence 244. The insulating spacer SPC6 may have a substantially identical configuration to the insulating spacer SPC2 shown in FIGS. 3A and 3B. The insulating spacer SPC6 may include the insulating liner 140A, the first insulating spacer 140B, and the second insulating spacer 140C, which are arranged on the sidewall of the bit line BL in this stated order. A portion of the insulating spacer SPC6, which is arranged between the bit line BL and the conductive plug 250, may constitute the lower insulating spacer. A width of the upper insulating spacer 252 is less than a width of the insulating spacer SPC6, in the X direction. Each of the insulating spacer SPC6 and the upper insulating spacer 252 may have a line shape extending side by side (e.g., in parallel) with the plurality of bit lines BL in the Y direction.

Of the insulating spacer SPC6, only the insulating liner 140A may be in a region between the enlarged upper portion 250E of the conductive plug 250 and the insulating capping pattern 136 as shown in FIG. 7C. The upper insulating spacer 252 may be arranged between the enlarged upper portion 250E of the conductive plug 250 and the insulating liner 140A. The upper insulating spacer 252 may include a silicon nitride film.

As shown in FIGS. 7B and 7C, at the cross-sectional view line VIIB-VIIB' and the cross-sectional view line VIIC-VIIC', each of a plurality of insulating fences 244 may contact both sidewalls opposite to each other in the Y direction among sidewalls of the conductive plugs 250. Thus, each of the plurality of insulating fences 244 may also contact the enlarged upper portion 250E of the conductive plug 250.

In a contact space defined by two adjacent insulating fences 244 in the region between two adjacent insulating capping patterns 136, the metal silicide film 172 may be formed to contact the top surface 250T of the conductive plug 250 having a relatively large surface area. Thus, contact resistance may be reduced.

Figure 8:
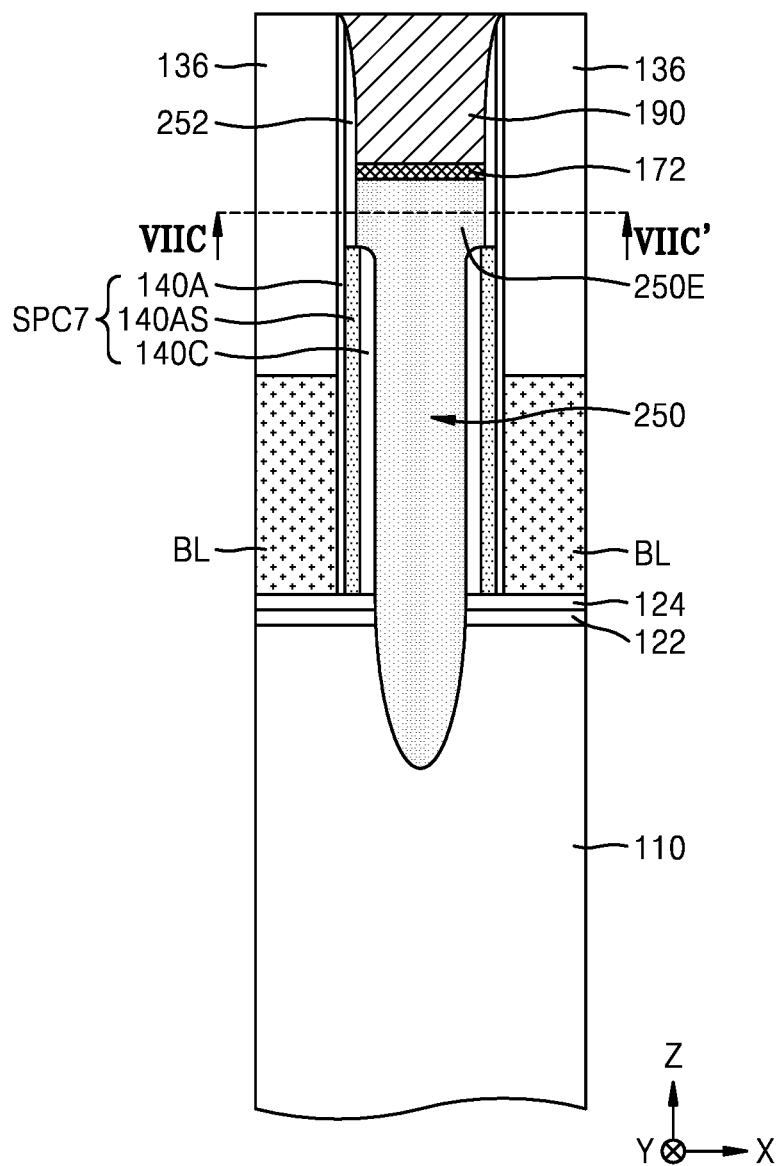
FIG. 8 is a main-portion cross-sectional view illustrating an integrated circuit device according to some example embodiments of the inventive concepts.

FIG. 8 is a main-portion cross-sectional view illustrating an integrated circuit device 200B according to some example embodiments of the inventive concepts. In FIG. 8, the same reference numerals as in FIGS. 2A to 7C respectively denote the same members, and repeated descriptions thereof will be omitted.

Referring to FIG. 8, the integrated circuit device 200B has a substantially identical configuration to the integrated circuit device 200A shown in FIGS. 7A and 7B. A planar configuration of the integrated circuit device 200B at cross-sectional view line VIIC-VIIC' of FIG. 8 may be substantially identical to that shown in FIG. 7C. However, an insulating spacer SPC7 including the lower air spacer 140AS is arranged between the bit line BL and the conductive plug 250 and between the bit line BL and the insulating fence 244 (see FIG. 7B). A portion of the insulating spacer SPC7, which is arranged between the bit line BL and the conductive plug 250, may constitute the lower insulating spacer. The width of the upper insulating spacer 252 is less than a width of the insulating spacer SPC7, in the X direction. The insulating spacer SPC7 has a line shape extending side by side with the plurality of bit lines BL in the Y direction.

The insulating spacer SPC7 may include the insulating liner 140A, the lower air spacer 140AS, and the second insulating spacer 140C, which are arranged on the sidewall of the bit line BL in this stated order. Of the insulating spacer SPC7, only the insulating liner 140A may be in a region between the insulating capping pattern 136 and the enlarged upper portion 250E of the conductive plug 250.

Figure 9A:
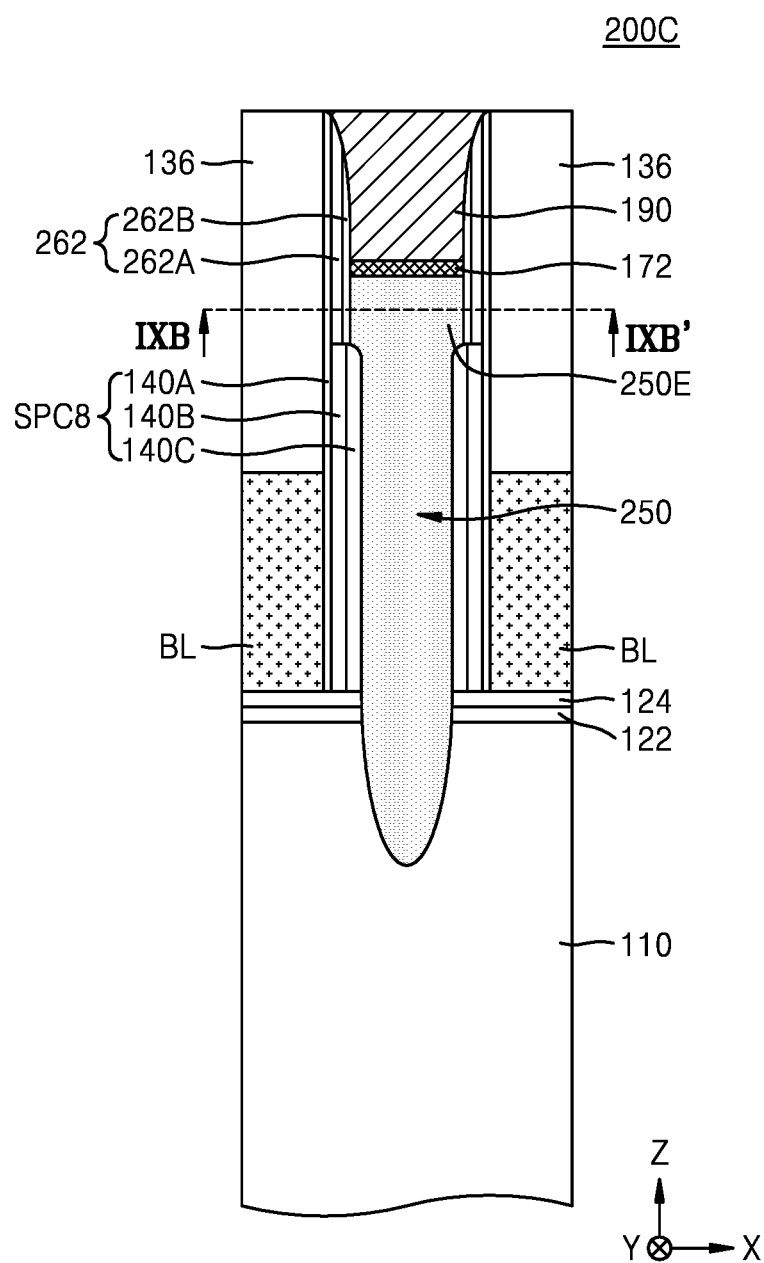
FIG. 9A is a main-portion cross-sectional view illustrating an integrated circuit device according to some example embodiments of the inventive concepts.
Figure 9B:
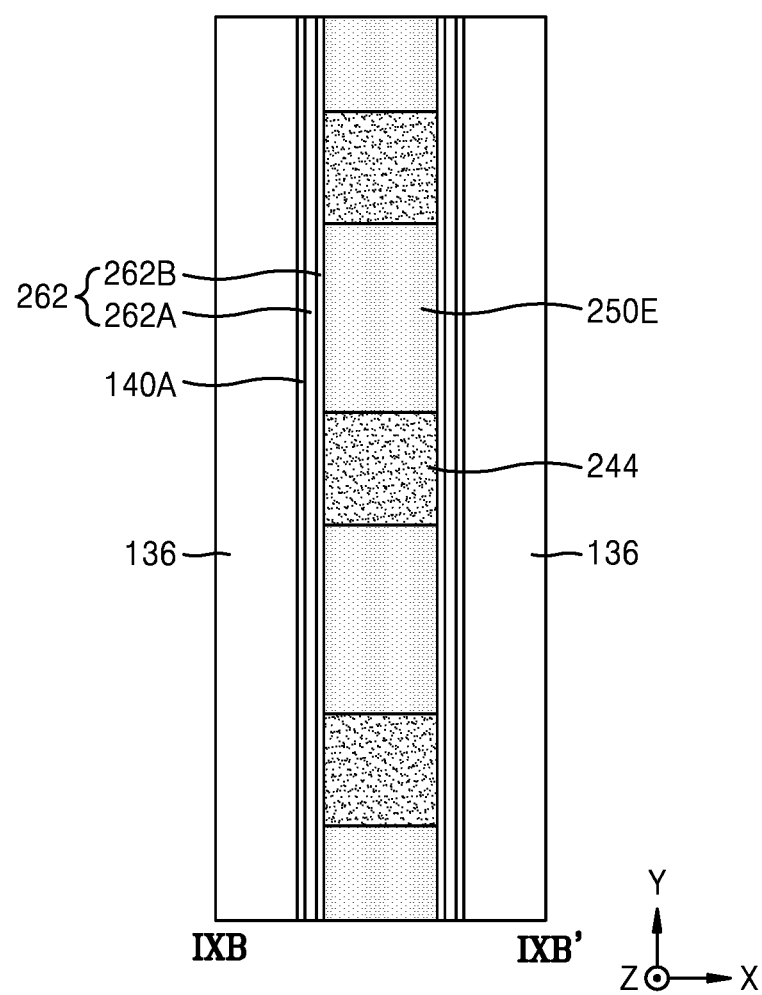
FIG. 9B is a plan view of a partial region of FIG. 9A.

FIG. 9A is a main-portion cross-sectional view illustrating an integrated circuit device 200C according to some example embodiments of the inventive concepts, and FIG. 9B is a plan view of a partial region at the cross-sectional view line IXB-IXB' of FIG. 9A. The integrated circuit device 200C shown in FIGS. 9A and 9B may constitute a portion of the integrated circuit device 10 shown in FIG. 1. In FIGS. 9A and 9B, the same reference numerals as in FIGS. 2A to 8 respectively denote the same members, and repeated descriptions thereof will be omitted.

Referring to FIGS. 9A and 9B, the integrated circuit device 200C has a substantially identical configuration to the integrated circuit device 200A shown in FIGS. 7A to 7C. An insulating spacer SPC8 is arranged between the bit line BL and the conductive plug 250 and between the bit line BL and the insulating fence 244. Like the insulating spacer SPC6 shown in FIGS. 7A and 7B, the insulating spacer SPC8 may include the insulating liner 140A, the first insulating spacer 140B, and the second insulating spacer 140C, which are arranged on the sidewall of the bit line BL in this stated order. A portion of the insulating spacer SPC8, which is arranged between the bit line BL and the conductive plug 250, may constitute the lower insulating spacer. However, in the integrated circuit device 200C, an upper insulating spacer 262 having a two-layer structure is arranged between the insulating capping pattern 136 and the enlarged upper portion 250E of the conductive plug 250 and between the insulating capping pattern 136 and the insulating fence 244, unlike in the integrated circuit device 200A shown in FIGS. 7A to 7C. A width of the upper insulating spacer 262 is less than a width of the insulating spacer SPC8, in the X direction. Each of the insulating spacer SPC8 and the upper insulating spacer 262 has a line shape extending side by side with the plurality of bit lines BL in the Y direction.

The upper insulating spacer 262 includes an oxide spacer 262A and a nitride spacer 262B, which cover the sidewall of the insulating capping pattern 136 in this stated order. The oxide spacer 262A may include silicon oxide, and the nitride spacer 262B may include silicon nitride, without being limited thereto.

Figure 10A:
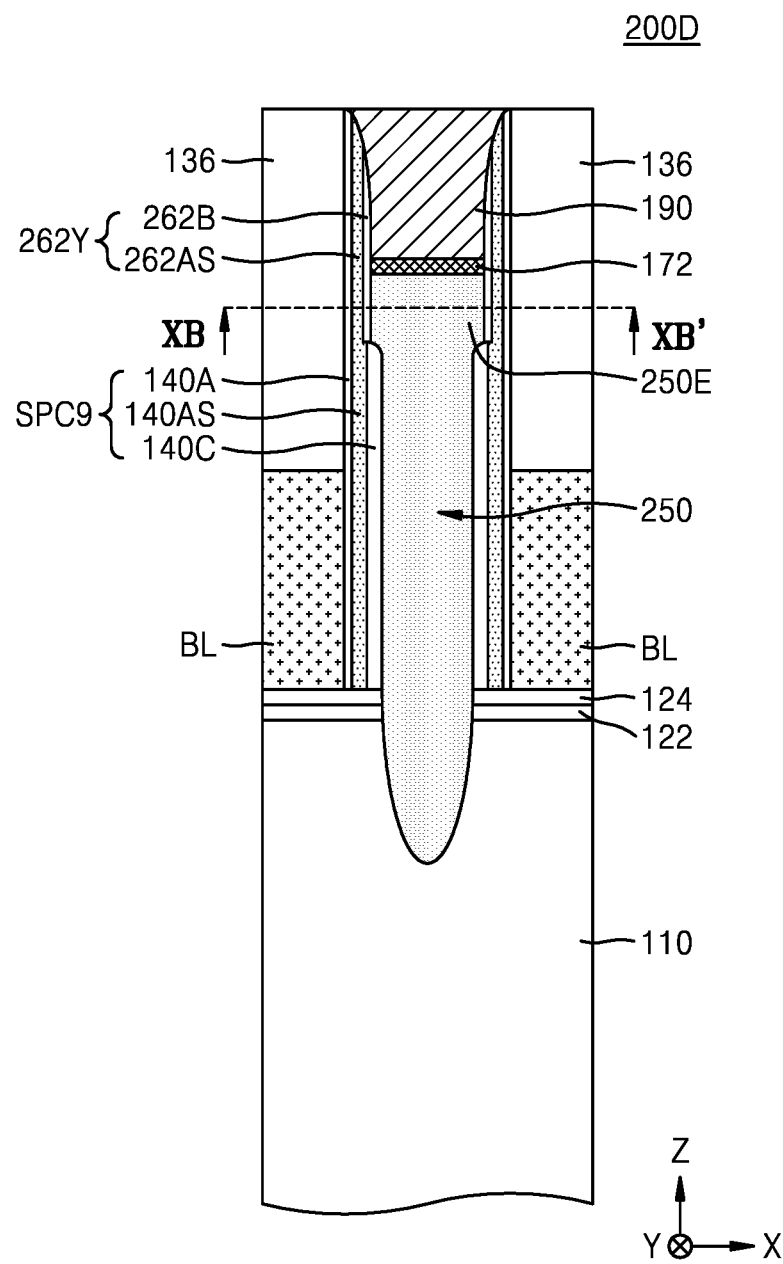
FIG. 10A is a main-portion cross-sectional view illustrating an integrated circuit device according to some example embodiments of the inventive concepts.
Figure 10B:
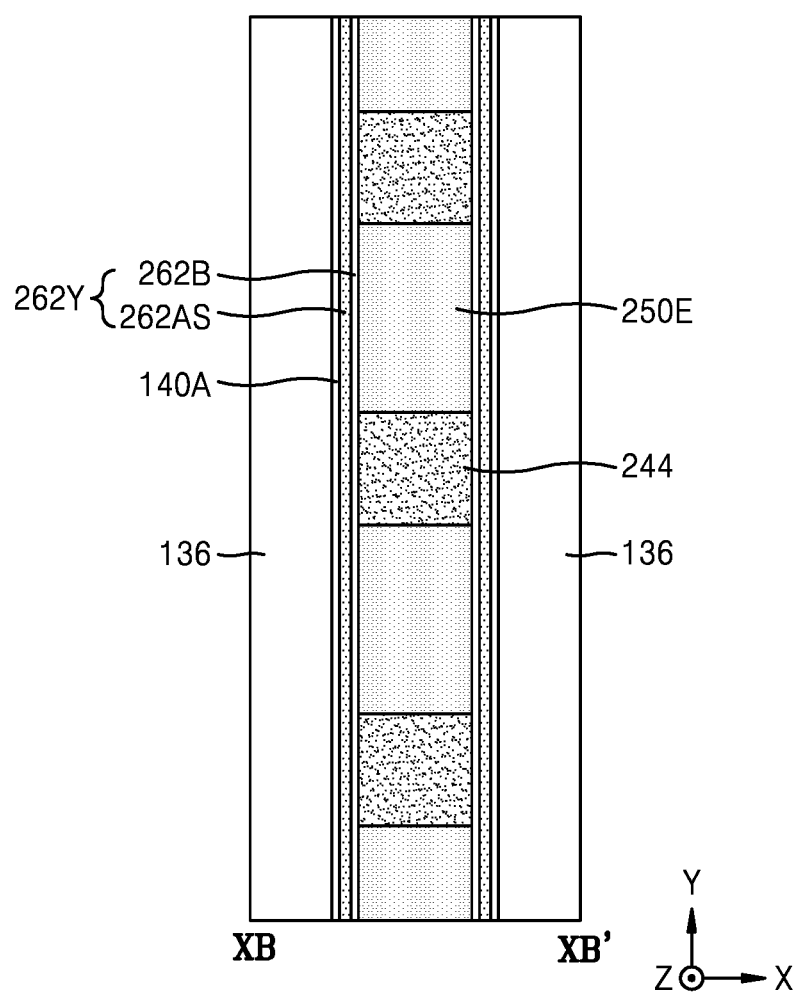
FIG. 10B is a plan view of a partial region of FIG. 10A.

FIG. 10A is a main-portion cross-sectional view illustrating an integrated circuit device 200D according to some example embodiments of the inventive concepts, and FIG. 10B is a plan view of a partial region at cross-sectional view line XB-XB' of FIG. 10A. The integrated circuit device 200D shown in FIGS. 10A and 10B may constitute a portion of the integrated circuit device 10 shown in FIG. 1. In FIGS. 10A and 10B, the same reference numerals as in FIGS. 2A to 9B respectively denote the same members, and repeated descriptions thereof will be omitted.

Referring to FIGS. 10A and 10B, the integrated circuit device 200D has a substantially identical configuration to the integrated circuit device 200C shown in FIGS. 9A and 9B. However, an insulating spacer SPC9 including the lower air spacer 140AS is arranged between the bit line BL and the conductive plug 250 and between the bit line BL and the insulating fence 244. A portion of the insulating spacer SPC9, which is arranged between the bit line BL and the conductive plug 250, may constitute the lower insulating spacer. An upper insulating spacer 262Y of a two-layer structure including an upper air spacer 262AS is arranged between the insulating capping pattern 136 and the enlarged upper portion 250E of the conductive plug 250 and between the insulating capping pattern 136 and the insulating fence 244. A width of the upper insulating spacer 262Y is less than a width of the insulating spacer SPC9, in the X direction. Each of the insulating spacer SPC9 and the upper insulating spacer 262Y has a line shape extending side by side with the plurality of bit lines BL in the Y direction.

The insulating spacer SPC9 may include the insulating liner 140A, the lower air spacer 140AS, and the second insulating spacer 140C, which are arranged on the sidewall of the bit line BL in this stated order. Of the insulating spacer SPC9, only the insulating liner 140A may be in the region between the insulating capping pattern 136 and the enlarged upper portion 250E of the conductive plug 250.

The upper insulating spacer 262Y may include an upper air spacer 262AS and the nitride spacer 262B, which cover the sidewall of the insulating capping pattern 136 in this stated order. The upper air spacer 262AS may communicate with the lower air spacer 140AS. A width of the upper air spacer 262AS may be less than the width of the lower air spacer 140AS, in the X direction. As shown in FIG. 10B and further referring back to FIG. 4B, each of the lower air spacer 140AS and the upper air spacer 262AS may have a line shape extending side by side with the bit line BL in the Y direction.

Figure 11A:
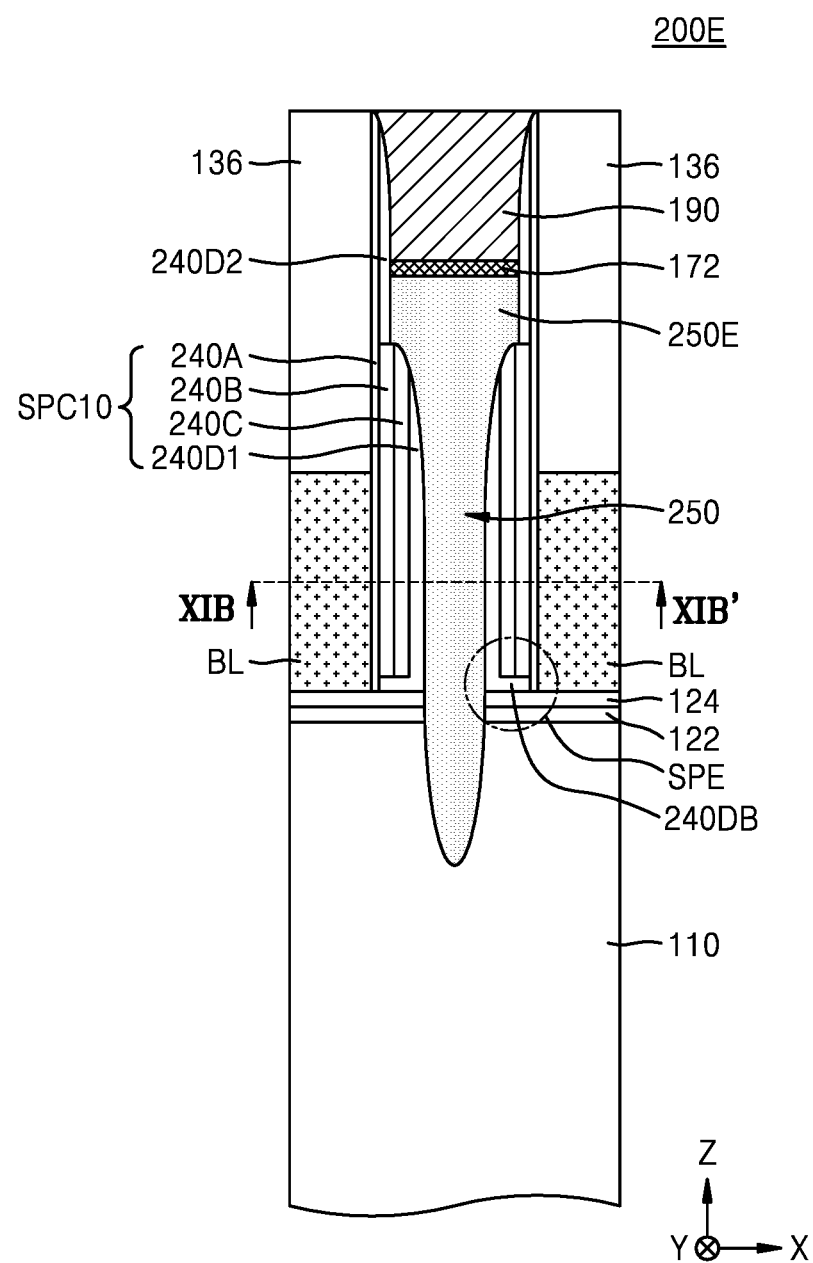
FIG. 11A is a main-portion cross-sectional view illustrating an integrated circuit device according to some example embodiments of the inventive concepts.
Figure 11B:
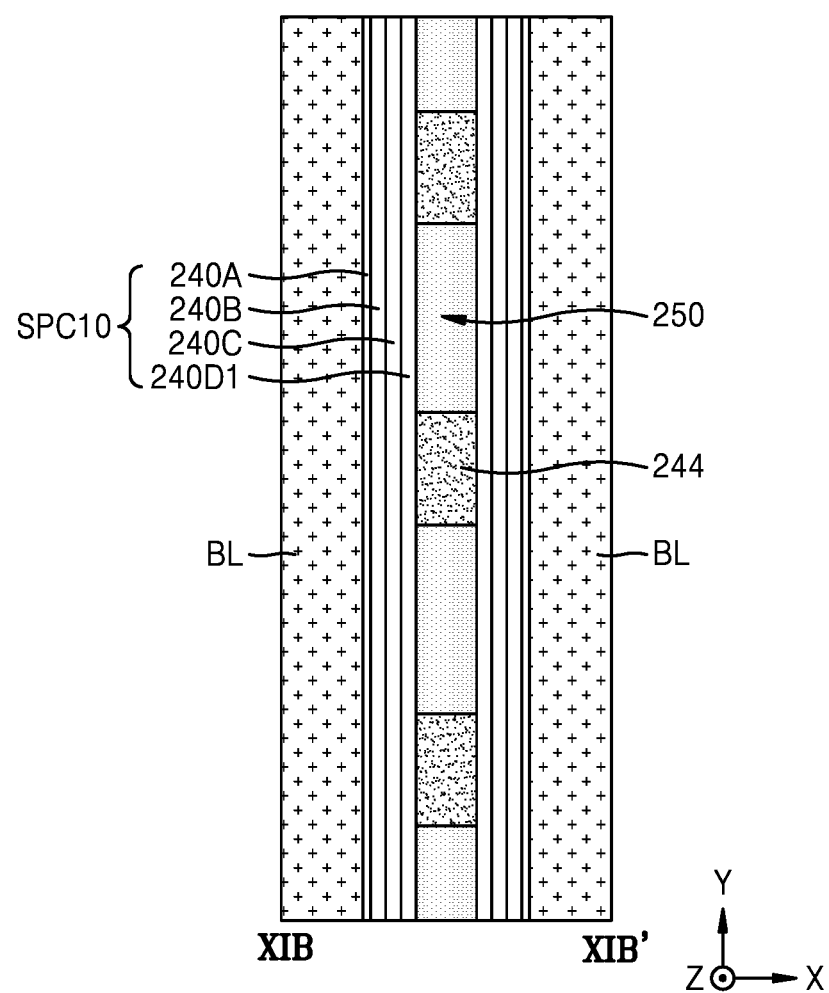
FIG. 11B is a plan view of a partial region of FIG. 11A.

FIG. 11A is a main-portion cross-sectional view illustrating an integrated circuit device 200E according to some example embodiments of the inventive concepts, and FIG. 11B is a plan view of a partial region at cross-sectional view line XIB-XIB' of FIG. 11A. The integrated circuit device 200E shown in FIGS. 11A and 11B may constitute a portion of the integrated circuit device 10 shown in FIG. 1. In FIGS. 11A and 11B, the same reference numerals as in FIGS. 2A to 10B respectively denote the same members, and repeated descriptions thereof will be omitted.

Referring to FIGS. 11A and 11B, the integrated circuit device 200E has a substantially identical configuration to the integrated circuit device 200C shown in FIGS. 9A and 9B. However, an insulating spacer SPC10 having a four-layer structure is arranged between the bit line BL and the conductive plug 250 and between the bit line BL and the insulating fence 244. An upper insulating spacer 240D2 is arranged between the insulating capping pattern 136 and the enlarged upper portion 250E of the conductive plug 250.

A portion of the insulating spacer SPC10, which is arranged between the bit line BL and the conductive plug 250, may constitute the lower insulating spacer. The insulating spacer SPC10 may include an insulating liner 240A, a first insulating spacer 240B, a second insulating spacer 240C, and a third insulating spacer 240D1, which are arranged on the sidewall of the bit line BL in this stated order. As shown in a region indicated by "SPE" in FIG. 11A, the third insulating spacer 240D1 includes a bottom portion 240DB at a bottom end thereof adjacent to the bit line BL, the bottom portion 240DB horizontally extending to contact the insulating liner 240A while filling a space between bottom surfaces of the first insulating spacer 240B and the second insulating spacer 240C and a top surface of the second insulating film 124. Thus, the third insulating spacer 240D1 may have an approximately L-like cross-sectional shape along the X direction, and the bottom surface of each of first insulating spacer 240B and the second insulating spacer 240C may contact the bottom portion 240DB of the third insulating spacer 240D1. Of the insulating spacer SPC10, only the insulating liner 240A may be in the region between the insulating capping pattern 136 and the enlarged upper portion 250E of the conductive plug 250. More detailed configurations of the insulating liner 240A, the first insulating spacer 240B, and the second insulating spacer 240C are substantially identical to those of the insulating liner 140A, the first insulating spacer 140B, and the second insulating spacer 140C described with reference to FIGS. 7A to 7C. The third insulating spacer 240D1 may include the same material as the upper insulating spacer 240D2. In some embodiments, each of the third insulating spacer 240D1 and the upper insulating spacer 240D2 may include a silicon nitride film. A more detailed configuration of the upper insulating spacer 240D2 is substantially identical to that of the upper insulating spacer 252 described with reference to FIGS. 7A to 7C.

A width of the upper insulating spacer 240D2 is less than a width of the insulating spacer SPC10, in the X direction. Each of the insulating spacer SPC10 and the upper insulating spacer 240D2 may have a line shape extending side by side with the plurality of bit lines BL in the Y direction.

Figure 12A:
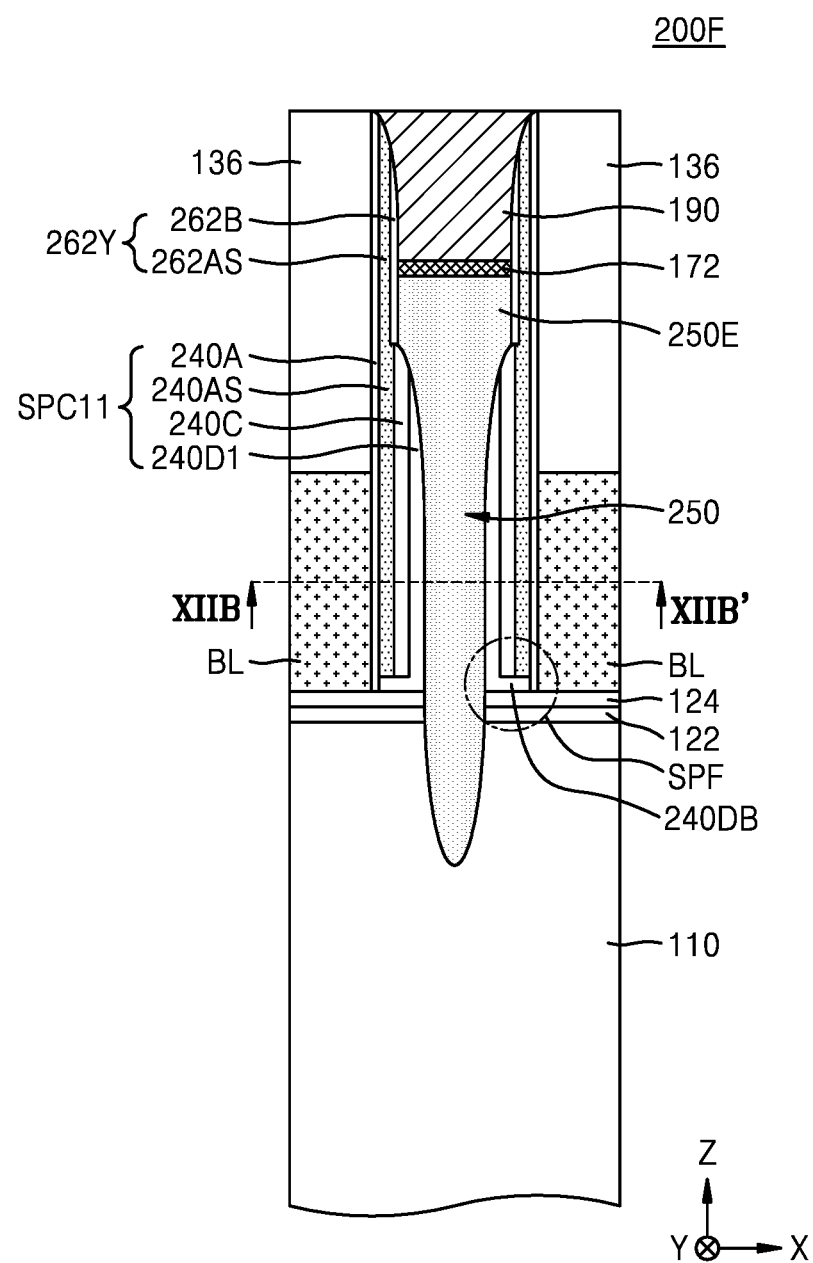
FIG. 12A is a main-portion cross-sectional view illustrating an integrated circuit device according to some example embodiments of the inventive concepts.
Figure 12B:
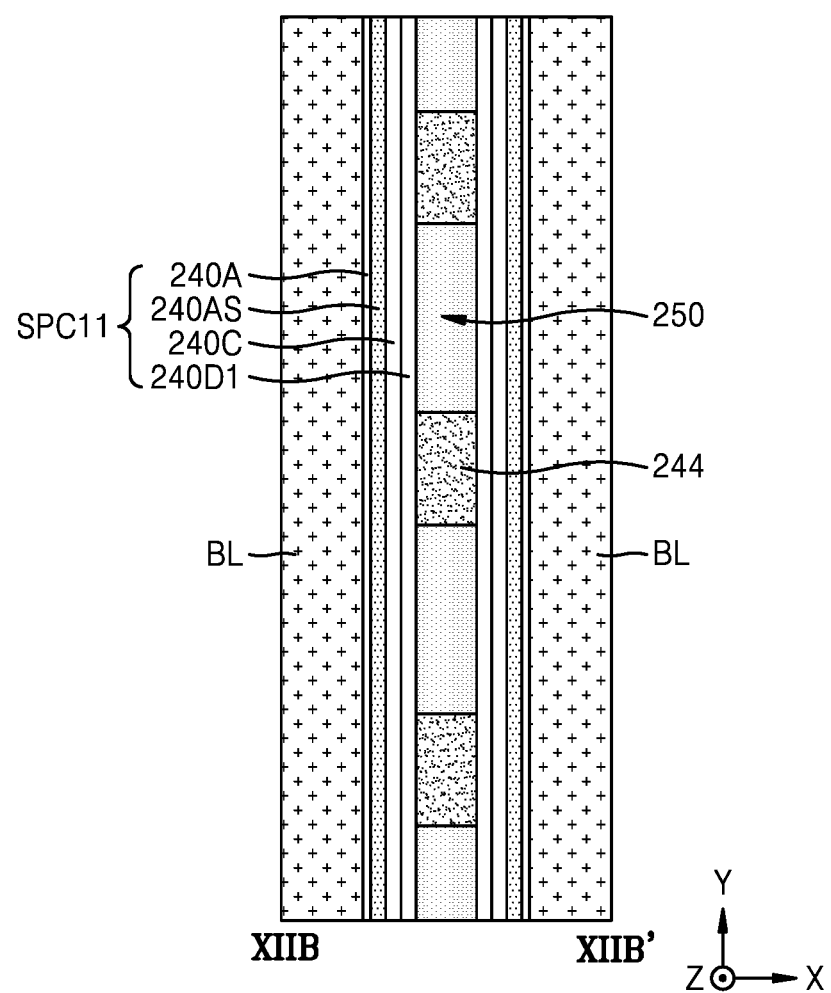
FIG. 12B is a plan view of a partial region of FIG. 12A.

FIG. 12A is a main-portion cross-sectional view illustrating an integrated circuit device 200F according to some example embodiments of the inventive concepts, and FIG. 12B is a plan view of a partial region at cross-sectional view line XIIB-XIIB' of FIG. 12A. The integrated circuit device 200F shown in FIGS. 12A and 12B may constitute a portion of the integrated circuit device 10 shown in FIG. 1. In FIGS. 12A and 12B, the same reference numerals as in FIGS. 2A to 11B respectively denote the same members, and repeated descriptions thereof will be omitted.

Referring to FIGS. 12A and 12B, the integrated circuit device 200F has a substantially identical configuration to the integrated circuit device 200E shown in FIGS. 11A and 11B. However, an insulating spacer SPC11 including a lower air spacer 240AS is arranged in a space between the bit line BL and the conductive plug 250 and between the bit line BL and the insulating fence 244, as shown in at least FIG. 12A. A portion of the insulating spacer SPC11, which is arranged between the bit line BL and the conductive plug 250, may constitute the lower insulating spacer. The insulating spacer SPC11 may include the insulating liner 240A, the lower air spacer 240AS, the second insulating spacer 240C, and the third insulating spacer 240D1, which are arranged on the sidewall of the bit line BL in this stated order (e.g., are sequentially located on the sidewall of the bit line BL. As shown in a region indicated by "SPF" in FIG. 12A, the third insulating spacer 240D1 includes the bottom portion 240DB horizontally extending toward the insulating liner 240A to close an end of the lower air spacer 240AS while filling a space between the bottom surface of the second insulating spacer 240C and the top surface of the second insulating film 124. Restated, and as shown in FIG. 12, the third insulating spacer 240D1 may include a bottom portion 240DB horizontally extending to contact the insulating liner 240A in a vicinity of a bottom surface of each conductive line BL. Thus, the third insulating spacer 240D1 may have an approximately L-like cross-sectional shape along the X direction, and the end of the lower air spacer 240AS may be defined by the insulating liner 240A, the second insulating spacer 240C, and the bottom portion 240DB of the third insulating spacer 240D1. Restated, an end of the lower air spacer 240AS in a vicinity of the bottom surface of each conductive line BL may be surrounded by the insulating liner 240A, the second insulating spacer 240C, and the bottom portion 240DB of the third insulating spacer 240D 1.

Like in the integrated circuit device 200D shown in FIGS. 10A and 10B, the upper insulating spacer 262Y of a two-layer structure including the upper air spacer 262AS is arranged between the insulating capping pattern 136 and the enlarged upper portion 250E of the conductive plug 250 and between the insulating capping pattern 136 and the insulating fence 244.

The width of the upper insulating spacer 262Y is less than a width of the insulating spacer SPC11, in the X direction. Each of the insulating spacer SPC11 and the upper insulating spacer 262Y has a line shape extending side by side with the plurality of bit lines BL in the Y direction. Of the insulating spacer SPC11, only the insulating liner 240A may be in the region between the insulating capping pattern 136 and the enlarged upper portion 250E of the conductive plug 250. The upper air spacer 262AS may communicate with the lower air spacer 240AS. The width of the upper air spacer 262AS may be less than a width of the lower air spacer 240AS, in the X direction. Each of the lower air spacer 240AS and the upper air spacer 262AS may have a line shape extending side by side with the bit line BL in the Y direction.

FIGS. 13A to 13M are cross-sectional views illustrating sequential processes of a method of fabricating an integrated circuit device, according to some example embodiments of the inventive concepts. In FIGS. 13A to 13M, each cross-sectional view denoted by (a) illustrates main configurations of a region corresponding to a cross-section taken along the line A-A' of FIG. 1 according to a process order, and each cross-sectional view denoted by (b) illustrates main configurations of a region corresponding to a cross-section taken along the line B-B' of FIG. 1 according to a process order. In FIGS. 13G to 13L, each plan view denoted by (c) illustrates a planar configuration of some components of a result product obtained in a corresponding process.

Figure 13A:
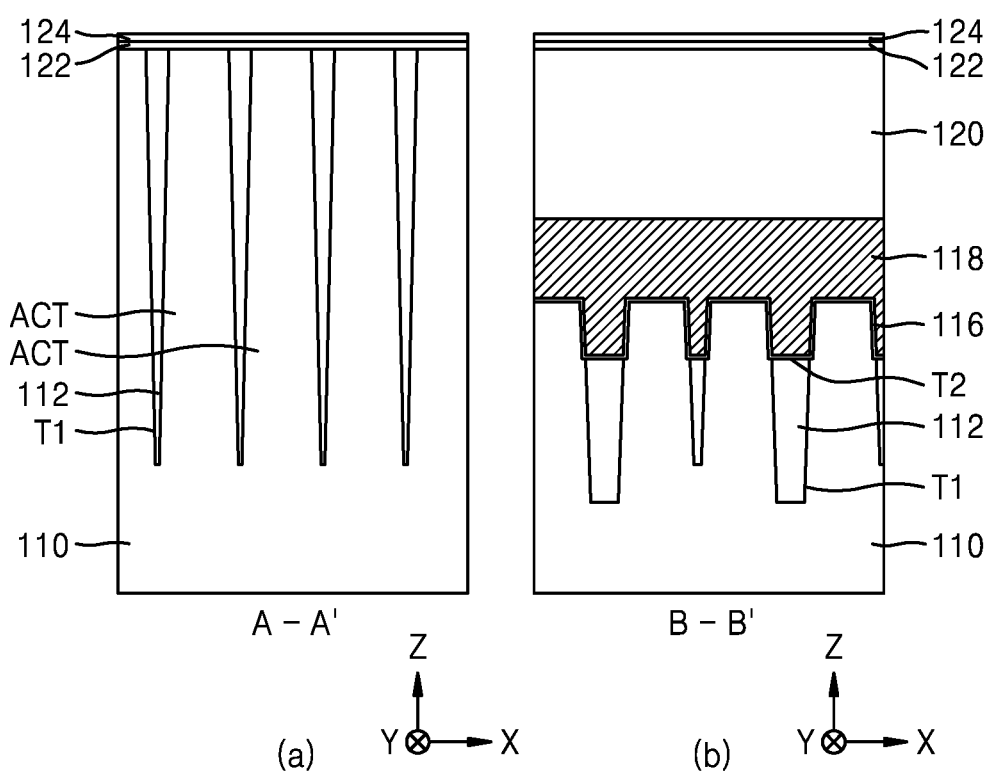
FIGS. 13A to 13M are cross-sectional views illustrating sequential processes of a method of fabricating an integrated circuit device, according to some example embodiments of the inventive concepts.

Referring to FIG. 13A, a device isolation trench T1 is formed in the substrate 110, and a device isolation film 112 is formed in the device isolation trench T1.

An active region ACT may be defined in the substrate 110 by the device isolation film 112. The device isolation film 112 may include an oxide film, a nitride film, or combinations thereof. The device isolation film 112 may include a single layer including one insulating film, two layers including two insulating films of different materials, and multiple layers including combinations of at least three insulating films.

A plurality of word line trenches T2 may be formed in the substrate 110. The plurality of word line trenches T2 may extend parallel to each other in the X direction, and may have line shapes crossing the active region ACT. As shown in the cross-sectional view denoted by (b) in FIG. 13A, to form the plurality of word line trenches T2 each having a step at a bottom surface thereof, the device isolation film 112 and the substrate 110 may be respectively etched by separate etching processes, and thus have different etch depths. A result product, in which the plurality of word line trenches T2 are formed, may be cleaned, followed by forming a gate dielectric film 116, a word line 118, and a buried insulating film 120 in each of the plurality of word line trenches T2 in this stated order. In some embodiments, a plurality of word lines 118 may be formed, followed by implanting impurity ions into the substrate 110 on both sides of each of the plurality of word lines 118, thereby forming a plurality of source/drain regions in upper portions of the plurality of active regions ACT. In some other embodiments, before the plurality of word lines 118 are formed, an impurity ion implantation process for forming the plurality of source/drain regions may be performed.

The gate dielectric film 116 may include at least one selected from among a silicon oxide film, a silicon nitride film, a silicon oxynitride film, oxide/nitride/oxide (ONO), and a high-K dielectric film having a higher dielectric constant than a silicon oxide film. For example, the gate dielectric film 116 may have a dielectric constant of about 10 to about 25. In some embodiments, the gate dielectric film 116 may include $HfO_2$, $Al_2O_3$, $HfAlO_3$, $Ta_2O_3$, $TiO_2$, or combinations thereof, without being limited thereto. Each of the plurality of word lines 118 may include Ti, TiN, Ta, TaN, W, WN, TiSiN, WSiN, or combinations thereof.

Top surfaces of a plurality of buried insulating films 120 may be at a substantially identical level to the top surface of the substrate 110. Each of the plurality of buried insulating films 120 may include a silicon oxide film, a silicon nitride film, a silicon oxynitride film, or combinations thereof. A first insulating film 122 and a second insulating film 124 may be formed on the plurality of buried insulating films 120 and the substrate 110 in this stated order. The first insulating film 122 and the second insulating film 124 may cover top surfaces of the plurality of active regions ACT, a top surface of the device isolation film 112, and the top surfaces of the plurality of buried insulating films 120. In some embodiments, the first insulating film 122 may include a silicon oxide film, and the second insulating film 124 may include a silicon nitride film.

Figure 13B:
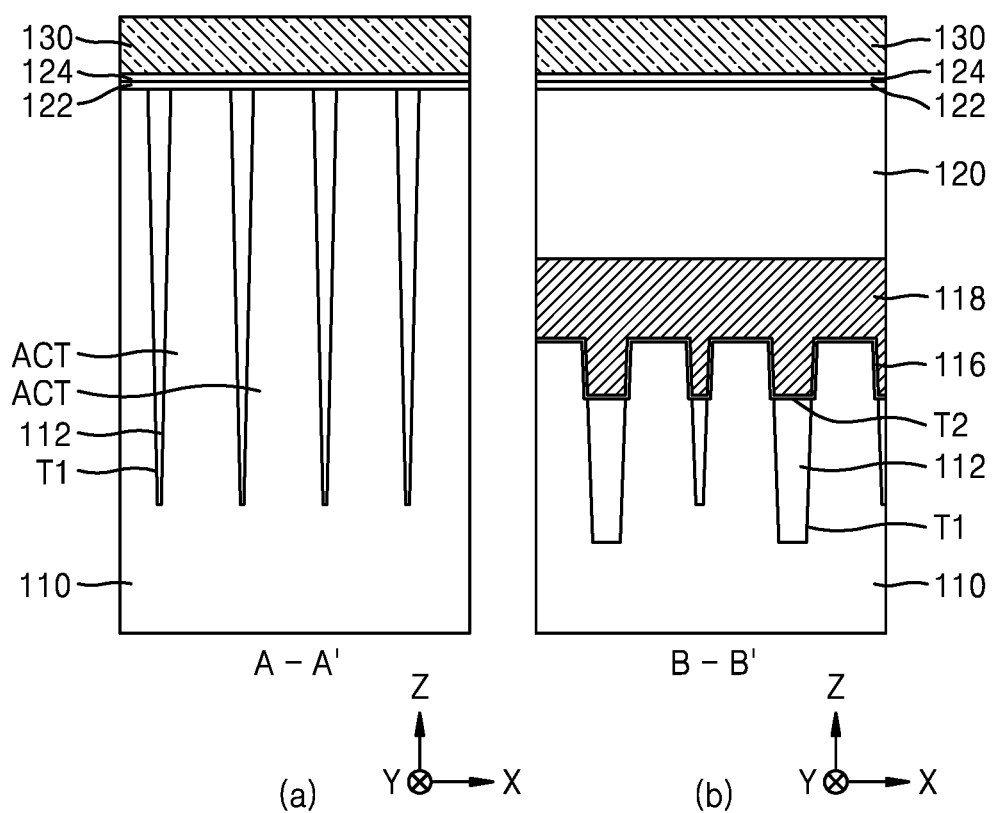

Referring to FIG. 13B, a first conductive layer 130 is formed on the second insulating film 124. The first conductive layer 130 may include doped polysilicon.

Figure 13C:
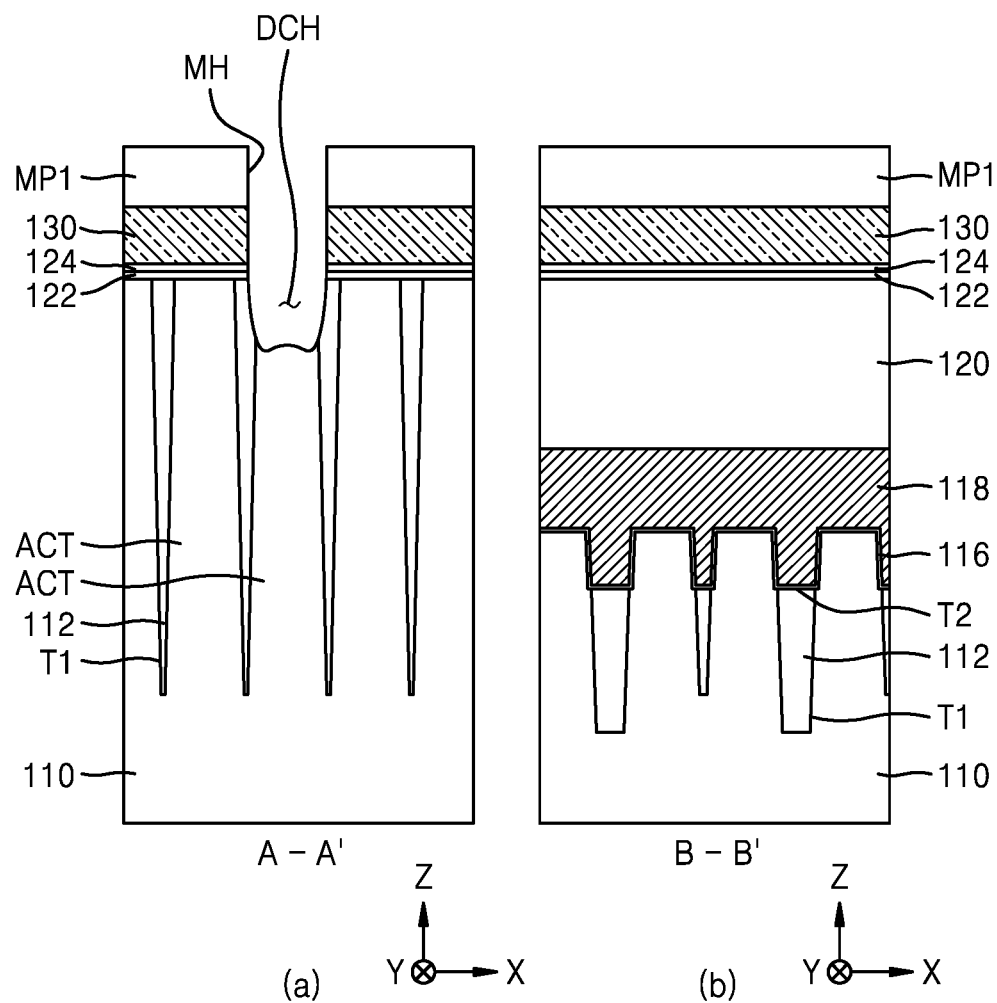

Referring to FIG. 13C, a mask pattern MP1 is formed on the first conductive layer 130, followed by etching the first conductive layer 130 exposed by an opening MH of the mask pattern MP1, and then, a portion of the substrate 110 and a portion of the device isolation film 112, which are exposed as a result, are etched, thereby forming a direct contact hole DCH exposing the active region ACT of the substrate 110.

The mask pattern MP1 may include an oxide film, a nitride film, or combinations thereof. A photolithography process may be used to form the mask pattern MP1.

Figure 13D:
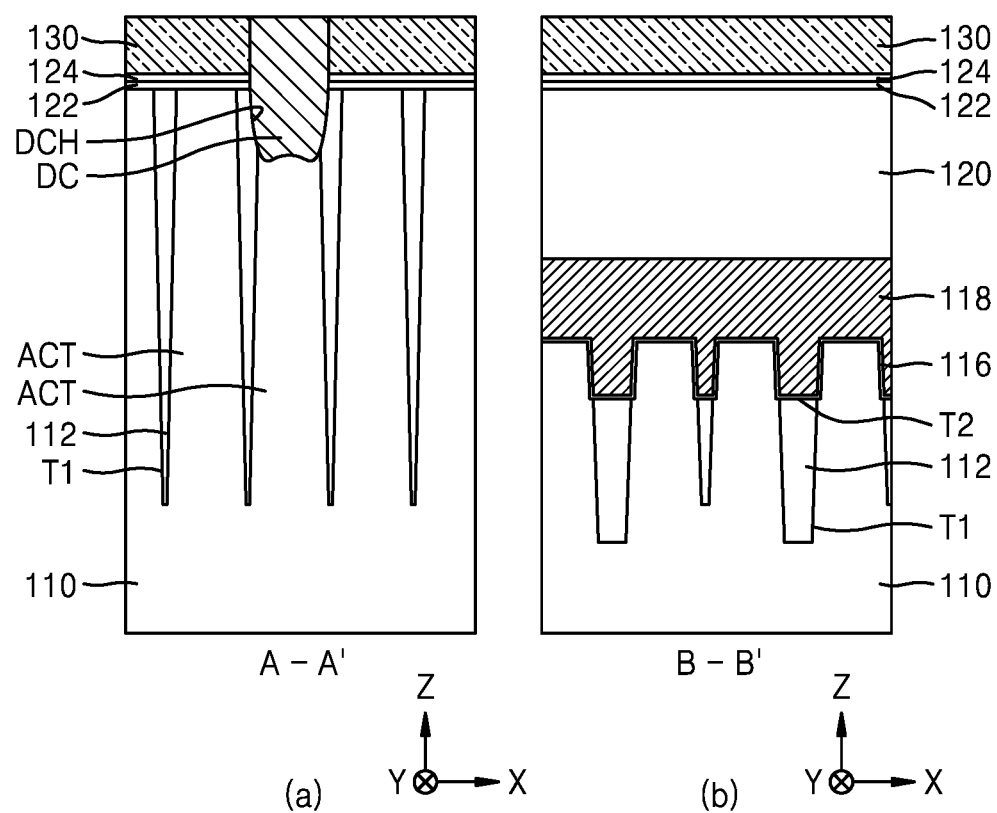

Referring to FIG. 13D, the mask pattern MP1 (see FIG. 13C) is removed, followed by forming a direct contact DC in the direct contact hole DCH.

In an example of a process of forming the direct contact DC, a second conductive layer, which has a sufficient thickness to fill the direct contact hole DCH, may be formed in the direct contact hole DCH and on the first conductive layer 130, followed by performing etch-back of the second conductive layer so that the second conductive layer remains only in the direct contact hole DCH. The second conductive layer may include doped polysilicon, without being limited thereto.

Figure 13E:
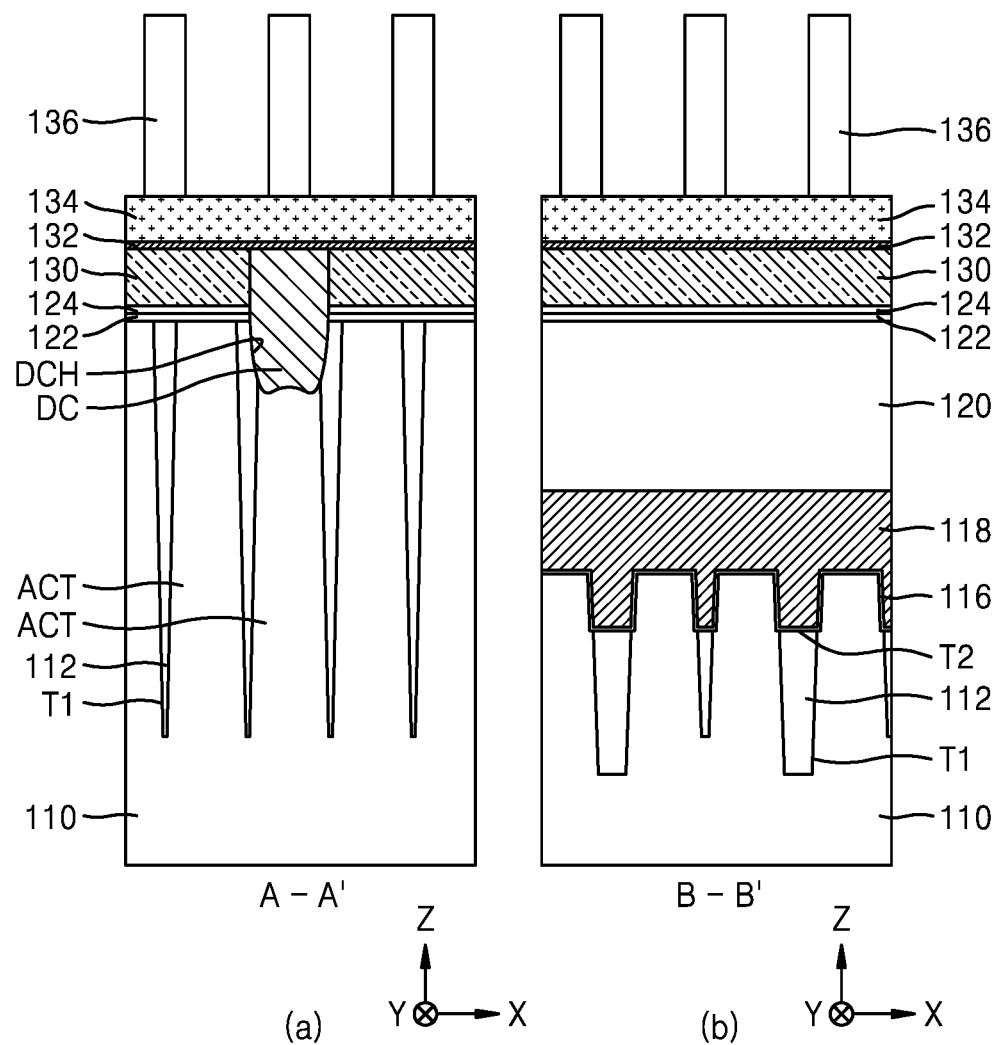

Referring to FIG. 13E, a third conductive layer 132, a fourth conductive layer 134, and the plurality of insulating capping patterns 136 are formed on the first conductive layer 130 and the direct contact DC.

Each of the plurality of insulating capping patterns 136 may include a line pattern extending long along the Y direction. Each of the third conductive layer 132 and the fourth conductive layer 134 may include TiN, TiSiN, W, tungsten silicide, or combinations thereof.

In some embodiments, the third conductive layer 132 may include TiSiN, and the fourth conductive layer 134 may include W. Each of the plurality of insulating capping patterns 136 may include a silicon nitride film.

Figure 13F:
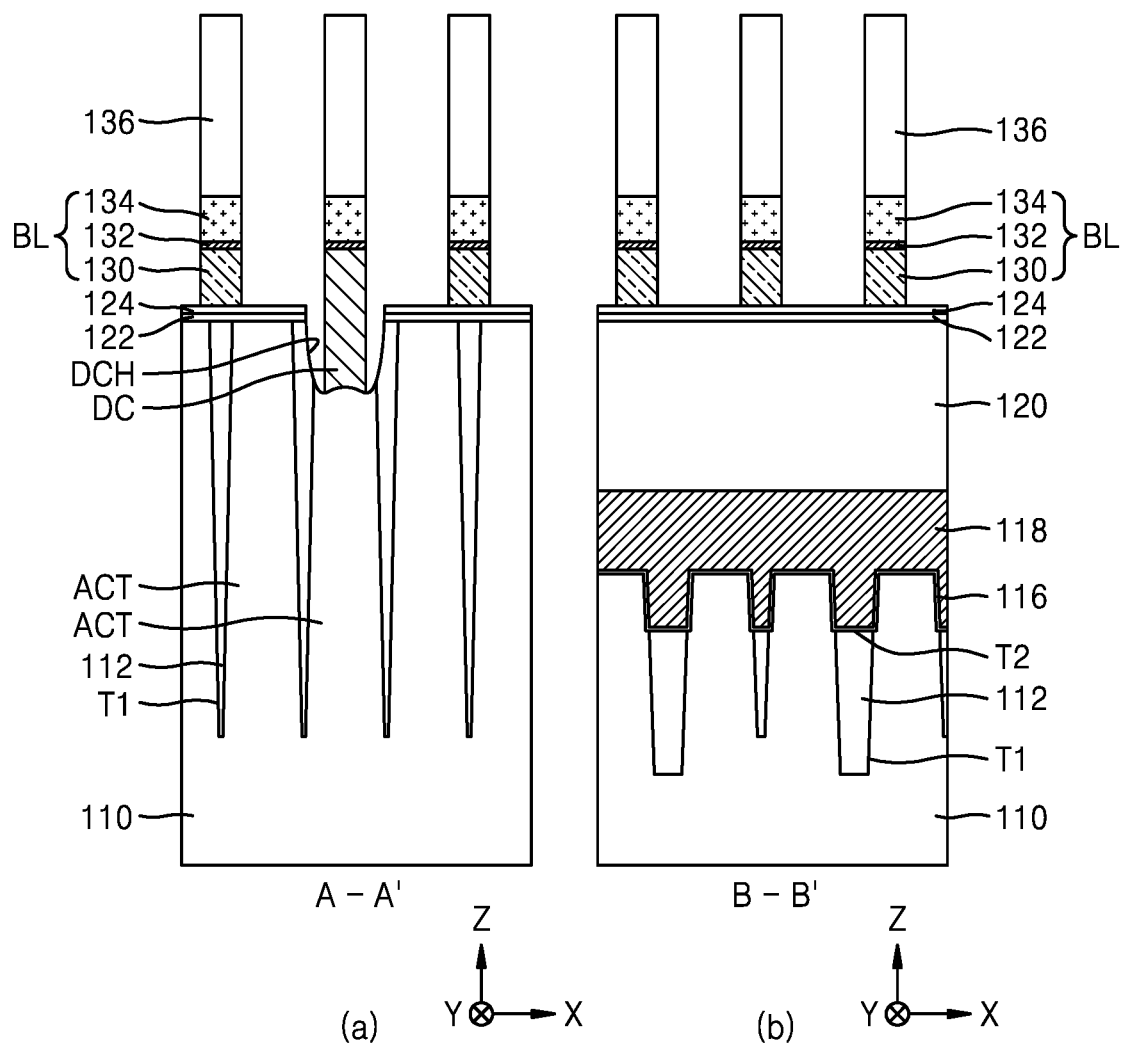

Referring to FIG. 13F, each of the fourth conductive layer 134, the third conductive layer 132, the first conductive layer 130, and the direct contact DC under the insulating capping patterns 136 is partially etched by using the insulating capping patterns 136, thereby forming the plurality of bit lines BL over the substrate 110. The plurality of bit lines BL may include remaining portions of the first conductive layer 130, the third conductive layer 132, and the fourth conductive layer 134. After the plurality of bit lines BL are formed, the direct contact hole DCH may be partially exposed again around the direct contact DC.

Figure 13G:
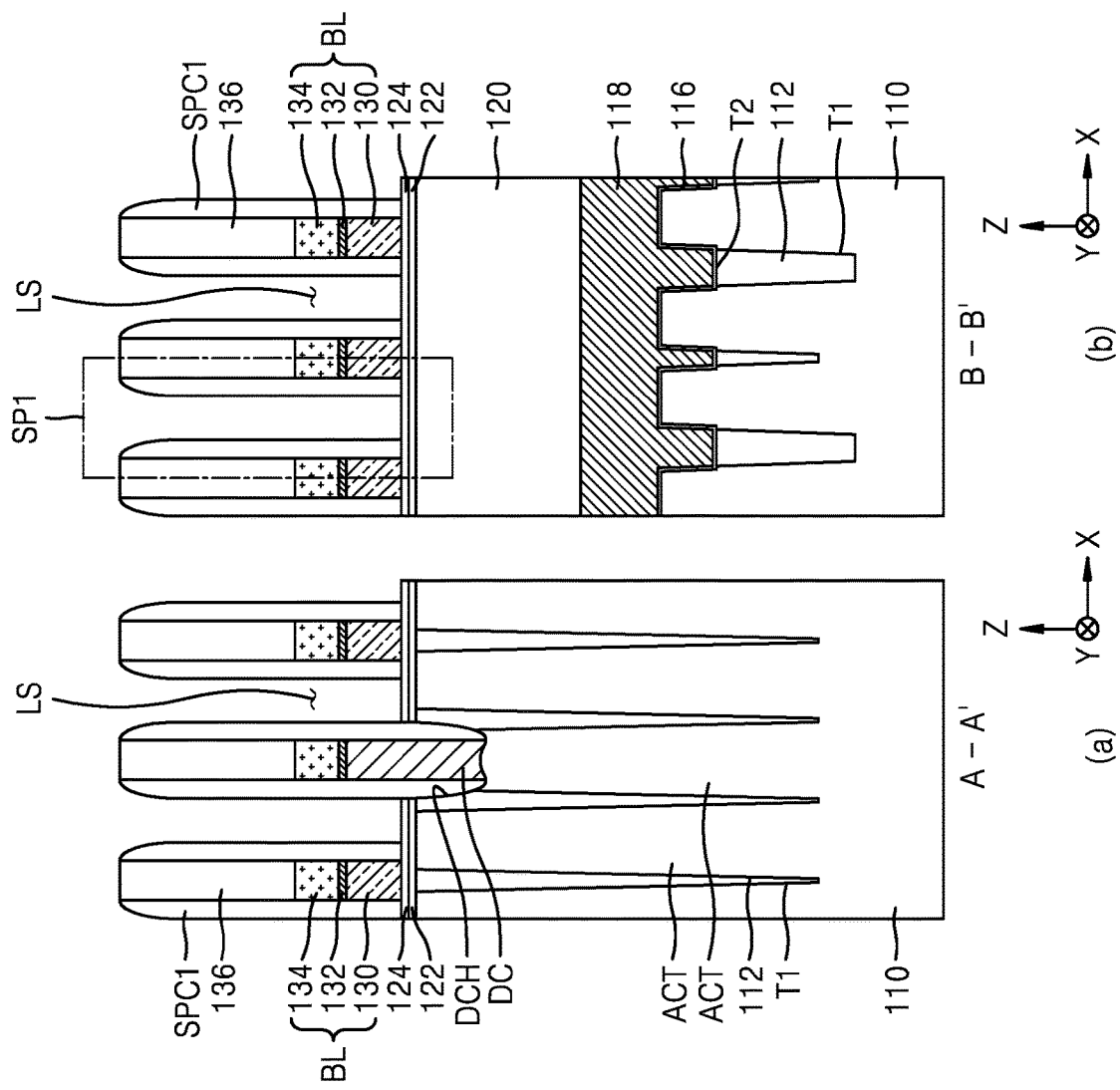

Referring to FIG. 13G, a plurality of insulating spacers SPC1 are formed to cover sidewalls of the plurality of bit lines BL, sidewalls of the plurality of insulating capping patterns 136, and sidewalls of a plurality of direct contacts DC. The plurality of insulating spacers SPC1 may be formed to fill empty spaces of a plurality of direct contact holes DCH.

The plan view (c) of FIG. 13G illustrates a planar configuration of some components of a result product obtained after the plurality of insulating spacers SPC1 are formed. In FIG. 13G, the cross-sectional view (a) may correspond to a cross-sectional configuration taken along a line A-A' of the plan view (c), and the cross-sectional view (b) may correspond to a cross-sectional configuration taken along a line B-B' of the plan view (c). In the plan view (c) of FIG. 13G, the plurality of word lines 118 are marked by dashed lines for better understanding.

The plurality of insulating spacers SPC1 may extend long parallel to the plurality of bit lines BL in the Y direction to cover both sidewalls of the plurality of bit lines BL. Each of the plurality of insulating spacers SPC1 may include an oxide film, a nitride film, an air spacer, or combinations thereof.

Figure 14A:
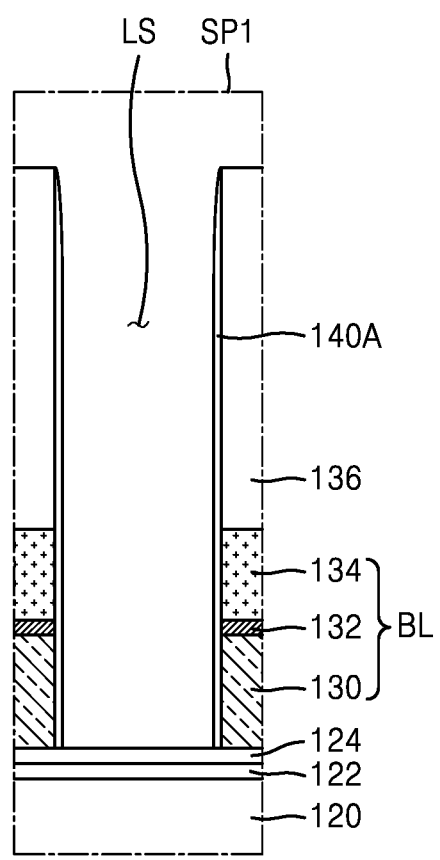
FIGS. 14A to 14C are cross-sectional views illustrating sequential processes of an example of a method of forming a plurality of insulating spacers, in a method of fabricating an integrated circuit device, according to some example embodiments of the inventive concepts.
Figure 14B:
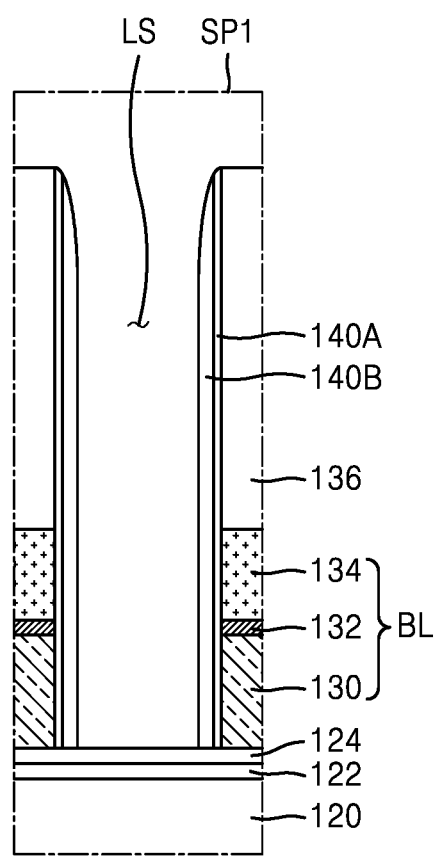
Figure 14C:
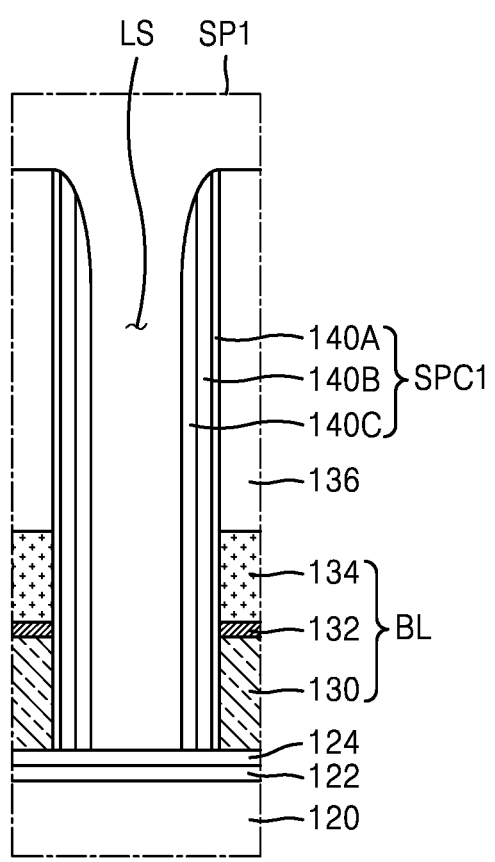

FIGS. 14A to 14C are cross-sectional views illustrating sequential processes of an example of a method of forming the plurality of insulating spacers SPC1 shown in FIG. 13G. In FIGS. 14A to 14C, a region corresponding to a dashed-dotted-line region indicated by "SP1" in FIG. 13G is illustrated while enlarged.

Referring to FIG. 14A, a plurality of insulating liners 140A is formed to cover the sidewalls of the plurality of bit lines BL, the sidewalls of the plurality of insulating capping patterns 136, and the sidewalls of the plurality of direct contacts DC in a result product of FIG. 13F. Each of the plurality of insulating liners 140A may include a nitride film. In some embodiments, to form the plurality of insulating liners 140A, a nitride liner may be formed on an entire surface of the result product of FIG. 13F, followed by performing etch-back of the nitride liner, whereby the plurality of insulating liners 140A may remain.

Referring to FIG. 14B, a plurality of first insulating spacers 140B are formed on the plurality of insulating liners 140A to cover the sidewalls of the plurality of bit lines BL, the sidewalls of the plurality of insulating capping patterns 136, and the sidewalls of the plurality of direct contacts DC. Each of the plurality of first insulating spacers 140B may include a silicon oxide film. To form the plurality of first insulating spacers 140B, a silicon oxide film may be formed on an entire surface of a result product of FIG. 14A, followed by performing etch-back of the silicon oxide film, whereby the plurality of first insulating spacers 140B may remain.

Referring to FIG. 14C, a plurality of second insulating spacers 140C are formed on the plurality of first insulating spacers 140B by a process similar to the process of forming the plurality of first insulating spacers 140B, as described with reference to FIG. 14B. Each of the plurality of second insulating spacers 140C may include a silicon nitride film.

Referring again to FIG. 13G, after the plurality of insulating spacers SPC1 are formed, each line space LS extending long along the Y direction may be defined between a plurality of line structures including the plurality of bit lines BL and the plurality of insulating capping patterns 136 on the second insulating film 124.

Figure 13H:
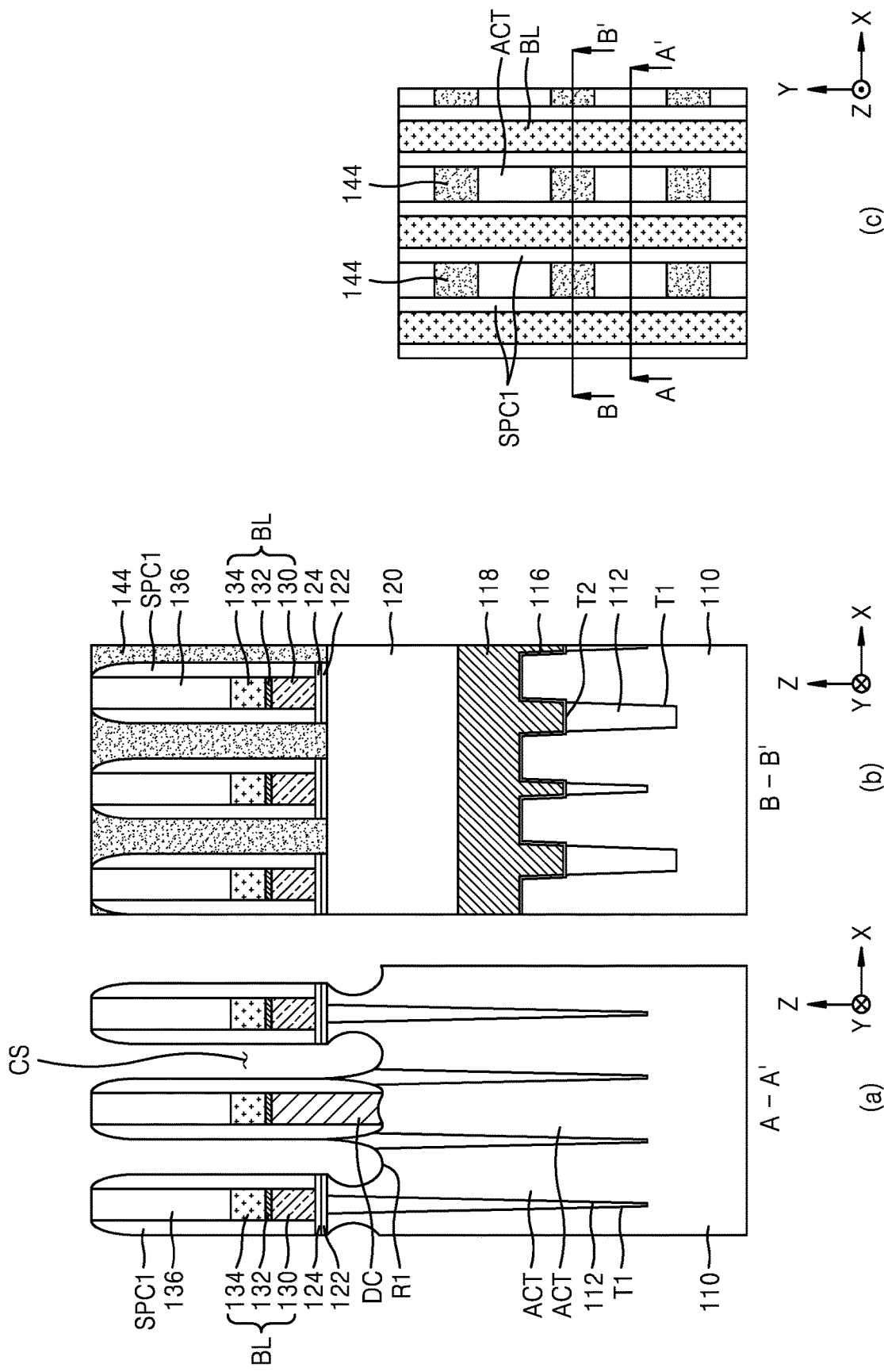

Referring to FIG. 13H, the plurality of insulating fences 144 for separating each line space LS between the plurality of bit lines BL into a plurality of contact spaces CS are formed. Each of the plurality of insulating fences 144 may have a shape of an insulating plug over the word line 118, the insulating plug vertically overlapping the word line 118. Thus, one line space LS may be separated into the plurality of contact spaces CS having pillar shapes by the plurality of insulating fences 144 formed in the one line space LS. Each of the plurality of insulating fences 144 may include a silicon nitride film. In some embodiments, as partial regions of the plurality of insulating capping patterns 136 adjacent to the plurality of insulating fences 144 are exposed to an etching process atmosphere accompanied with the formation of the plurality of insulating fences 144 while the plurality of insulating fences 144 are formed, the partial regions of the plurality of insulating capping patterns 136 may be consumed, and as a result, heights of the partial regions of the plurality of insulating capping patterns 136 may be reduced.

Next, structures exposed by the plurality of contact spaces CS are partially removed, thereby forming a plurality of recess spaces R1 exposing each active region ACT between the plurality of bit lines BL.

To form the plurality of recess spaces R1, anisotropic etching, isotropic etching, or combinations thereof may be used. For example, an anisotropic etching process may be performed to etch the second insulating film 124 and the first insulating film 122 among the structures exposed by the plurality of contact spaces CS each between the plurality of bit lines BL in this stated order, and the active region ACT of the substrate 110 exposed as a result of the etching of the first insulating film 122 may be partially removed by an isotropic etching process, thereby forming the plurality of recess spaces R1. Each of the plurality of recess spaces R1 may communicate with a contact space CS. The active region ACT of the substrate 110 may be exposed by the plurality of recess spaces R1.

Figure 13I:
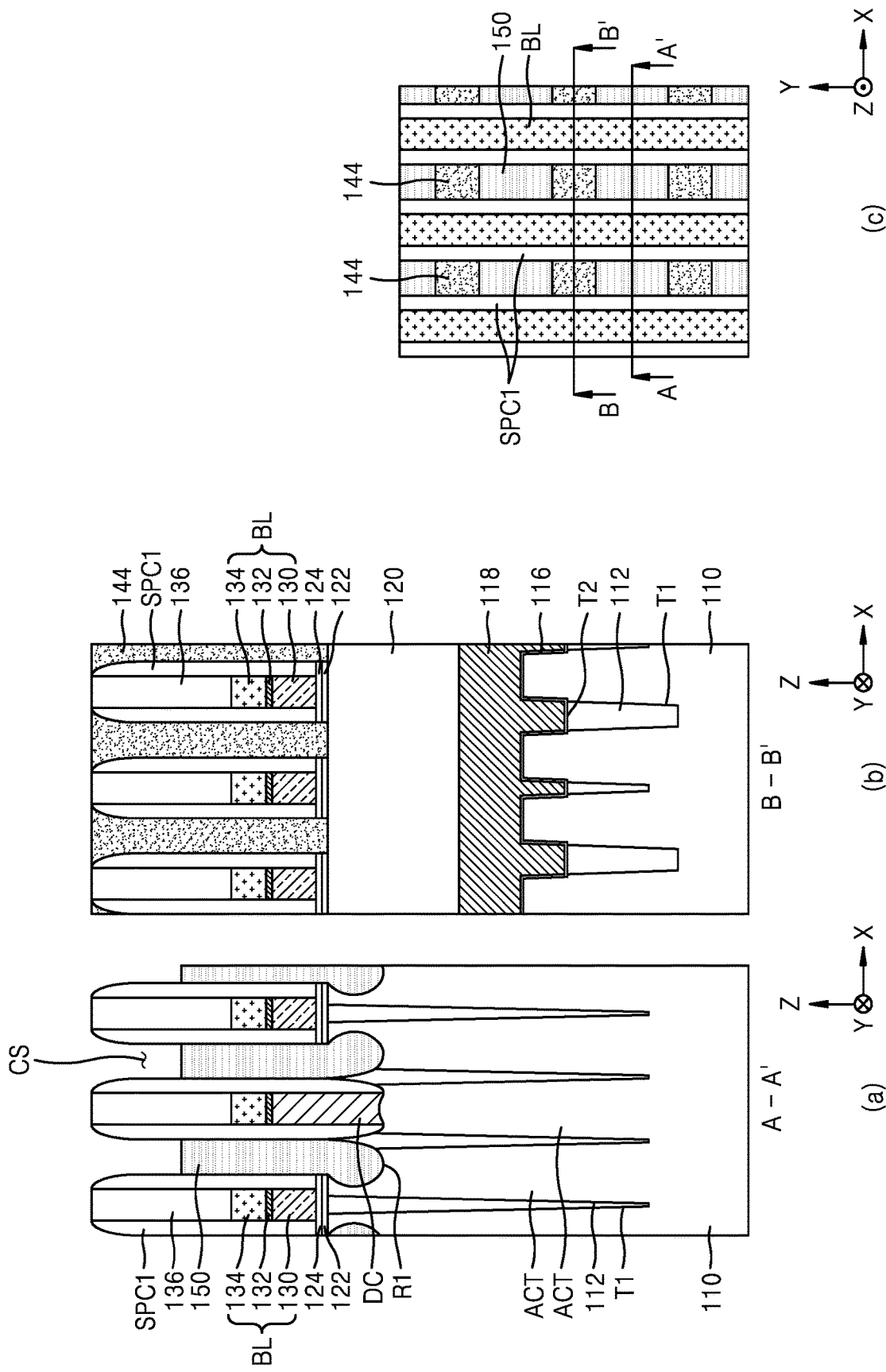

Referring to FIG. 13I, the plurality of lower conductive plugs 150 are formed, the plurality of lower conductive plugs 150 each partially filling the contact space CS between the plurality of bit lines BL while filling the plurality of recess spaces R1 each between the plurality of bit lines BL.

A vertical distance from the top surface of the substrate 110 to a top surface of each of the plurality of lower conductive plugs 150 may be greater than a vertical distance from the top surface of the substrate 110 to a top surface of each of the plurality of bit lines BL. To form the plurality of lower conductive plugs 150, a conductive layer, which covers top surfaces of the plurality of insulating capping patterns 136 and top surfaces of the plurality of insulating fences 144 while filling the plurality of recess spaces R1 and the plurality of contact spaces CS in a result product of FIG. 13H, may be formed, followed by removing an upper portion of the conductive layer by etch-back, whereby the top surfaces of the plurality of insulating capping patterns 136 and the top surfaces of the plurality of insulating fences 144 may be exposed, and an upper space at an entrance side of each of the plurality of contact spaces CS may be emptied again. Remaining portions of the conductive layer without being removed may constitute the plurality of lower conductive plugs 150. Each of the plurality of lower conductive plugs 150 may include doped polysilicon.

Figure 13J:
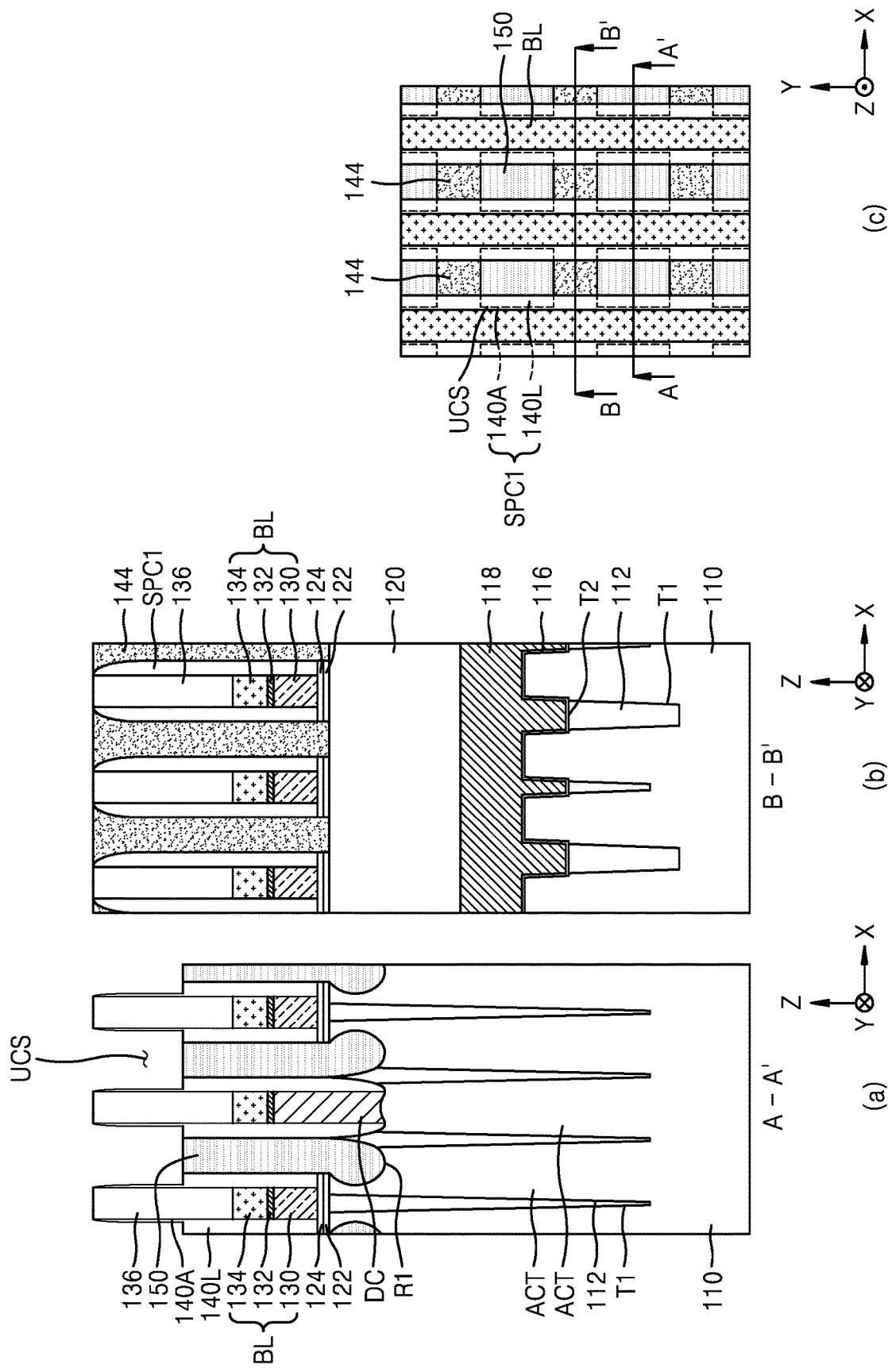

Referring to FIG. 13J, the plurality of insulating spacers SPC1 respectively exposed by the upper spaces at entrance sides of the plurality of contact spaces CS (see FIG. 13I) are at least partially removed, thereby forming a plurality of upper contact spaces UCS enlarged in width by enlarging widths of the plurality of contact spaces CS between the plurality of insulating capping patterns 136 in both lateral directions along a length direction of the word line 118. The width of each of the plurality of upper contact spaces UCS may be greater than a width of the lower conductive plug 150, in the X direction.

To form the plurality of upper contact spaces UCS, the plurality of insulating spacers SPC1 may be at least partially wet-etched. For example, the first insulating spacer 140B and the second insulating spacer 140C of each of the plurality of insulating spacers SPC1, which are shown in FIG. 14C and exposed over the lower conductive plug 150, may be removed by wet etching, thereby exposing the insulating liner 140A in each of the plurality of upper contact spaces UCS. Among inner sidewalls of each of the plurality of upper contact spaces UCS, a pair of insulating liners 140A may be exposed at a pair of inner sidewalls facing each other in the X direction, and a pair of insulating fences 144 may be exposed at a pair of inner sidewalls facing each other in the Y direction.

After the plurality of upper contact spaces UCS are formed, in each of the plurality of upper contact spaces UCS, only the insulating liner 140A, which is a portion of the insulating spacer SPC1, may remain on both sidewalls of each of the plurality of insulating capping patterns 136, and the insulating spacer SPC1 may remain as it is on both sidewalls of each of the plurality of lower conductive plugs 150 in the X direction and on both sidewalls of each of the plurality of insulating fences 144 in the X direction. A portion of each of the plurality of insulating spacers SPC1, which is remaining after the formation of an upper contact space UCS and covers both sidewalls of each of the plurality of lower conductive plugs 150, may constitute the lower insulating spacer 140L.

Figure 13K:
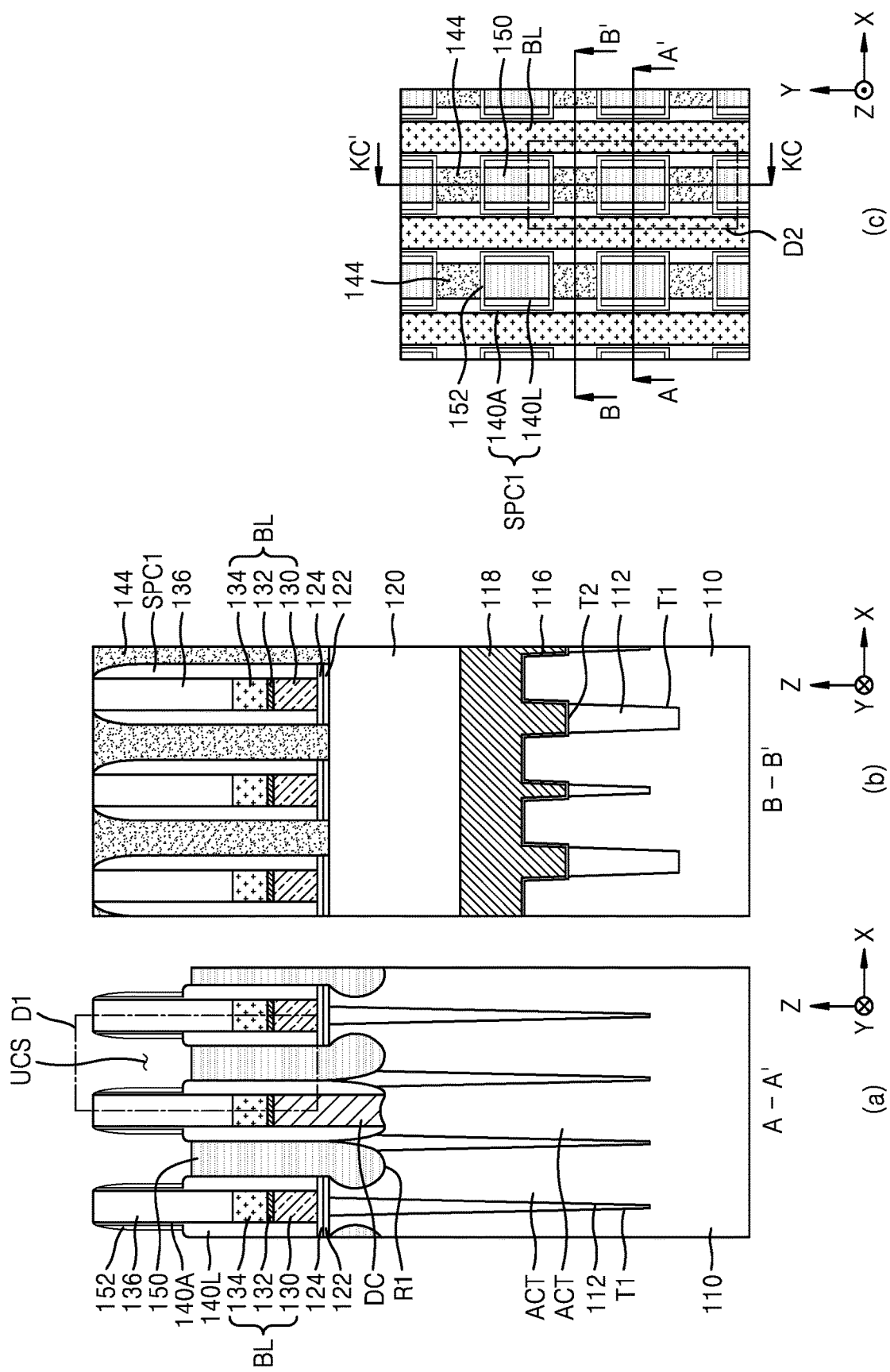

Referring to FIG. 13K, a plurality of upper insulating spacers 152 are formed, the plurality of upper insulating spacers 152 covering sidewalls of the plurality of insulating liners 140A and sidewalls of the plurality of insulating fences 144, which are exposed at the inner sidewalls of each of the plurality of upper contact spaces UCS.

To form the plurality of upper insulating spacers 152, an insulating film may be formed to conformally cover an entire surface of a result product of FIG. 13J, and then undergo etch-back. When an etch-back process of the insulating film is performed, top surfaces of the plurality of lower conductive plugs 150 may be exposed to an atmosphere of the etch-back process, and as a result, the plurality of lower conductive plugs 150 may be consumed from the top surfaces thereof as much as a certain thickness and thus be reduced in height. Each of the upper insulating spacers 152 may include a silicon nitride film.

Figure 15A:
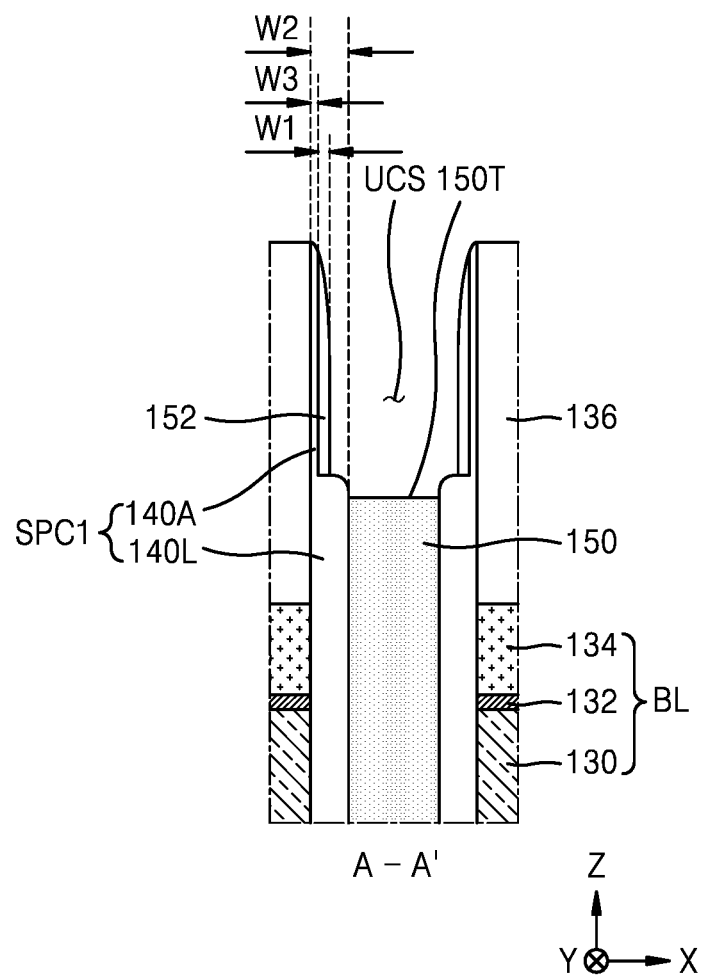
FIG. 15A is a partial cross-sectional view of a region indicated by "D2" in a plan view (c) of FIG. 13K, taken along a line A-A'.
Figure 15B:
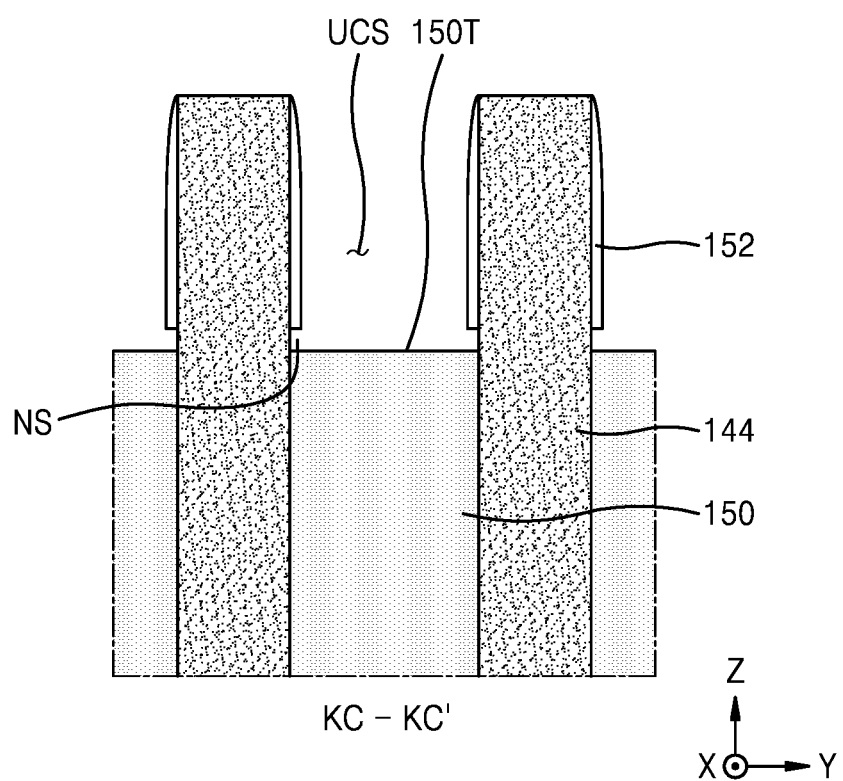
FIG. 15B is a partial cross-sectional view of the region indicated by "D2" in the plan view (c) of FIG. 13K, taken along a line KC-KC'.

FIG. 15A is an enlarged view of a region indicated by "D1" in the cross-sectional view (a) of FIG. 13K and is also a partial cross-sectional view of a region indicated by "D2" in the plan view (c) of FIG. 13K, taken along a line A-A', and FIG. 15B is a partial cross-sectional view of the region indicated by "D2" in the plan view (c) of FIG. 13K, taken along a line KC-KC'.

Referring to FIGS. 13K, 15A, and 15B, a width W1 of the upper insulating spacer 152 is less than a width W2 of the lower insulating spacer 140L, in the X direction, that is, a direction parallel to the word line 118. In addition, a sum (W1+W3) of the width W1 of the upper insulating spacer 152 and a width W3 of the insulating liner 140A is less than the width W2 of the lower insulating spacer 140L. Thus, the width of the upper contact space UCS defined by the upper insulating spacer 152 is greater than the width of the lower conductive plug 150, in the X direction, that is, the direction parallel to the word line 118.

As shown in FIG. 15B, the lower conductive plug 150 and the upper insulating spacer 152 may be spaced apart from each other, and may not contact each other. Thus, when viewed from a cross-section in the Y direction, the upper contact space UCS may include a narrow space NS defined between the top surface 150T of the lower conductive plug 150 and a bottom surface of the upper insulating spacer 152.

Figure 13L:
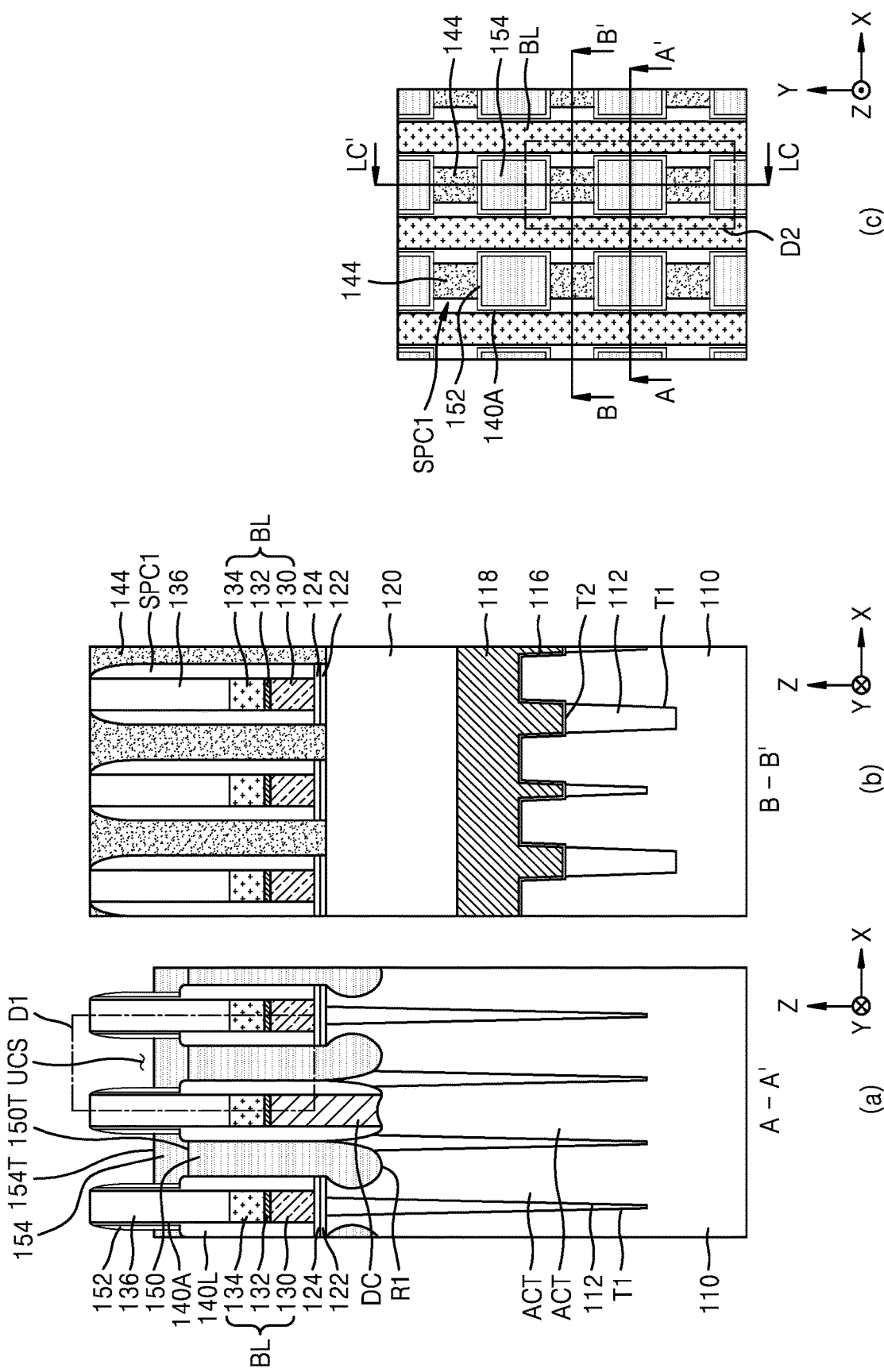
Figure 13M:
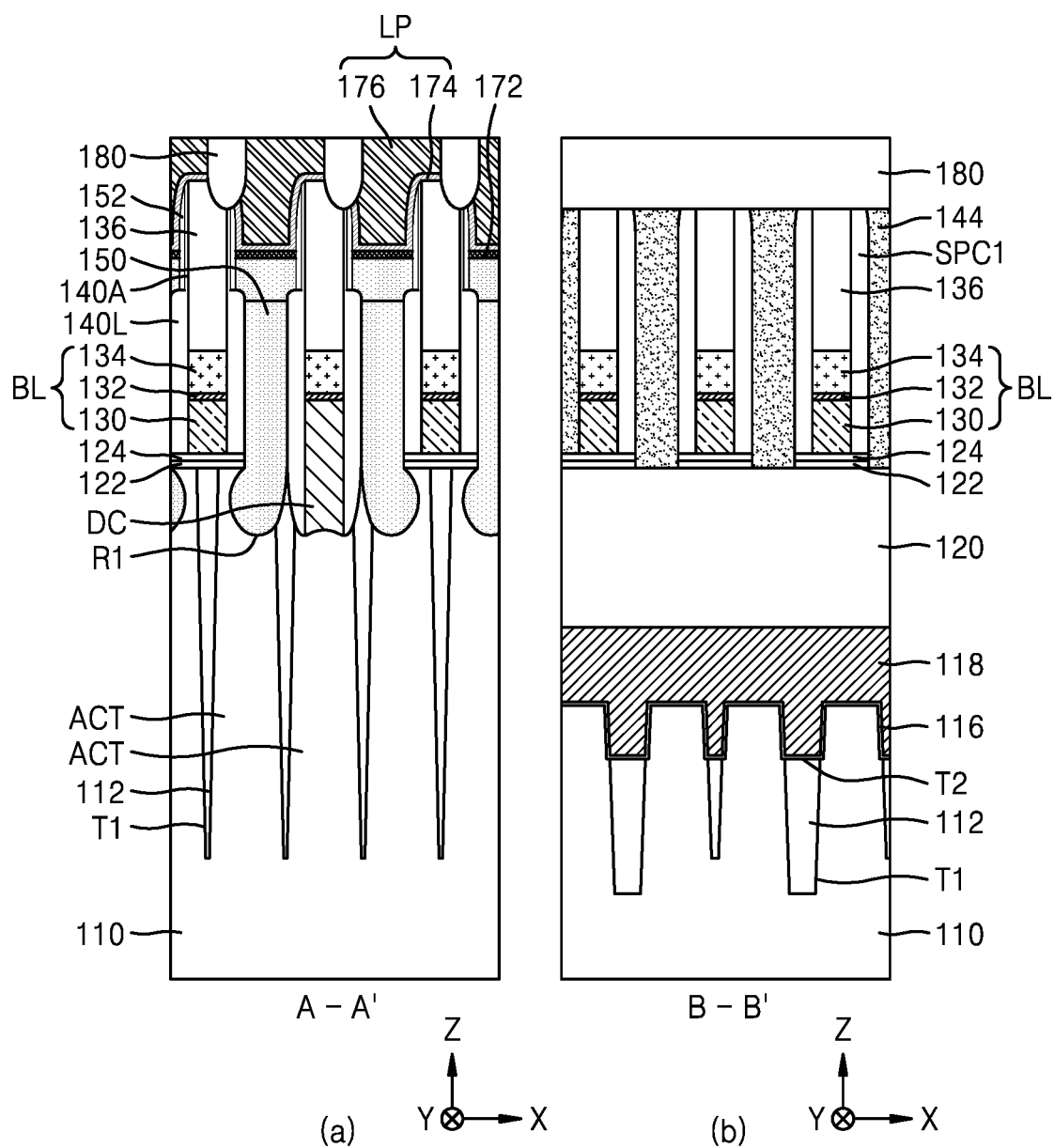

Referring to FIG. 13L, the enlarged conductive plug 154 is formed, the enlarged conductive plug 154 covering the lower conductive plug 150 in each of the plurality of upper contact spaces UCS. The top surface 154T of the enlarged conductive plug 154 has a greater surface area than the top surface 150T of the lower conductive plug 150. The enlarged conductive plug 154 may have an approximately T-like cross-sectional shape, in the X direction, that is, the direction parallel to the word line 118. Thus, when an upper conductive layer, for example, the metal silicide film 172 shown in FIG. 13M is formed in each of the plurality of upper contact spaces UCS, a greater contact area may be secured in the case where the upper conductive layer contacts the top surface 154T of the enlarged conductive plug 154 than in the case where the upper conductive layer contacts the top surface 150T of the lower conductive plug 150 without the enlarged conductive plug 154.

In an example of a process of forming the enlarged conductive plug 154, a conductive layer having a sufficient thickness for filling each of the plurality of upper contact spaces UCS may be formed on the lower conductive plug 150, followed by partially removing the conductive layer by etch-back, thereby leaving the enlarged conductive plug 154, which fills only a portion of each of the plurality of upper contact spaces UCS. The enlarged conductive plug 154 may include doped polysilicon.

In some embodiments, each of the lower conductive plug 150 and the enlarged conductive plug 154 may include an identical conductive material, for example, doped polysilicon. In some other embodiments, the lower conductive plug 150 and the enlarged conductive plug 154 may respectively include doped polysilicon having different doping concentrations from each other. In one example, the doping concentration of the doped polysilicon constituting the lower conductive plug 150 may be greater than the doping concentration of the doped polysilicon constituting the enlarged conductive plug 154. In another example, the doping concentration of the doped polysilicon constituting the lower conductive plug 150 may be less than the doping concentration of the doped polysilicon constituting the enlarged conductive plug 154.

In some embodiments, to form the enlarged conductive plug 154 on the lower conductive plug 150, directly after a doped polysilicon layer having a sufficient thickness for filling each of the plurality of upper contact spaces UCS is formed, the doped polysilicon layer may be annealed, whereby a film quality of the enlarged conductive plug 154 desired to be formed may be improved. The annealing may be performed at a temperature of about 600° C. to about 1200° C. For the annealing, heat, plasma, or a laser may be used. An interface between a doped polysilicon layer constituting the lower conductive plug 150 and a doped polysilicon layer constituting the enlarged conductive plug 154 may remain or may not remain, depending upon the annealing temperature. In some embodiments, if the doped polysilicon layer for forming the enlarged conductive plug 154 is annealed at a temperature of about 1000° C. or more directly after the formation thereof, the interface between the lower conductive plug 150 and the enlarged conductive plug 154 may not be present since reflow of the doped polysilicon layer constituting the lower conductive plug 150 and the doped polysilicon layer constituting the enlarged conductive plug 154 is induced, and thus, the lower conductive plug 150 and the enlarged conductive plug 154 may have an integrally connected structure. In some other embodiments, the doped polysilicon layer for forming the enlarged conductive plug 154 may be annealed at a temperature less than about 1000° C., for example, of about a 600° C. to about 900° C., directly after the formation thereof, the interface between the lower conductive plug 150 and the enlarged conductive plug 154 may be maintained.

Figure 16A:
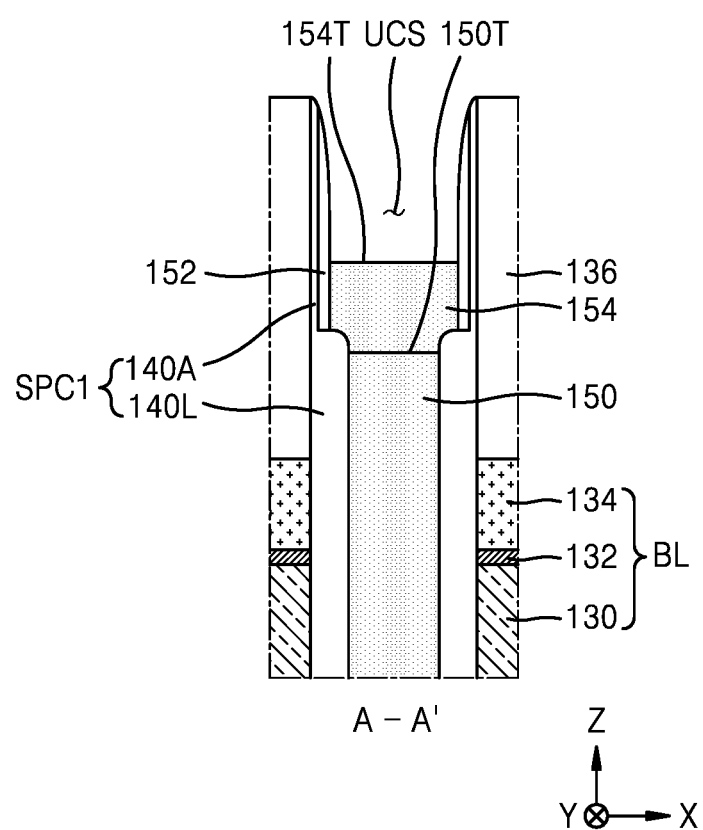
FIG. 16A is a partial cross-sectional view of a region indicated by "D2" in a plan view (c) of FIG. 13L, taken along a line A-A'.
Figure 16B:
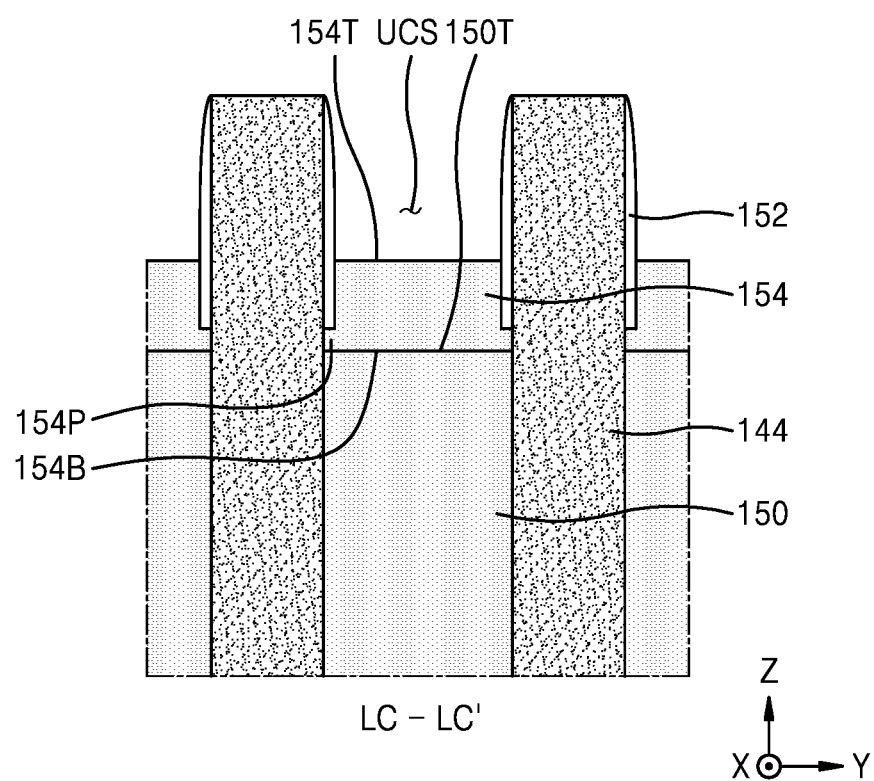
FIG. 16B is a partial cross-sectional view of the region indicated by "D2" in the plan view (c) of FIG. 13L, taken along a line LC-LC'.

FIG. 16A is an enlarged view of a region indicated by "D1" in the cross-sectional view (a) of FIG. 13L and is also a partial cross-sectional view of a region indicated by "D2" in the plan view (c) of FIG. 13L, taken along a line A-A', and FIG. 16B is a partial cross-sectional view of the region indicated by "D2" in the plan view (c) of FIG. 13L, taken along a line LC-LC'.

Referring to FIGS. 13L, 16A, and 16B, the enlarged conductive plug 154 may have an approximately T-like cross-sectional shape along the X direction, that is, the direction parallel to the word line 118, whereas the enlarged conductive plug 154 may have an approximately reverse-T-like cross-sectional shape along the Y direction, that is, a direction parallel to the bit line BL. As shown in FIG. 16B, the enlarged conductive plug 154 may include a lateral protrusion 154P filling the narrow space NS (see FIG. 15B) between the top surface 150T of the lower conductive plug 150 and the bottom surface of the upper insulating spacer 152. The lateral protrusion 154P of the enlarged conductive plug 154 may have a shape bidirectionally protruding, at the bottom side of the enlarged conductive plug 154, toward a pair of adjacent insulating fences 144 along the Y direction. The lateral protrusion 154P may contact a sidewall of each separate insulating fence 144, such that the lateral protrusion 154P contacts the pair of insulating fences 144. Due to the lateral protrusion 154P, the width of the bottom surface 154B of the enlarged conductive plug 154 may be greater than the width of the top surface 154T thereof, in the Y direction, that is, the direction parallel to the bit line BL. The enlarged conductive plug 154 may have a top surface 154T having a smaller width than the lateral protrusion 154P in a first horizontal direction (e.g., the Y direction) and contacting the metal silicide film 172.

Referring to FIG. 13M, the metal silicide film 172 is formed on each of a plurality of enlarged conductive plugs 154 exposed by the plurality of upper contact spaces UCS (see FIG. 13L), and the plurality of conductive landing pads LP are respectively formed on metal silicide films 172 to be connected to the enlarged conductive plugs 154 via the metal silicide films 172 while filling the plurality of upper contact spaces UCS over the metal silicide films 172.

The lower conductive plug 150, the enlarged conductive plug 154, and the metal silicide film 172 may constitute at least a portion of the buried contact BC shown in FIG. 1. Since the metal silicide film 172 is formed on the top surface 154T (see FIG. 13L) of the enlarged conductive plugs 154 providing a relatively large surface area, a process of forming the metal silicide films 172 may be relatively facilitated, and a surface area of the metal silicide film 172 may be relatively greatly increased, thereby contributing to reducing contact resistance of the buried contact BC.

The plurality of conductive landing pads LP may extend over the insulating capping patterns 136 to vertically partially overlap the plurality of bit lines BL while filling the plurality of upper contact spaces UCS over the metal silicide films 172. Each of the plurality of conductive landing pads LP may include a conductive barrier film 174 and a conductive layer 176 on the conductive barrier film 174, the conductive layer 176 extending above each of the plurality of bit lines BL while filling a remaining space of the upper contact space UCS over the conductive barrier film 174. The conductive barrier film 174 may include a Ti/TiN stacked structure. The conductive layer 176 may include a metal, a metal nitride, conductive polysilicon, or combinations thereof. For example, the conductive layer 176 may include tungsten (W).

A mask pattern (not shown), which partially exposes the conductive layer 176, may be formed on the conductive layer 176, followed by etching the conductive barrier film 174, the conductive layer 176, and insulating films therearound by using the mask pattern as an etch mask, thereby forming the plurality of conductive landing pads LP, which include remaining portions of the conductive barrier film 174 and the conductive layer 176. The mask pattern may include a silicon nitride film, without being limited thereto. The plurality of conductive landing pads LP may respectively include a plurality of island patterns. Portions of the plurality of conductive landing pads LP, which extend outside the upper contact spaces UCS, may constitute the plurality of conductive landing pads LP shown in FIG. 1. Due to an etching process atmosphere accompanied with the formation of the plurality of conductive landing pads LP, partial regions of each of the plurality of insulating capping patterns 136 and the plurality of insulating spacers SPC1 covering the sidewalls of the plurality of insulating capping patterns 136 may also be removed, the partial regions being around the plurality of conductive landing pads LP, whereby the partial regions of each of the plurality of insulating capping patterns 136 and the plurality of insulating spacers SPC1 may be reduced in height.

An insulating film 180 may fill spaces around the plurality of conductive landing pads LP, thereby electrically insulating the plurality of conductive landing pads LP from each other. Next, a plurality of capacitor bottom electrodes, which may be electrically connected to the plurality of conductive landing pads LP, may be formed on the insulating film 180.

To fabricate the integrated circuit device 100A shown in FIGS. 2A to 2C, the method described with reference to FIGS. 13A to 13M may be used. Although an example, in which the plurality of conductive landing pads LP have shapes extending above the plurality of bit lines BL while filling remaining spaces of the upper contact spaces UCS, has been described with reference to FIG. 13M, the inventive concepts is not limited thereto. For example, instead of the plurality of conductive landing pads LP, the conductive landing pad 190, which does not extend outside the upper contact space UCS although filling the upper contact space UCS as shown in FIG. 2A, may be formed.

According to the method of fabricating the integrated circuit device, according to some example embodiments of the inventive concepts, as described with reference to FIGS. 13A to 13M, in forming the buried contact BC which is a contact structure connected to each active region ACT of the substrate 110 between the plurality of bit lines BL, each line space LS is separated into the plurality of contact spaces CS by forming the plurality of insulating fences 144 in each line space LS between the plurality of bit lines BL, followed by forming the plurality of upper contact spaces UCS by enlarging an upper width of each of the plurality of contact spaces CS in both lateral directions along the length direction of the word line 118. Next, the enlarged conductive plug 154 having the top surface 154T of a relatively large surface area, which is located in each of the plurality of upper contact spaces UCS, is formed, followed by forming the metal silicide film 172 on the top surface 154T of the enlarged conductive plug 154. Thus, the process of forming the metal silicide films 172 may be relatively facilitated, and the surface area of the metal silicide film 172 may be relatively greatly increased, thereby contributing to reducing the contact resistance of the contact structure including the metal silicide film 172.

Figure 17:
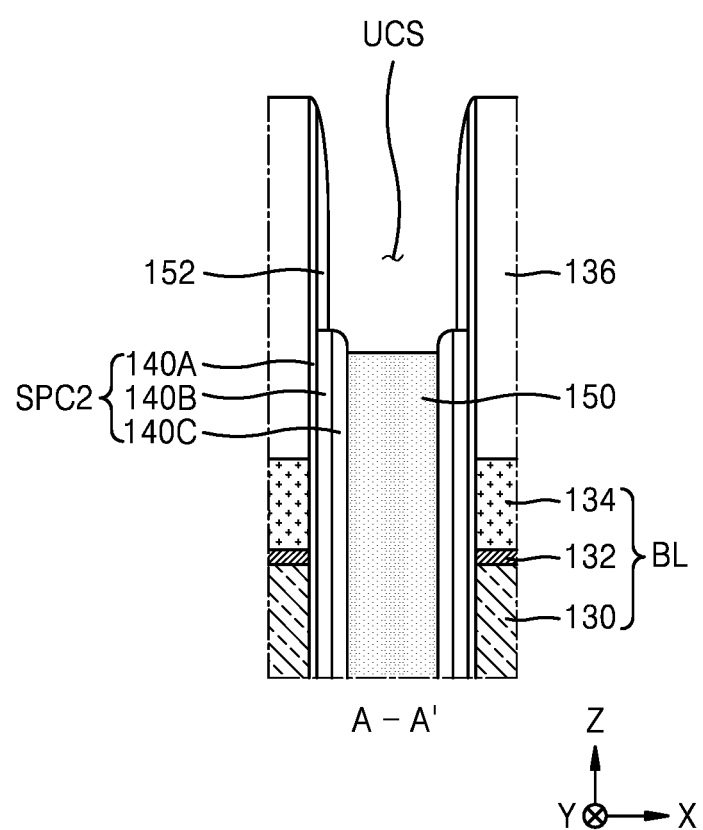
FIG. 17 is a partial cross-sectional view illustrating an example of a structure which may be obtained by a method of fabricating an integrated circuit device, according to some example embodiments of the inventive concepts.

FIG. 17 is a partial cross-sectional view illustrating an example of a structure which may be obtained after the plurality of upper insulating spacers 152 are formed as described with reference to FIG. 13K, when the insulating spacer SPC2 including the insulating liner 140A, the first insulating spacer 140B, and the second insulating spacer 140C is formed similarly to the insulating spacer SPC1 shown in FIG. 14C.

Referring to FIG. 17, like in the description made with reference to FIG. 15A, the width of the upper insulating spacer 152 is less than a width of a portion of the insulating spacer SPC2, which covers both sidewalls of the lower conductive plug 150, in the X direction, that is, the direction parallel to the word line 118. A portion of the first insulating spacer 140B of the insulating spacer SPC2, which covers both sidewalls of the lower conductive plug 150, may be arranged to vertically overlap the upper insulating spacer 152. The integrated circuit device 100B shown in FIGS. 3A and 3B may be fabricated by making reference to the description made with reference to FIG. 17.

In some other embodiments, in the processes described with reference to FIG. 13M, after the plurality of conductive landing pads LP are formed, before filling the spaces therearound with the insulating film 180, the first insulating spacer 140B, which is a portion of the insulating spacer SPC2 shown in FIG. 17, may be removed by a wet etching process, thereby forming a structure including the lower air spacer 140AS as in the integrated circuit device 100C shown in FIGS. 4A and 4B.

Figure 18A:
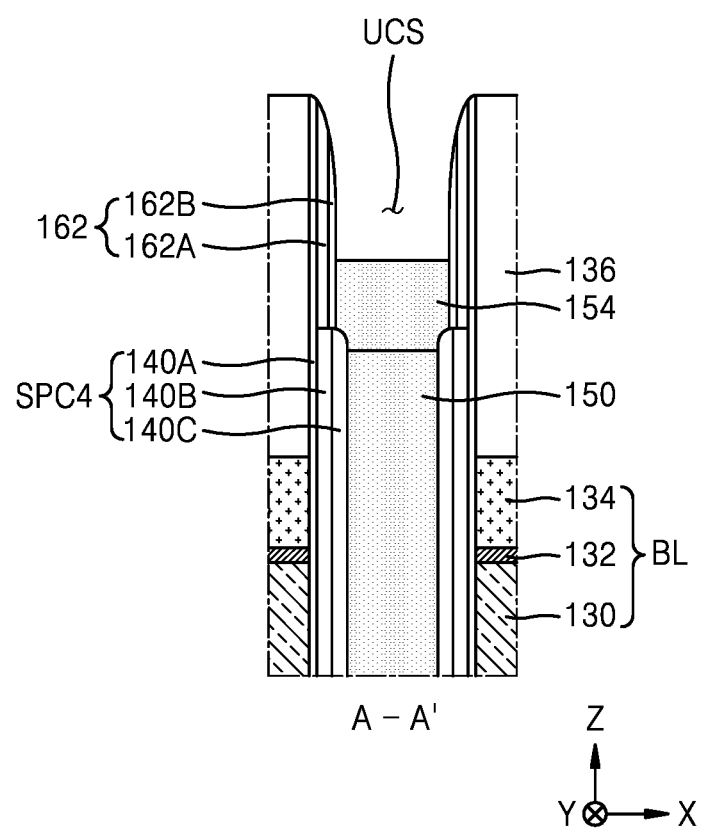
FIGS. 18A and 18B are cross-sectional views illustrating sequential processes of a method of fabricating an integrated circuit device, according to some example embodiments of the inventive concepts.
Figure 18B:
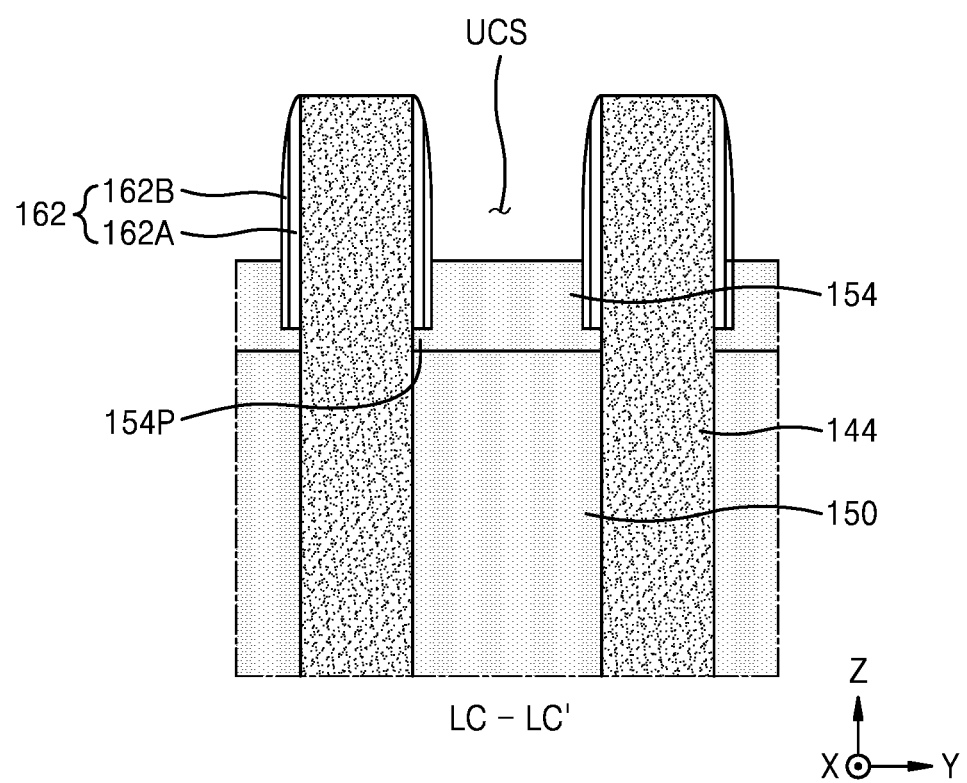

FIGS. 18A and 18B are cross-sectional views illustrating sequential processes of a method of fabricating an integrated circuit device, according to other embodiments of the inventive concepts. A method of fabricating the integrated circuit device 100D shown in FIGS. 5A and 5B will be described with reference to FIGS. 18A and 18B. FIG. 18A is a partial cross-sectional view of a region corresponding to a cross-section taken along the line A-A' for the region indicated by "D2" in the plan view (c) of FIG. 13L, and FIG. 18B is a partial cross-sectional view of a region corresponding to a cross-section taken along the line LC-LC' for the region indicated by "D2" in the plan view (c) of FIG. 13L.

The method of fabricating the integrated circuit device, which is described with reference to FIGS. 18A and 18B, is substantially identical to the method described with reference to FIGS. 13A to 13M. However, instead of the upper insulating spacer 152 described with reference to FIG. 13K, the upper insulating spacer 162 including two layers is formed.

Referring to FIGS. 18A and 18B for more specific descriptions, after the processes described with reference to FIGS. 13A to 13J are performed, a plurality of upper insulating spacers 162 are formed, the plurality of upper insulating spacers 162 covering the plurality of insulating liners 140A and the plurality of insulating fences 144, which are exposed at the inner sidewalls of each of the plurality of upper contact spaces UCS. Each of the plurality of upper insulating spacers 162 may include the oxide spacer 162A and the nitride spacer 162B.

In the X direction, that is, the direction parallel to the word line 118, a sum of a width of the oxide spacer 162A and a width of the nitride spacer 162B is less than a width of the lower insulating spacer, which is a portion of the insulating spacer SPC4 arranged between the bit line BL and the lower conductive plug 150. In addition, a sum of a width of the insulating liner 140A, the width of the oxide spacer 162A, and the width of the nitride spacer 162B is less than the width of the lower insulating spacer. Thus, the width of the upper contact space UCS defined by the upper insulating spacer 162 is greater than the width of the lower conductive plug 150, in the X direction, that is, the direction parallel to the word line 118.

Next, in a similar manner to that described with reference to FIG. 13L, the enlarged conductive plug 154, which covers the lower conductive plug 150 in each of the plurality of upper contact spaces UCS, may be formed. Next, similar processes to those described with reference to FIG. 13M may be performed, thereby fabricating the integrated circuit device 100D, which includes the upper insulating spacer 162 of a two-layer structure shown in FIG. 5A instead of the upper insulating spacer 152 although having a similar structure to the structure shown in FIG. 13M. The upper insulating spacer 162 may have a planar structure of a ring shape surrounding the enlarged conductive plug 154, as shown in FIG. 5B.

To fabricate the integrated circuit device 100E shown in FIGS. 6A and 6B, after the plurality of conductive landing pads LP are formed as in the processes described with reference to FIG. 13M, before filling the spaces therearound with the insulating film 180, the oxide spacer 162A, which is a portion of the upper insulating spacer 162 shown in FIGS. 18A and 18B, and the first insulating spacer 140B, which is a portion of the insulating spacer SPC4, may be removed by a wet etching process, thereby forming the lower air spacer 140AS and the upper air spacer 162AS.

FIGS. 19A to 19G are cross-sectional views illustrating sequential processes of a method of fabricating an integrated circuit device, according to some example embodiments of the inventive concepts. In FIGS. 19A to 19G, each cross-sectional view denoted by (a) illustrates main configurations of a region corresponding to the cross-section taken along the line A-A' of FIG. 1 according to a process order, and each cross-sectional view denoted by (b) illustrates main configurations of a region corresponding to the cross-section taken along the line B-B' of FIG. 1 according to a process order. In addition, in FIGS. 19A to 19F, each plan view denoted by (c) illustrates a planar configuration of some components of a result product obtained in a corresponding process.

Referring to FIG. 19A, in the same manner as described as to the method of forming the plurality of insulating spacers SPC1 with reference to FIGS. 13A to 13G, a plurality of insulating spacers 240 are formed to cover sidewalls of each of the plurality of bit lines BL, the plurality of insulating capping patterns 136, and the plurality of direct contacts DC.

In some embodiments, the plurality of insulating spacers 240 may be formed by the method shown in FIGS. 14A to 14C. In some other embodiments, the plurality of insulating spacers 240 may be formed by a different method from the method shown in FIGS. 14A to 14C.

Figure 19B:
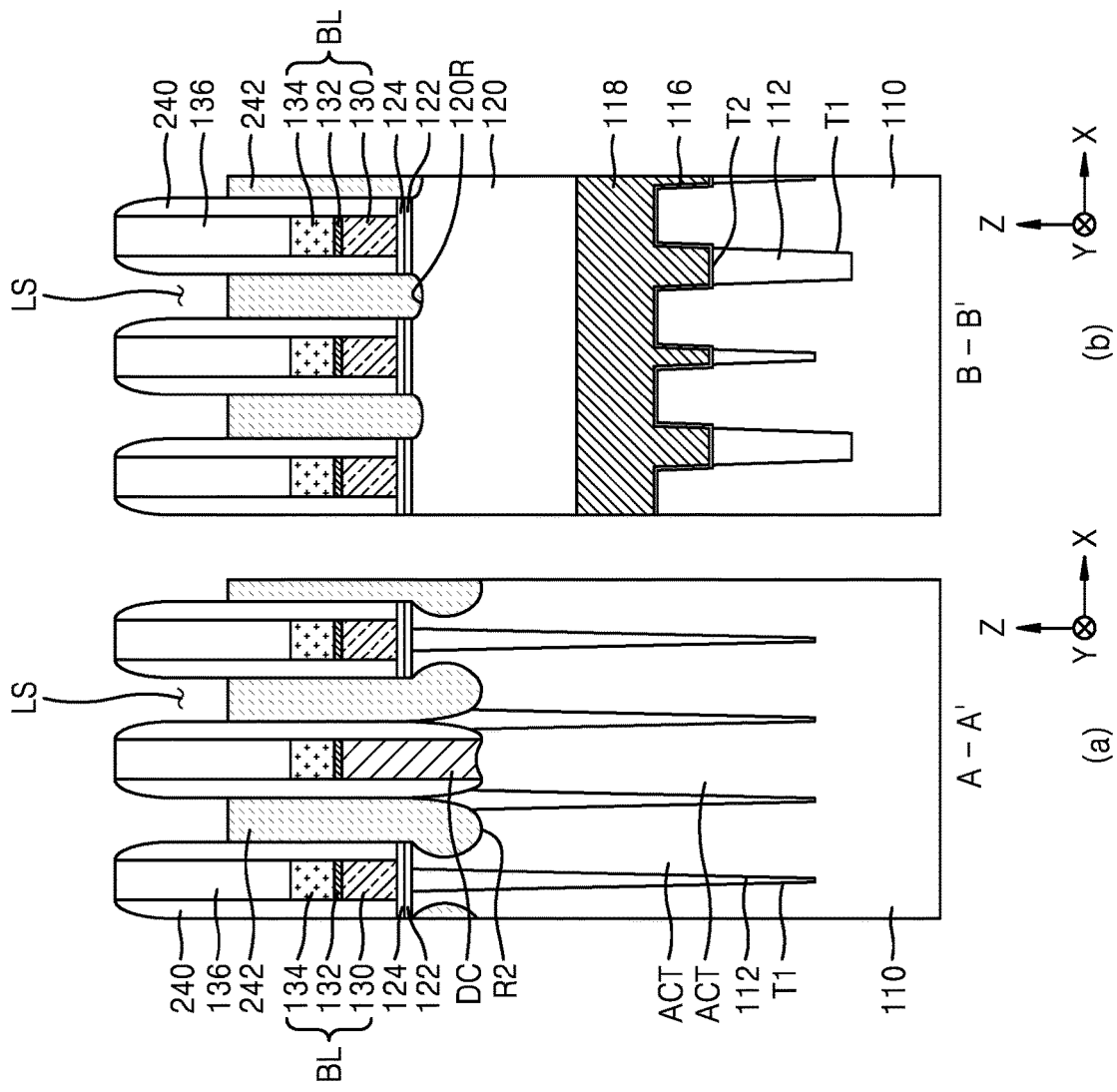
Figure 20A:
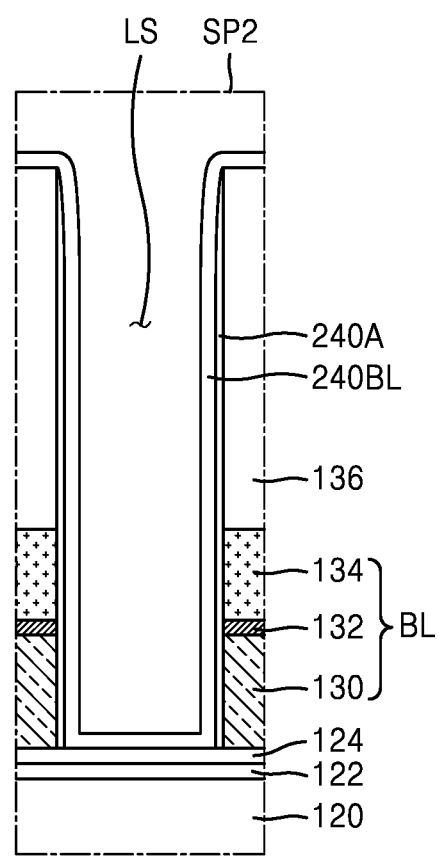
FIGS. 20A to 20C are cross-sectional views illustrating sequential processes of another example of a method of forming a plurality of insulating spacers, in a method of fabricating an integrated circuit device, according to some example embodiments of the inventive concepts.
Figure 20B:
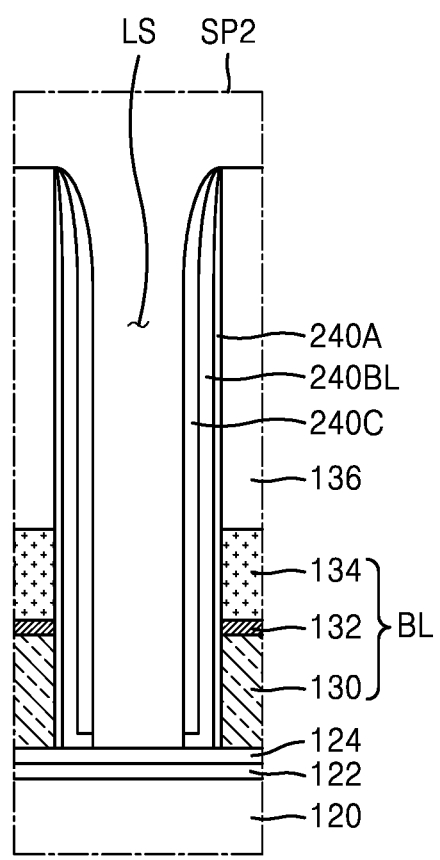
Figure 20C:
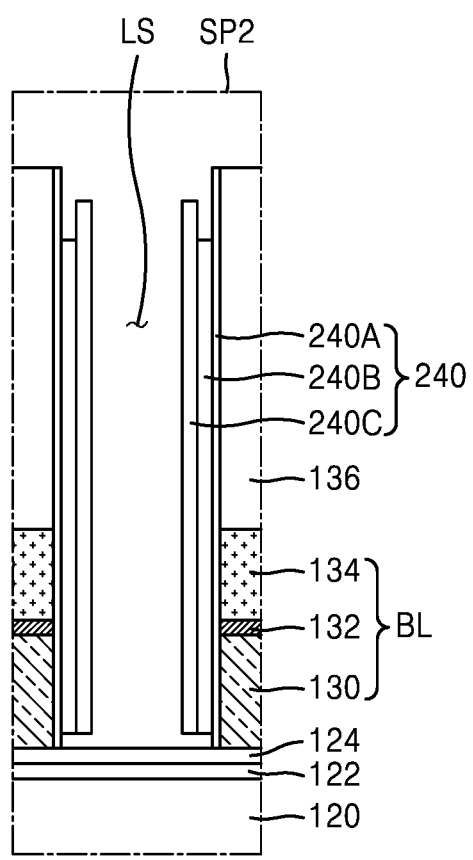

FIGS. 20A to 20C are cross-sectional views illustrating sequential processes of an example of a method of forming the plurality of insulating spacers 240 shown in FIG. 19A. In FIGS. 20A to 20C, a region corresponding to a dashed-dotted-line region indicated by "SP2" in FIG. 19A is illustrated while enlarged.

Referring to FIG. 20A, the plurality of insulating liners 240A are formed to cover the sidewalls of each of the plurality of bit lines BL, the plurality of insulating capping patterns 136, and the plurality of direct contacts DC. More detailed configurations of plurality of insulating liners 240A are the same as described as to the plurality of insulating liners 140A with reference to FIG. 14A. Next, an oxide liner 240BL is formed to conformally cover an entire surface of a result product in which the plurality of insulating liners 240A are formed.

Referring to FIG. 20B, a nitride liner is formed on the oxide liner 240BL, followed by forming the second insulating spacer 240C by performing etch-back of the nitride liner. Here, the oxide liner 240BL exposed as a result of the etch-back of the nitride liner may also undergo etch-back, whereby the second insulating film 124 may be exposed at a bottom surface of the line space LS, and a top surface of each of the plurality of insulating capping patterns 136 may be exposed. As a result, the oxide liner 240BL may remain between the insulating liner 240A and the second insulating spacer 240C and between the bottom surface of the second insulating spacer 240C and the top surface of the second insulating film 124, in the line space LS.

Referring to FIG. 20C, a portion of the oxide liner 240BL, which is exposed in the vicinity of each of a bottom and an entrance of the line space LS, is removed by a wet etching process, thereby forming the first insulating spacer 240B, which includes a remaining portion of the oxide liner 240BL, and exposing the insulating liner 240A in the vicinity of the bottom of the line space LS. Here, as the portion of the oxide liner 240BL in the vicinity of each of the bottom and the entrance of the line space LS is removed, the second insulating spacer 240C may include portions protruding above the oxide liner 240BL, and the portions of the second insulating spacer 240C protruding above the oxide liner 240BL may be partially consumed due to a 3-dimensional etching effect when exposed to a wet etching atmosphere. As a result, as the oxide liner 240BL is etched, the second insulating spacer 240C may also be reduced in height. In some embodiments, to remove the portion of the oxide liner 240BL by a wet etching process, hydrofluoric acid (HF) may be used.

Referring again to FIG. 19A, after the plurality of insulating spacers 240 are formed, each line space LS extending long along the Y direction may be defined between the plurality of line structures including the plurality of bit lines BL and the plurality of insulating capping patterns 136 on the second insulating film 124. In the process of forming the plurality of insulating spacers 240, for example, after a process of forming the second insulating spacer 240C described with reference to FIG. 20B, structures exposed at the bottom surface of the line space LS may be partially removed, thereby forming a plurality of recess spaces R2, each exposing the active region ACT of the substrate 110 between the plurality of bit lines BL. Detailed processes for forming the plurality of recess spaces R2 is substantially similar to that described as to the formation of the plurality of recess spaces R1 with reference to FIG. 13H. However, in this example, each of the plurality of recess spaces R2 may have a line shape extending long along the Y direction that is a length direction of a plurality of line spaces LS. During the formation of the plurality of recess spaces R2, a top surface of the buried insulating film 120 exposed by the plurality of line spaces LS may also be partially consumed, whereby a plurality of recess lines 120R may be formed on the buried insulating film 120. Each of the plurality of recess spaces R2 may communicate with a corresponding line space LS. The active regions ACT of the substrate 110 may be exposed by the plurality of recess spaces R2.

The plan view (c) of FIG. 19A illustrates a planar configuration of some components of a result product obtained after the plurality of recess spaces R2 and the plurality of recess lines 120R are formed. In the plan view (c) of FIG. 19A, the plurality of word lines 118 are marked by dashed lines for better understanding.

Referring to FIG. 19B, a plurality of molds 242 are formed, the plurality of molds 242 partially filling the respective line spaces LS between the plurality of bit lines BL while filling the plurality of recess spaces R2 each between the plurality of bit lines BL.

A top surface of each of the plurality of molds 242 may be at a higher level than the top surface of each of the plurality of bit lines BL. To form the plurality of molds 242, in the result product of FIG. 19A, a mold layer may be formed to cover the top surfaces of the plurality of insulating capping patterns 136 while filling the plurality of recess spaces R2 and the plurality of line spaces LS, followed by removing an upper portion of the mold layer by etch-back, thereby exposing the top surfaces of the plurality of insulating capping patterns 136 and also emptying an upper space at an entrance side of each of the plurality of line spaces LS again. Each of the plurality of molds 242 may include a carbon-containing film or a polysilicon layer. In some embodiments, the carbon-containing film may include a spin-on-hardmask (SOH) film. The SOH film may include an organic compound including carbon in a relatively high amount of about 85% by weight (wt %) to about 99 wt % based on a total weight thereof. The organic compound may include a hydrocarbon compound including an aromatic ring such as a phenyl group, benzene, or naphthalene, or a derivative thereof.

Figure 19C:
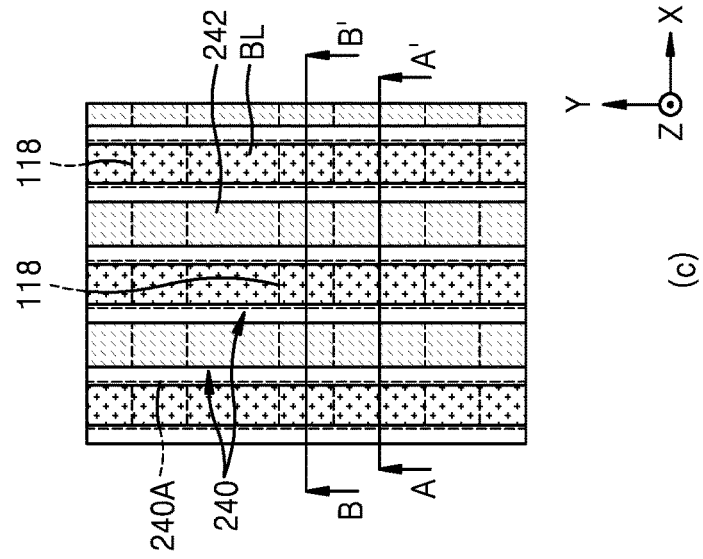
Figure 19C:
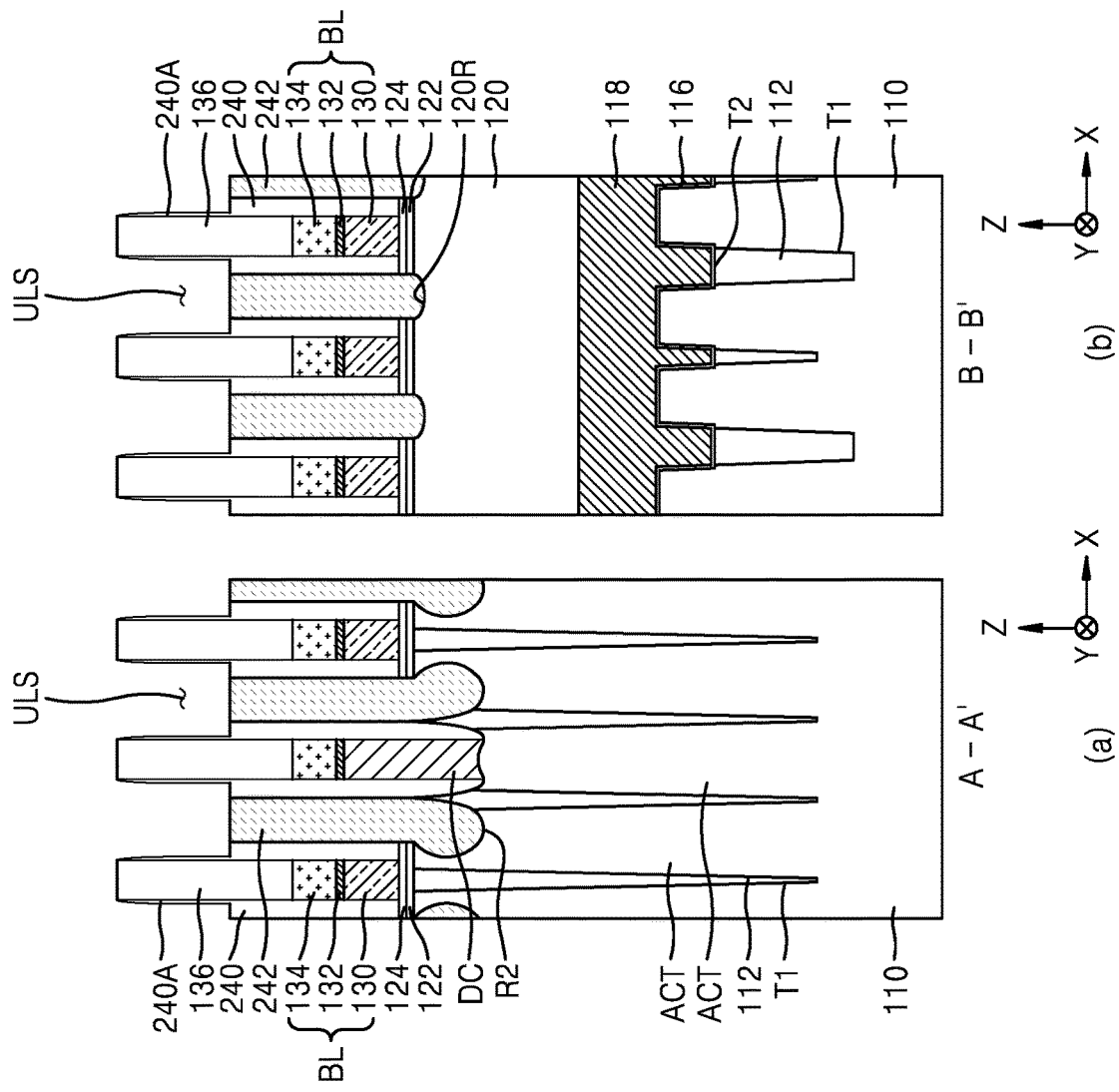

Referring to FIG. 19C, each of the plurality of insulating spacers 240 exposed by the upper space at the entrance side of each of the plurality of line spaces LS is at least partially removed, thereby forming a plurality of upper line spaces ULS enlarged in width by enlarging upper spaces at entrance sides of the plurality of line spaces LS each between the plurality of insulating capping patterns 136 in both lateral directions along the X direction, that is, the length direction of the word line 118. A width of each of the plurality of upper line spaces ULS is greater than a width of a mold 242, in the X direction.

To form the plurality of upper line spaces ULS, the plurality of insulating spacers 240 may be at least partially wet-etched. In some embodiments, in the case where the plurality of insulating spacers 240 are formed by the method described with reference to FIGS. 14A to 14C, to form the plurality of upper line spaces ULS, the first insulating spacer 140B and the second insulating spacer 140C of each of the plurality of insulating spacers 240 exposed above the mold 242 may be removed by wet etching in a similar manner to that described with reference to FIG. 13J, thereby exposing the insulating liner 140A in each of the plurality of upper line spaces ULS. In some other embodiments, in the case where the plurality of insulating spacers 240 are formed by the method described with reference to FIGS. 20A to 20C, to form the plurality of upper line spaces ULS, the first insulating spacer 240B and the second insulating spacer 240C, which are shown in FIG. 20C, included in each of the plurality of insulating spacers 240 exposed above the mold 242 may be removed by wet etching, thereby exposing the insulating liner 240A in each of the plurality of upper line spaces ULS. A pair of insulating liners 240A may be exposed at a pair of inner sidewalls facing each other in the X direction among inner sidewalls of the plurality of upper line spaces ULS.

Figure 19D:
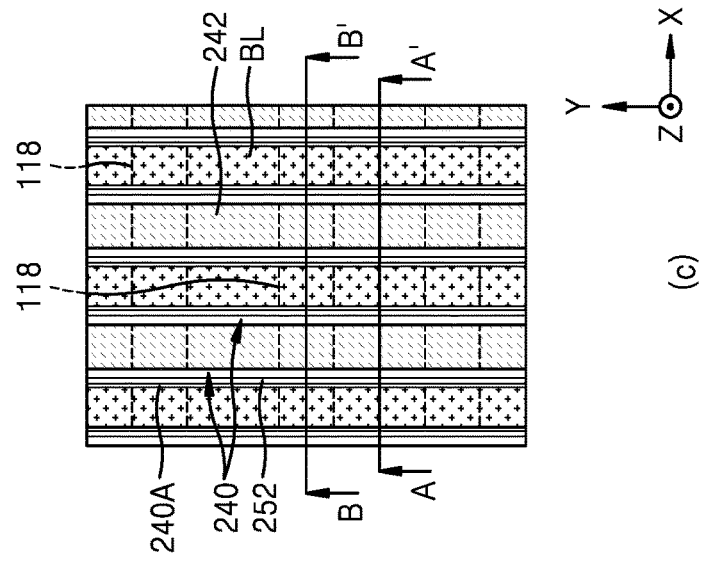
Figure 19D:
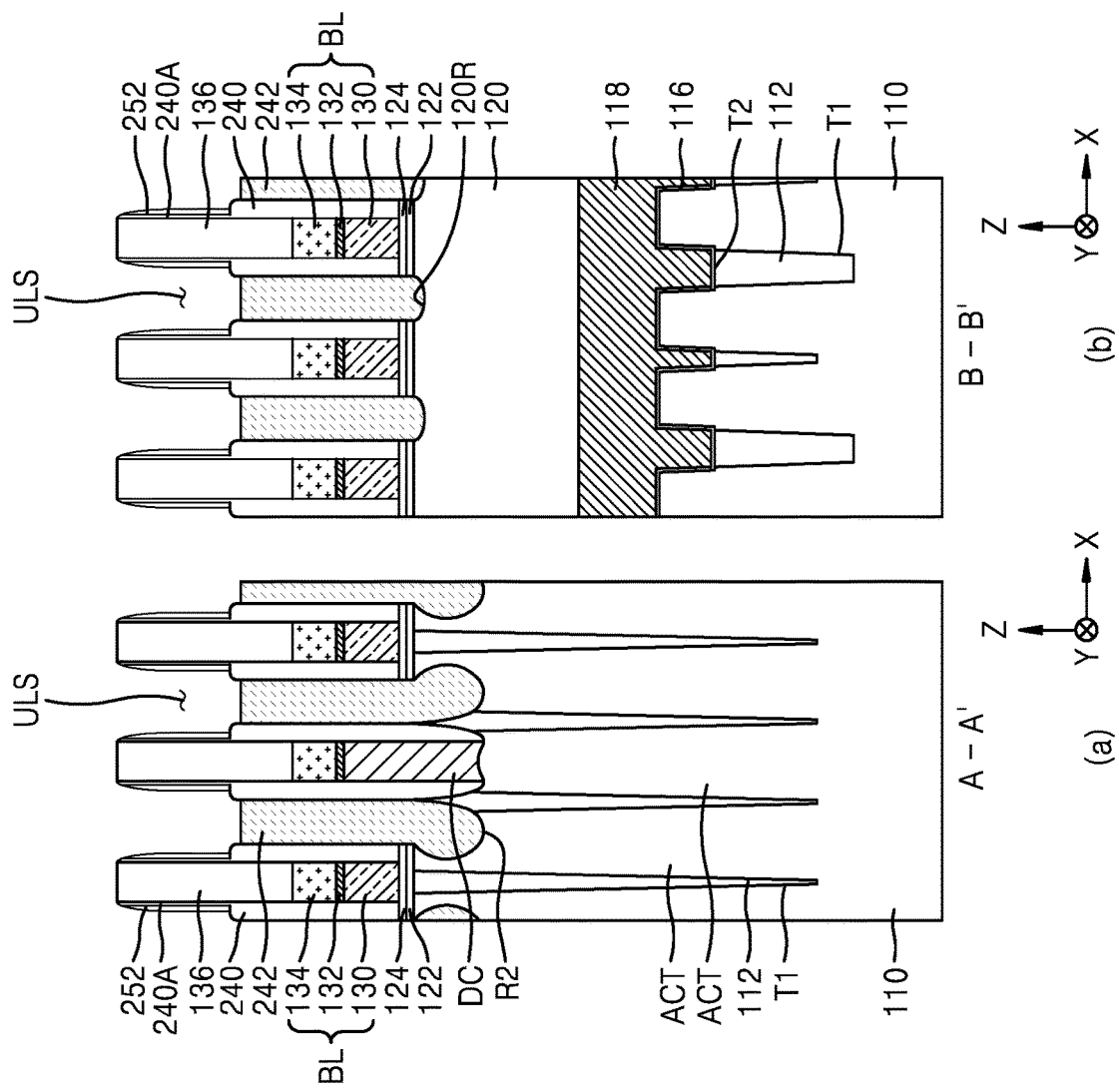

Referring to FIG. 19D, in a similar manner to that described as to the method of forming the upper insulating spacer 152 with reference to FIG. 13K, a plurality of upper insulating spacers 252 are formed to cover the plurality of insulating liners 240A exposed at the inner sidewalls of the plurality of upper line spaces ULS. However, the upper insulating spacer 252 may have a line shape extending side by side with the plurality of bit lines BL in the Y direction.

Like in the description made as to the lower conductive plug 150 with reference to FIG. 13K, the mold 242 may be consumed as much as a certain thickness from a top surface thereof during the formation of the plurality of upper insulating spacers 252, and thus be reduced in height.

Figure 19E:
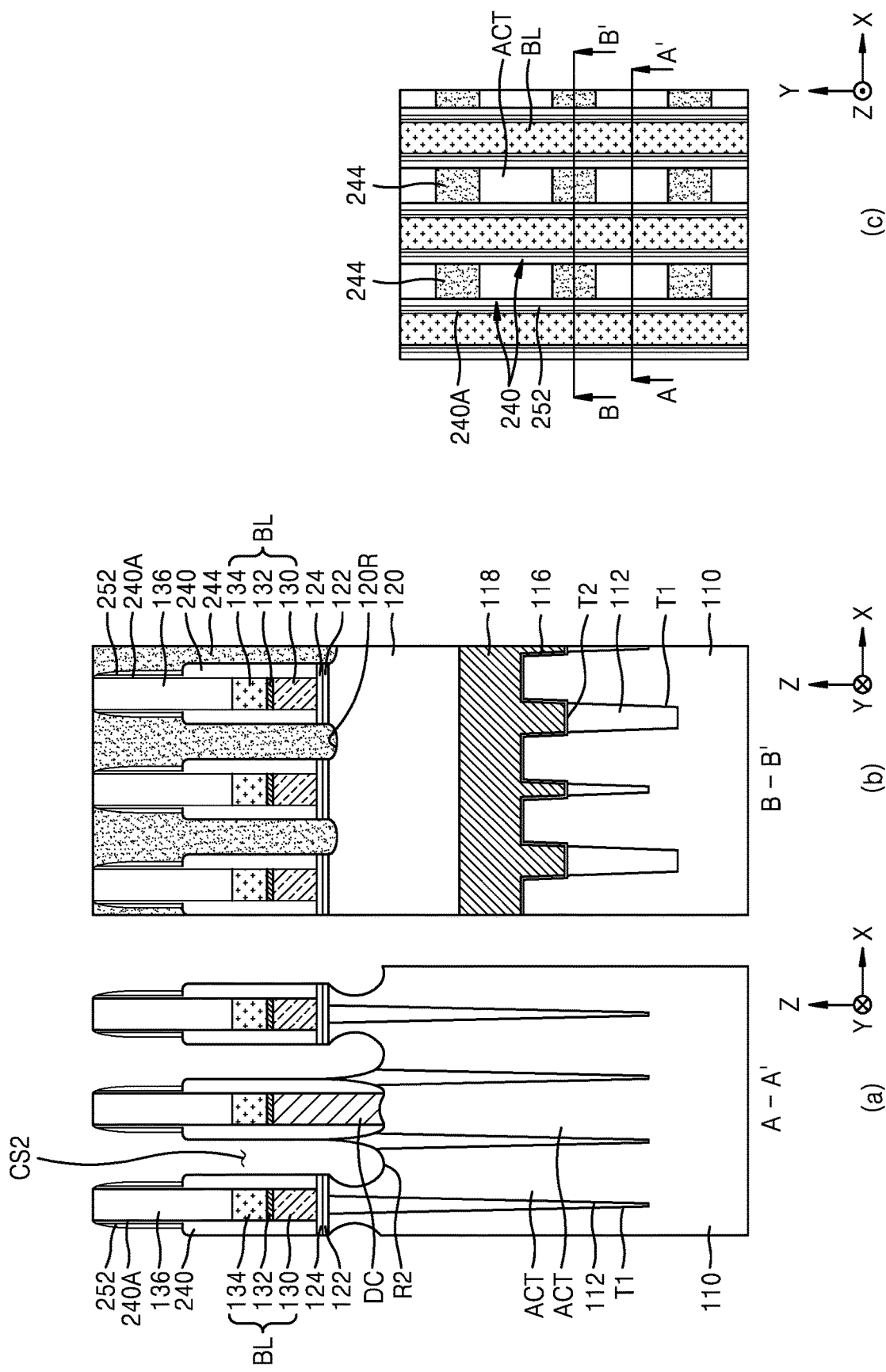

Referring to FIG. 19E, the mold 242 is removed from a result product of FIG. 19D, followed by forming the plurality of insulating fences 244 between the plurality of bit lines BL in a similar manner to that described as to the process of forming the plurality of insulating fences 144 with reference to FIG. 13H.

A portion of each of the plurality of insulating fences 244, which fills each of the plurality of upper line spaces ULS, may have a greater width than a portion thereunder. Each of the plurality of insulating fences 244 may include a silicon nitride film. The plurality of line spaces LS and the plurality of upper line spaces ULS may be separated into a plurality of contact spaces CS2 by the plurality of insulating fences 244.

Figure 19F:
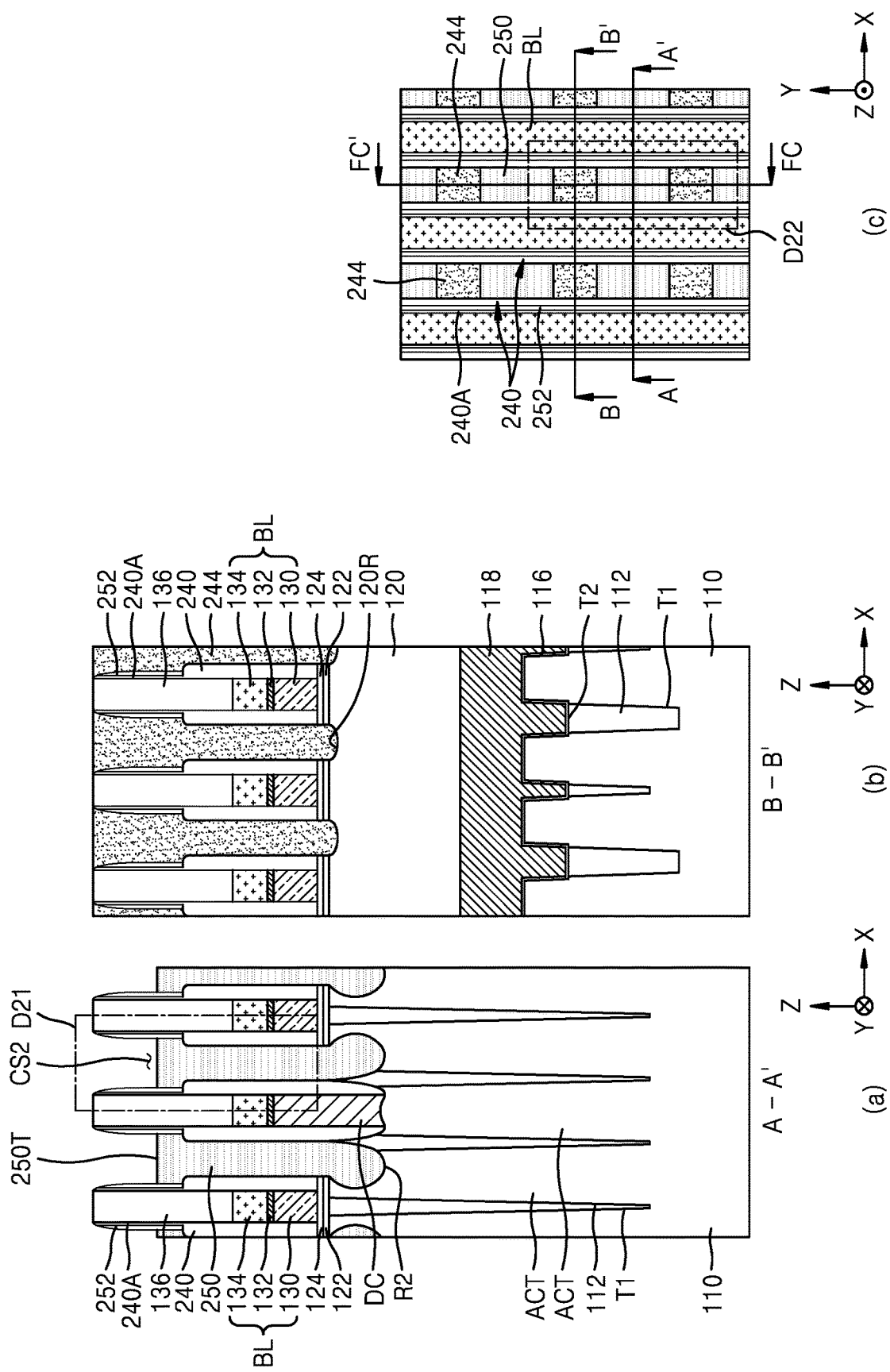

Referring to FIG. 19F, in a similar manner to that described as to the process of forming the plurality of lower conductive plugs 150 with reference to FIG. 13I, the plurality of conductive plugs 250 are formed to partially fill the contact spaces CS2 between the plurality of bit lines BL while filling the plurality of recess spaces R2 between the plurality of bit lines BL. The top surface 250T of each of the plurality of conductive plugs 250 may be at a higher level than a bottom surface of each of the plurality of upper insulating spacers 252. An upper portion of each of the plurality of conductive plugs 250 partially fills each of the plurality of contact spaces CS2 (see FIG. 19E) divided by the plurality of insulating fences 244 in the plurality of upper line spaces ULS (see FIG. 19D). Thus, the upper portion of each of the plurality of conductive plugs 250 may have a greater width than a lower portion thereof. Each of the plurality of conductive plugs 250 on the substrate 110 may have an approximately T-like cross-sectional shape along the X direction.

Figure 21A:
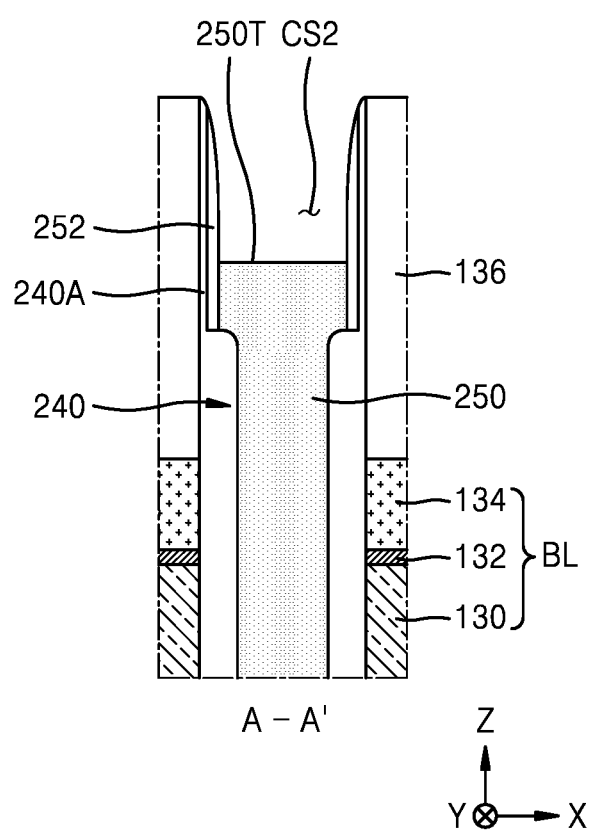
FIG. 21A is a partial cross-sectional view of a region indicated by "D22" in a plan view (c) of FIG. 19F, taken along a line A-A'.
Figure 21B:
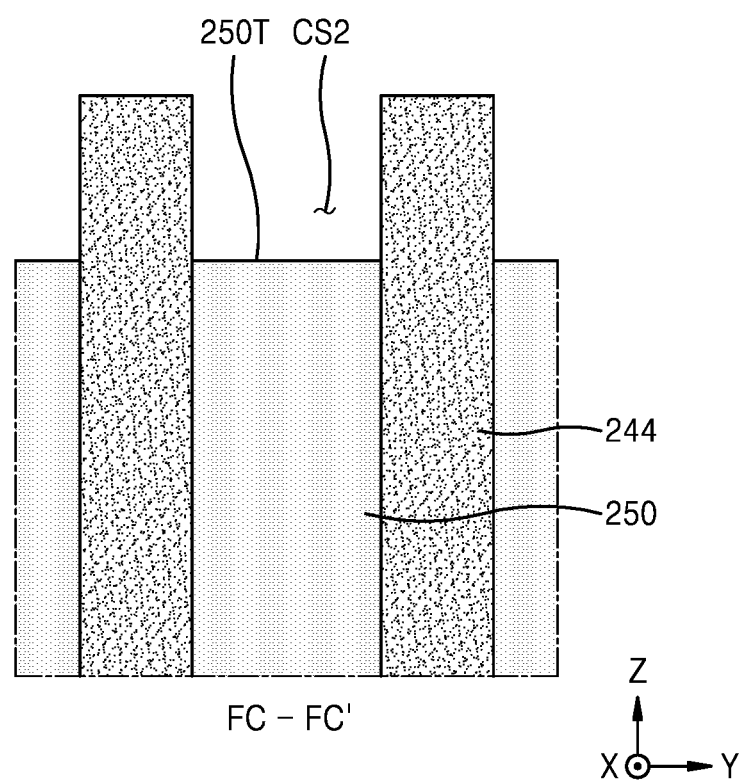
FIG. 21B is a partial cross-sectional view of the region indicated by "D22" in the plan view (c) of FIG. 19F, taken along a line FC-FC'.

FIG. 21A is an enlarged view of a region indicated by "D22" in the cross-sectional view (a) of FIG. 19F and is also a partial cross-sectional view of a region indicated by "D21" in the plan view (c) of FIG. 19F, taken along a line A-A', and FIG. 21B is a partial cross-sectional view of the region indicated by "D22" in the plan view (c) of FIG. 19F, taken along a line FC-FC'.

Referring to FIGS. 19F, 21A, and 21B, the top surface 250T of the conductive plug 250 may have a greater width than the lower portion of the conductive plug 250, in the X direction, that is, the direction parallel to the word line 118. Thus, the conductive plug 250 on the substrate 110 may have an approximately T-like cross-sectional shape.

On the other hand, as shown in FIG. 21B, in a cross-section along the Y direction, that is, the direction parallel to the bit line BL, both sidewalls opposite to each other among sidewalls of the conductive plug 250 may extend flat without a step from a portion thereof adjacent to the bit line BL to a portion thereof adjacent to the insulating capping pattern 136, along a height direction of a contact space CS2. Thus, the conductive plug 250 may have a flat sidewall contacting the insulating fence 244. In some embodiments, the conductive plug 250 may have a constant width along the height direction of the contact space CS2. In addition, among sidewalls of the insulating fence 244, both sidewalls opposite to each other in the Y direction, that is, the direction parallel to the bit line BL may not be covered by the upper insulating spacer 252. Thus, a relatively large contact area may be secured in the top surface 250T of the conductive plug 250.

Figure 19G:
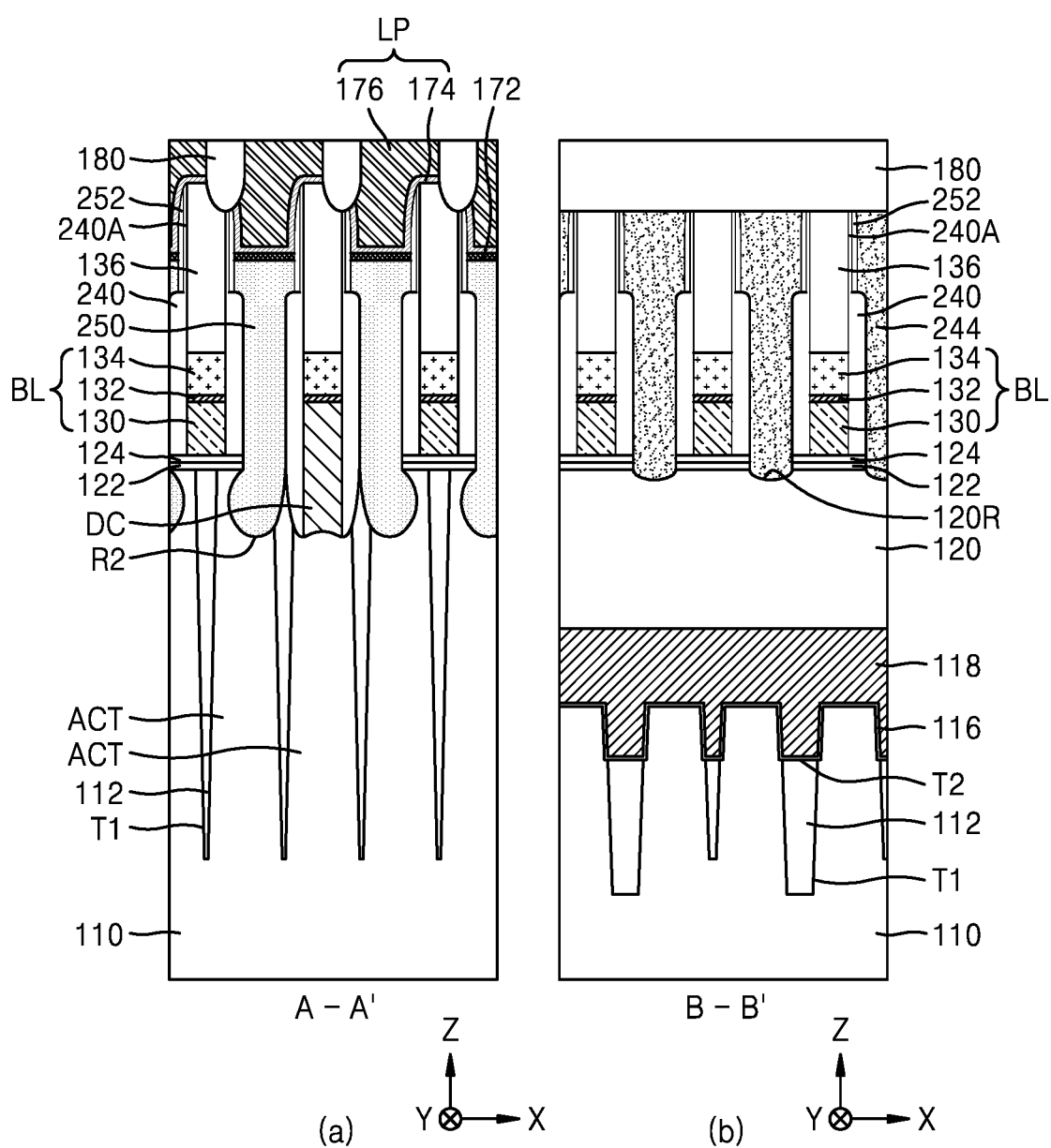

Referring to FIG. 19G, in a similar manner to that described with reference to FIG. 13M, the metal silicide film 172 is formed on each of the plurality of conductive plugs 250 exposed by the plurality of contact spaces CS2, and each of the plurality of conductive landing pads LP is formed on the metal silicide film 172. The conductive plug 250 and the metal silicide film 172 may constitute at least a portion of the buried contact BC shown in FIG. 1. The insulating film 180 may fill the spaces around the plurality of conductive landing pads LP. Next, the plurality of capacitor bottom electrodes, which may be electrically connected to the plurality of conductive landing pads LP, may be formed on the insulating film 180.

According to the method of fabricating the integrated circuit device, according to some example embodiments of the inventive concepts, as described with reference to FIGS. 19A to 19G, in forming the buried contact BC which is a contact structure connected to each active region ACT of the substrate 110 between the plurality of bit lines BL, the plurality of upper line spaces ULS are formed by enlarging an upper width of each line space LS in both lateral directions along the X direction, that is, the length direction of the word line 118, next, the plurality of line spaces LS and the plurality of upper line space ULS are separated into a plurality of contact spaces CS2 by the plurality of insulating fences 244, followed by forming the conductive plug 250 having the top surface of a relatively large surface area, which is located in each of the plurality of contact spaces CS2, and then, the metal silicide film 172 is formed on the top surface 250T of the conductive plug 250. Thus, the process of forming the metal silicide film 172 may be relatively facilitated, and the surface area of the metal silicide film 172 may be relatively greatly increased, thereby contributing to reducing the contact resistance of the contact structure including the metal silicide film 172.

Figure 22A:
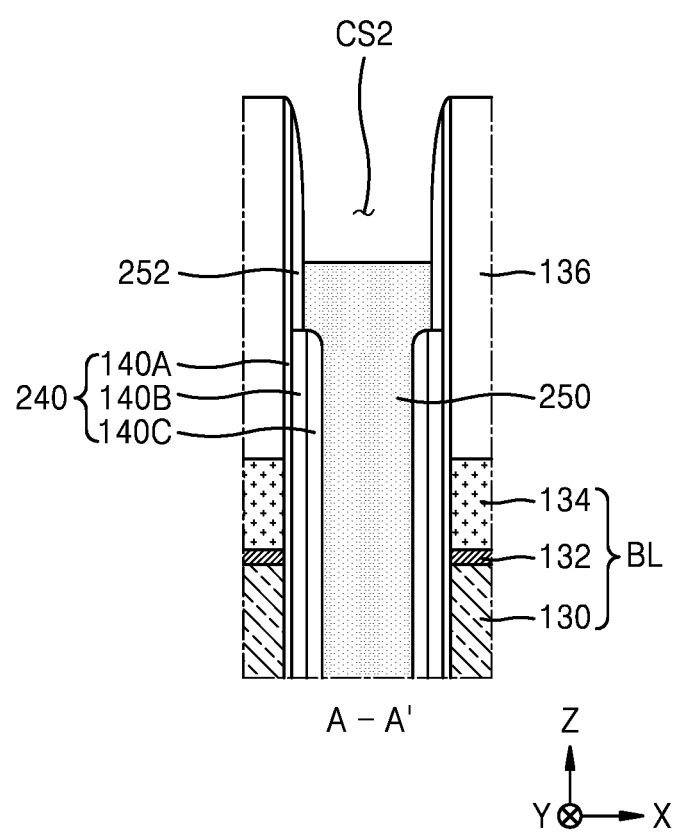
FIGS. 22A and 22B are partial cross-sectional views illustrating an example of a structure which may be obtained by a method of fabricating an integrated circuit device, according to some example embodiments of the inventive concepts.
Figure 22B:
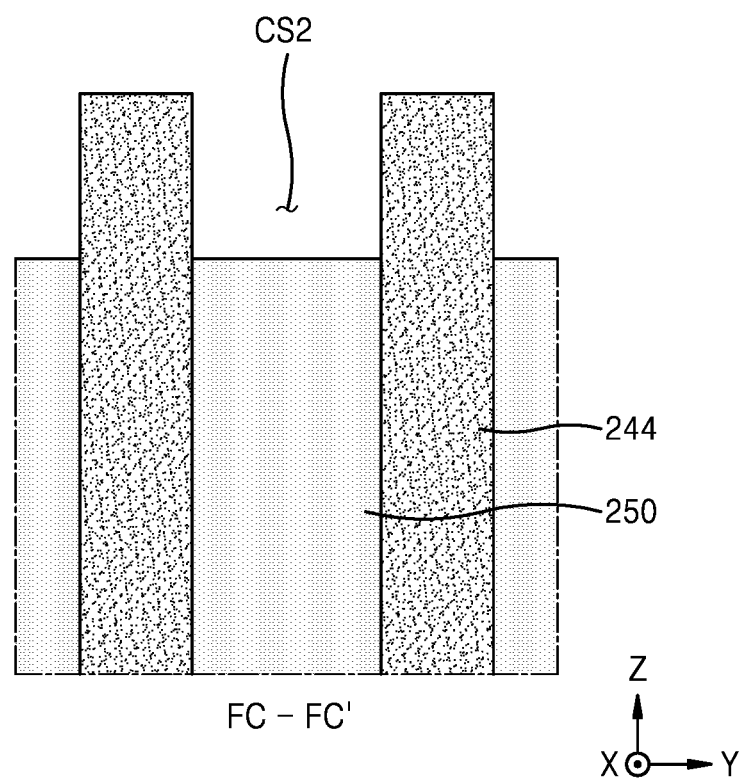

FIGS. 22A and 22B are partial cross-sectional views illustrating an example of a structure which may be obtained after the conductive plug 250 is formed according to the process of FIG. 19F, in the method of fabricating the integrated circuit device, which has been described with reference to FIGS. 19A to 19G, when the plurality of insulating spacers 240 each including the insulating liner 140A, the first insulating spacer 140B, and the second insulating spacer 140C are formed like in the example shown in FIG. 14C.

FIG. 22A is a partial cross-sectional view of the present example corresponding to a cress-sectional region taken along the line A-A' for the region indicated by "D22" in the plan view (c) of FIG. 19F, and FIG. 22B is a partial cross-sectional view of the present example corresponding to a cress-sectional region taken along the line FC-FC' for the region indicated by "D22" in the plan view (c) of FIG. 19F.

Referring to FIGS. 22A and 22B, the width of the upper insulating spacer 252 is less than a width of an insulating spacer 240, in the X direction, that is, the direction parallel to the word line 118. The upper insulating spacer 252 may be arranged to vertically overlap the first insulating spacer 140B of the insulating spacer 240. The integrated circuit device 200A including the insulating spacer SPC6 of a three-layer structure shown in FIGS. 7A to 7C may be fabricated by making reference to the description made with reference to FIGS. 22A and 22B, according to the method of fabricating the integrated circuit device, which has been described with reference to FIGS. 19A to 19G.

To fabricate the integrated circuit device 200B shown in FIG. 8, the method described with reference to FIGS. 22A and 22B may be used. However, in the processes for forming the structure of FIG. 19G, after the plurality of conductive landing pads LP are formed, before filling the spaces therearound with the insulating film 180, the method may further include a process of forming the lower air spacer 140AS by removing the first insulating spacer 140B shown in FIG. 22A. As a result, the insulating spacer SPC7 including the insulating liner 140A, the lower air spacer 140AS, and the second insulating spacer 140C may remain in a lower portion of the line space LS.

Figure 23A:
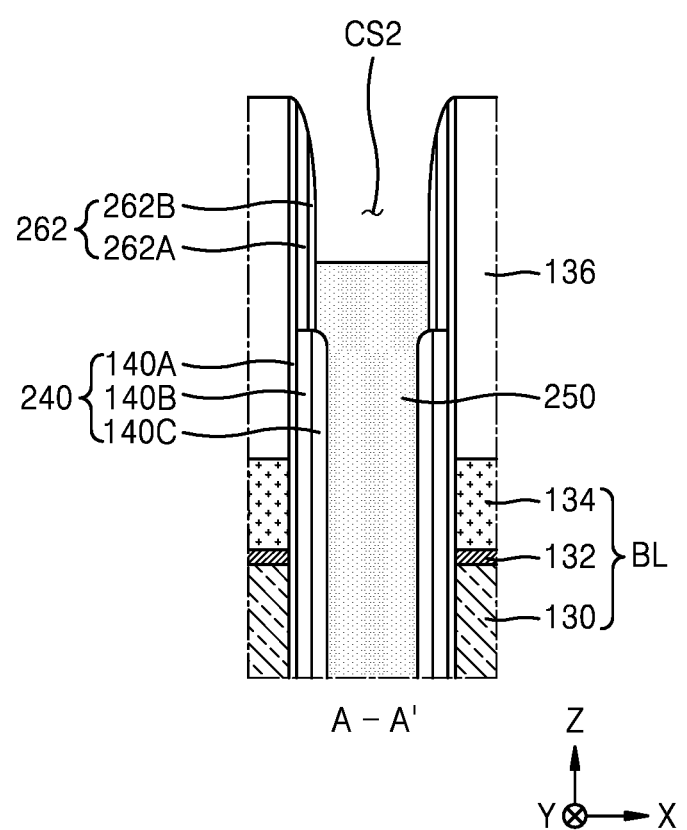
FIGS. 23A and 23B are cross-sectional views illustrating sequential processes of a method of fabricating an integrated circuit device, according to some example embodiments of the inventive concepts.
Figure 23B:
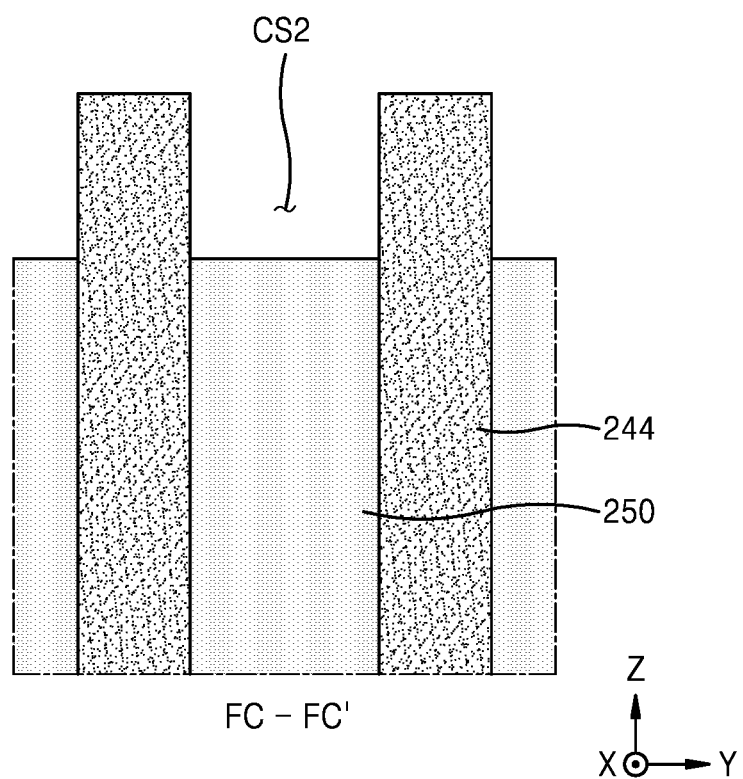

FIGS. 23A and 23B are cross-sectional views illustrating sequential processes of a method of fabricating an integrated circuit device, according to some example embodiments of the inventive concepts. FIG. 23A is a partial cross-sectional view of the present example corresponding to a cress-sectional region taken along the line A-A' for the region indicated by "D22" in the plan view (c) of FIG. 19F, and FIG. 23B is a partial cross-sectional view of the present example corresponding to a cress-sectional region taken along the line FC-FC' for the region indicated by "D22" in the plan view (c) of FIG. 19F. A method of fabricating the integrated circuit device 200C shown in FIG. 9A will be described with reference to FIGS. 23A and 23B.

Referring to FIG. 23A, the method of fabricating the integrated circuit device 200C shown in FIG. 9A is substantially identical to the methods described with reference to FIGS. 19A to 19G and FIGS. 22A and 22B. However, instead of the upper insulating spacer 252 described with reference to FIG. 19D, the upper insulating spacer 262 including two layers is formed. More specifically, to form the upper insulating spacer 262, reference may be made to the method of forming the upper insulating spacer 162, which has been described with reference to FIGS. 18A and 18B. However, the upper insulating spacer 262 may have a shape linearly extending long along an extension direction of the bit line BL.

The upper insulating spacer 262 may include the oxide spacer 262A covering the insulating liner 140A and the nitride spacer 262B on the oxide spacer 262A, the nitride spacer 262B covering the insulating liner 140A. Each of the oxide spacer 262A and the nitride spacer 262B may have a shape linearly extending long along the extension direction of the bit line BL. The insulating spacer 240 shown in FIG. 23A may constitute the insulating spacer SPC8 shown in FIG. 9A.

To fabricate the integrated circuit device 200D shown in FIGS. 10A and 10B, the method described with reference to FIGS. 23A and 23B may be used. However, in the processes for forming the structure of FIG. 19G, after the plurality of conductive landing pads LP are formed, before filling the spaces therearound with the insulating film 180, the method may further include a process of forming the lower air spacer 140AS and the upper air spacer 262AS by removing the first insulating spacer 140B and the oxide spacer 262A shown in FIG. 23A. The lower air spacer 140AS and the upper air spacer 262AS may communicate with each other. The width of the upper air spacer 262AS is less than the width of the lower air spacer 140AS, in the X direction, that is, the direction parallel to the word line 118. Thus, since the insulating film 180 covers the upper air spacer 262AS having a relatively narrow entrance when the insulating film 180 is formed in a subsequent process, the upper air spacer 262AS may be relatively easily closed. Therefore, the integrated circuit device 200D including the lower air spacer 140AS and the upper air spacer 262AS, which extend long along the extension direction of the bit line BL, may be easily fabricated.

Figure 24A:
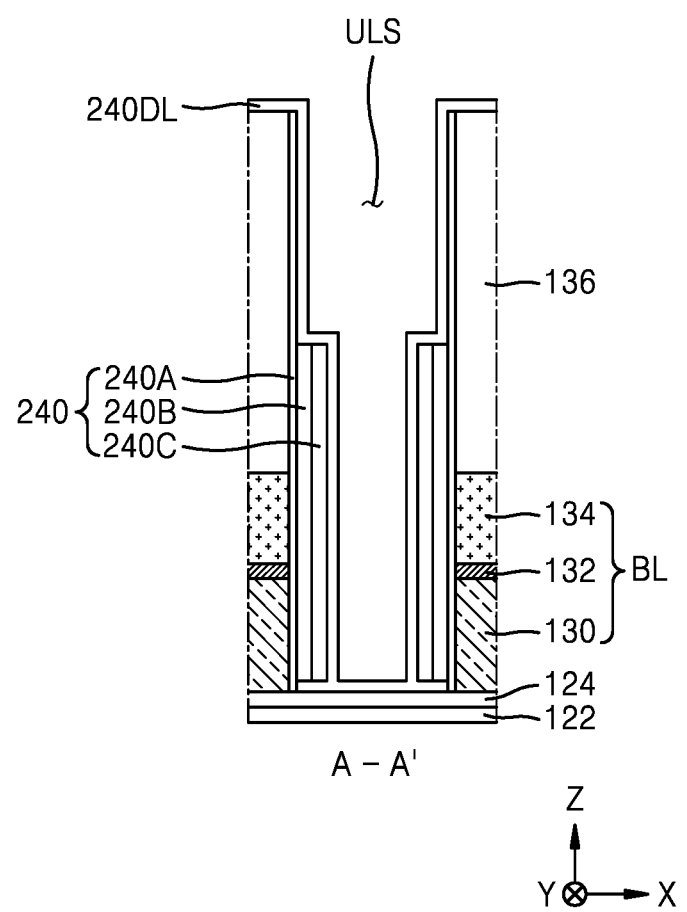
FIGS. 24A and 24B are cross-sectional views illustrating sequential processes of a method of fabricating an integrated circuit device, according to some example embodiments of the inventive concepts.
Figure 24B:
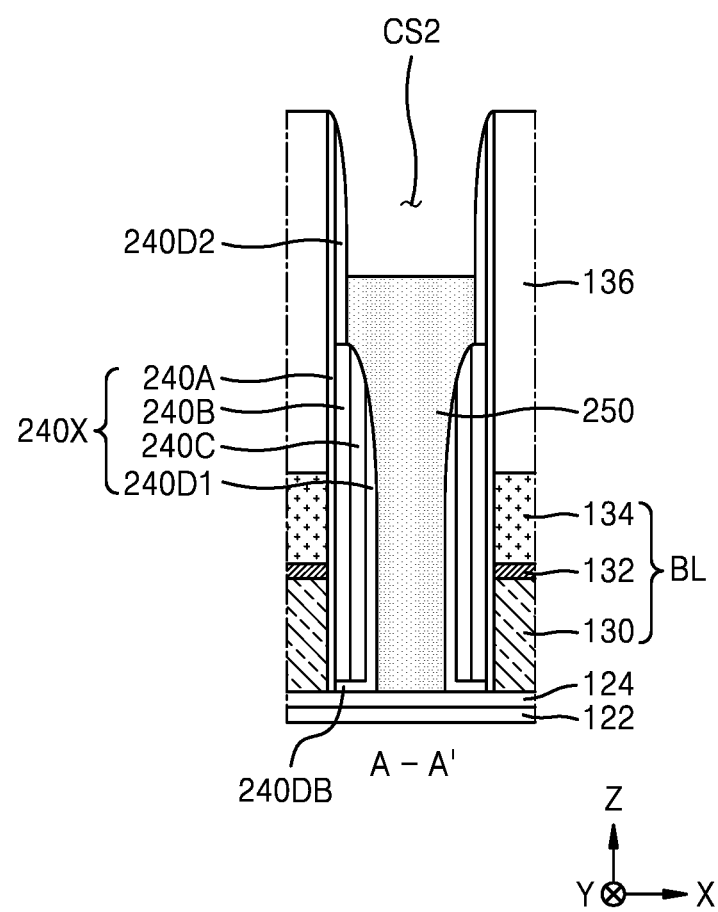

FIGS. 24A and 24B are cross-sectional views illustrating sequential processes of a method of fabricating an integrated circuit device, according to some example embodiments of the inventive concepts. A method of fabricating the integrated circuit device 200E shown in FIGS. 11A and 11B will be described with reference to FIGS. 24A and 24B.

Referring to FIG. 24A, similar processes to those described with reference to FIGS. 19A to 19C are performed, whereby each of the plurality of insulating spacers 240 exposed by the upper space at the entrance side of each line space LS (see FIG. 19A) is at least partially removed, and the plurality of upper line spaces ULS enlarged in width in both lateral directions along the X direction are respectively formed between the plurality of insulating capping patterns 136. However, in the present example, unlike in the description made with reference to FIG. 19A, a subsequent process is performed while the top surface of the second insulating film 124 is exposed by the line space LS (see FIG. 19A) above the buried insulating film 120, without forming the plurality of recess lines 120R on the top surface of the buried insulating film 120, on which the insulating spacer 240 is formed.

After the plurality of upper line spaces ULS are formed, the plurality of molds 242 are removed, thereby exposing a sidewall of the insulating spacer 240 in a lower portion of each of the plurality of line spaces LS (see FIG. 19B). Here, the insulating spacer 240 may include the insulating liner 240A, the first insulating spacer 240B, and the second insulating spacer 240C, which are shown in FIG. 20C, and a sidewall of the second insulating spacer 240C may be exposed in each of the plurality of line spaces LS after the plurality of molds 242 are removed.

A nitride liner 240DL is formed on a result product in which the plurality of molds 242 are removed, the nitride liner 240DL conformally covering the insulating spacer 240 exposed in the lower portion of the line space LS and the insulating liner 240A exposed in an upper portion of the line space LS. The nitride liner 240DL may be formed to contact the insulating liner 240A while filling the space between the bottom surfaces of the first insulating spacer 240B and the second insulating spacer 240C and the top surface of the second insulating film 124, in a bottom portion of the line space LS. Thus, the bottom surface of the first insulating spacer 240B and the second insulating spacer 240C may contact the nitride liner 240DL.

Referring to FIG. 24B, the nitride liner 240DL is partially removed by etch-back, whereby, from remaining portions of the nitride liner 240DL, the third insulating spacer 240D1 covering the sidewall of the second insulating spacer 240C is formed in the lower portion of the line space LS, and the upper insulating spacer 240D2 covering the insulating liner 240A is formed in the upper portion of the line space LS. As a result, an insulating spacer 240X of a four-layer structure including the insulating liner 240A, the first insulating spacer 240B, the second insulating spacer 240C, and the third insulating spacer 240D1 remains in the lower portion of the line space LS. In the insulating spacer 240X, the bottom portion 240DB of the third insulating spacer 240D1 may horizontally extend to contact the insulating liner 240A, in the bottom portion of the line space LS. In addition, the bottom surface of each of the first insulating spacer 240B and the second insulating spacer 240C may contact the bottom portion 240DB of the third insulating spacer 240D 1. The insulating spacer 240X may constitute the insulating spacer SPC10 shown in FIGS. 11A and 11B. In some embodiments, each of the third insulating spacer 240D1 and the upper insulating spacer 240D2 may include a silicon nitride film.

Next, in the same manner as described with reference to FIGS. 19E to 19G, the plurality of line spaces LS and the plurality of upper line spaces ULS are separated into the plurality of contact spaces CS2 by forming the plurality of insulating fences 244, followed by respectively forming the plurality of conductive plugs 250 in the plurality contact spaces CS2 in the same manner as described with reference to FIG. 19F. Next, the processes described with reference to FIG. 19G may be performed, thereby fabricating the integrated circuit device 200E shown in FIGS. 11A and 11B.

Figure 25:
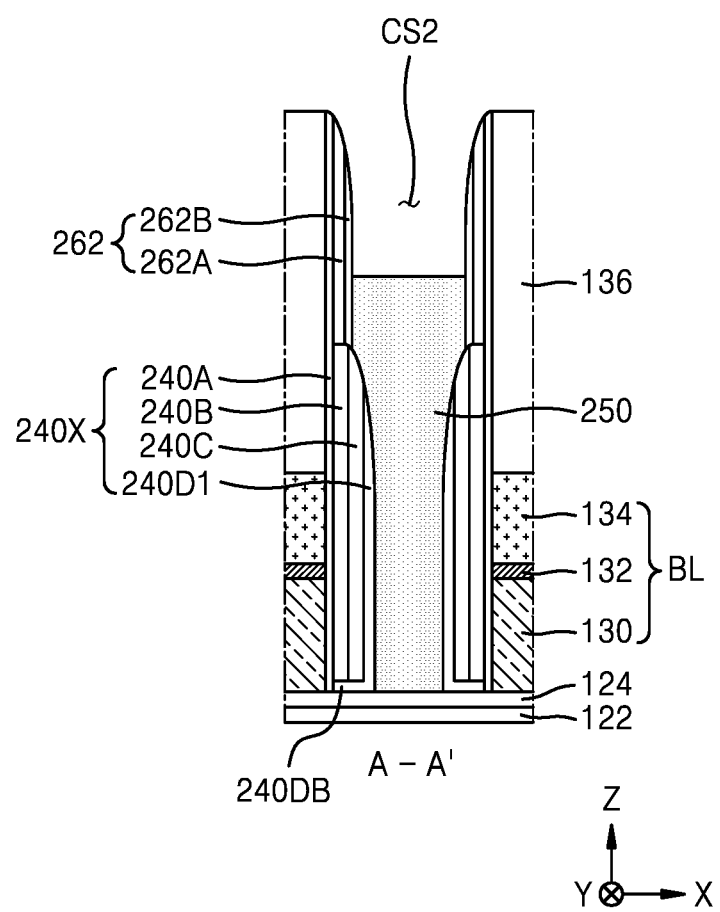
FIG. 25 is a cross-sectional view illustrating sequential processes of a method of fabricating an integrated circuit device, according to some example embodiments of the inventive concepts.

FIG. 25 is a cross-sectional view illustrating sequential processes of a method of fabricating an integrated circuit device, according to some example embodiments of the inventive concepts. A method of fabricating the integrated circuit device 200F shown in FIGS. 12A and 12B will be described with reference to FIG. 25.

Referring to FIG. 25, similar processes to those described with reference to FIGS. 24A and 24B are performed. However, before forming the nitride liner 240DL described with reference to FIG. 24A, the oxide spacer 262A, which covers the insulating liner 240A, is formed in the upper portion of the line space LS. Next, the nitride liner 240DL is formed on a result product, in which the oxide spacer 262A is formed, in a similar manner to the process of FIG. 24A, followed by performing etch-back of the nitride liner 240DL in a similar manner to that described with reference to FIG. 24B, whereby, from remaining portions of the nitride liner 240DL, the third insulating spacer 240D1, which covers the sidewall of the second insulating spacer 240C, may be formed in the lower portion of the line space LS, and the nitride spacer 262B, which covers the oxide spacer 262A, may be formed in the upper portion of the line space LS.

Next, in the same manner as described with reference to FIGS. 19E to 19G, the plurality of line spaces LS and the plurality of upper line spaces ULS are separated into the plurality of contact spaces CS2 by forming the plurality of insulating fences 244, followed by respectively forming the plurality of conductive plugs 250 in the plurality contact spaces CS2 in the same manner as described with reference to FIG. 19F. Next, the processes described with reference to FIG. 19G may be performed. Here, after the plurality of conductive landing pads LP are formed, before filling the spaces therearound with the insulating film 180, the first insulating spacer 240B and the oxide spacer 262A shown in FIG. 25 may be removed, thereby forming the lower air spacer 240AS shown in FIG. 12B and the upper air spacer 262AS, which communicates with the lower air spacer 240AS. As a result, the insulating spacer SPC11 of a four-layer structure including the insulating liner 240A, the lower air spacer 240AS, the second insulating spacer 240C, and the third insulating spacer 240D1 may remain in the lower portion of the line space LS. In addition, the upper insulating spacer 262Y including the insulating liner 240A, the upper air spacer 262AS, and the nitride spacer 262B may remain in the upper portion of the line space LS.

The width of the upper air spacer 262AS is less than the width of the lower air spacer 240AS, in the X direction, that is, the direction parallel to the word line 118. Thus, since the insulating film 180 covers the upper air spacer 262AS having a relatively narrow entrance when the insulating film 180 is formed in a subsequent process, the upper air spacer 262AS may be relatively easily closed. Therefore, the integrated circuit device 200F including the lower air spacer 240AS and the upper air spacer 262AS, which extend long along the extension direction of the bit line BL as shown in FIGS. 12A and 12B, may be easily fabricated.

Heretofore, although the methods of fabricating the integrated circuit devices shown in FIGS. 2A to 12B have been described with reference to FIGS. 13A to 25, it will be understood by those skilled in the art that, from the descriptions made with reference to FIGS. 13A to 25, integrated circuit devices of various modified and changed structures may be fabricated by making various modifications and changes without departing from the spirit and scope of the inventive concepts.

While the inventive concepts has been particularly shown and described with reference to embodiments thereof, it will be understood that various changes in form and details may be made therein without departing from the spirit and scope of the following claims.

What is claimed is:
1. An integrated circuit device, comprising:
  a pair of line structures including
    a pair of conductive lines extending over a substrate in
      a first horizontal direction, and a pair of insulating capping patterns respectively covering the pair of conductive lines;

a conductive plug between the pair of line structures, the conductive plug having a first width between the pair of conductive lines and a second width between the pair of insulating capping patterns, the first width and the second width in a second horizontal direction perpendicular to the first horizontal direction, the second width greater than the first width;

a metal silicide film contacting a top surface of the conductive plug between the pair of insulating capping patterns;

a lower insulating spacer between each conductive line and the conductive plug; and an upper insulating spacer between each insulating capping pattern and the conductive plug, wherein a width of the upper insulating spacer in the second horizontal direction is smaller than a width of the lower insulating spacer in the second horizontal direction, wherein opposing upper insulating spacers on opposite sides of the conductive plug define a width, in the second horizontal direction, of each of an upper portion of the conductive plug, the metal silicide film, and a lower portion of a conductive landing pad contacting a top surface of the metal silicide film to be the second width.

2. The integrated circuit device according to claim 1, wherein the conductive plug has a third width between the pair of conductive lines and a fourth width between the pair of insulating capping patterns, the third width and the fourth width in the first horizontal direction, the fourth width smaller than the third width.

3. The integrated circuit device according to claim 1, wherein the conductive plug includes
a lower conductive plug between the pair of conductive lines, the lower conductive plug having a top surface isolated from direct contact with the metal silicide film, and
an enlarged conductive plug between the pair of insulating capping patterns, the enlarged conductive plug having
a bottom surface contacting the top surface of the lower conductive plug, and
a top surface contacting the metal silicide film.

4. The integrated circuit device according to claim 1, wherein, among sidewalls of the conductive plug, each of a first sidewall and a second sidewall, which are both sidewalls opposite to each other in the first horizontal direction, extends flat without a step, from a region between the pair of conductive lines to a region between the pair of insulating capping patterns.

5. The integrated circuit device according to claim 1, wherein
the top surface of the conductive plug contacts the metal silicide film, and
the conductive plug integrally extends from a space between the pair of conductive lines to a space between the pair of insulating capping patterns.

6. The integrated circuit device according to claim 1, wherein
the lower insulating spacer has a line shape extending side by side with the pair of conductive lines in the first horizontal direction, and
the upper insulating spacer has a ring shape surrounding the conductive plug.

7. The integrated circuit device according to claim 1, wherein each of the lower insulating spacer and the upper insulating spacer has a line shape extending side by side with the pair of conductive lines in the first horizontal direction.

8. The integrated circuit device according to claim 1, wherein
the lower insulating spacer includes a lower air spacer,
the upper insulating spacer includes an upper air spacer communicating with the lower air spacer, and
a width of the upper air spacer in the second horizontal direction is smaller than a width of the lower air spacer in the second horizontal direction,
wherein
the lower air spacer has a line shape extending side by side with the pair of conductive lines in the first horizontal direction, and
the upper air spacer has a ring shape surrounding the conductive plug.

9. The integrated circuit device according to claim 1, further comprising:
a pair of insulating fences between the pair of conductive lines, the pair of insulating fences respectively contacting a first sidewall and a second sidewall opposite to each other in the first horizontal direction among sidewalls of the conductive plug.

10. An integrated circuit device comprising:
a pair of line structures including
a pair of conductive lines extending over a substrate in a first horizontal direction, and
a pair of insulating capping patterns respectively covering the pair of conductive lines;
a plurality of contact structures arranged in a line between the pair of line structures;
a plurality of insulating fences arranged sequentially between adjacent contact structures of the plurality of contact structures between the pair of line structures,
wherein each contact structure of the plurality of contact structures includes
a conductive plug having a first width between the pair of conductive lines in a second horizontal direction and a second width between the pair of insulating capping patterns in the second horizontal direction, the second horizontal direction perpendicular to the first horizontal direction, the second width greater than the first width;
a metal silicide film contacting a top surface of the conductive plug;
a lower insulating spacer between each conductive line and the conductive plug; and
an upper insulating spacer between each insulating capping pattern and the conductive plug,
wherein a width of the upper insulating spacer in the second horizontal direction is smaller than a width of the lower insulating spacer in the second horizontal direction,
wherein opposing upper insulating spacers on opposite sides of the conductive plug define a width, in the second horizontal direction, of each of an upper portion of the conductive plug, the metal silicide film, and a lower portion of a conductive landing pad contacting a top surface of the metal silicide film to be the second width.

11. The integrated circuit device according to claim 10, wherein the conductive plug includes
a lower conductive plug isolated from direct contact with the metal silicide film; and an enlarged conductive plug contacting the metal silicide film and having a width greater than a width of the lower conductive plug in the second horizontal direction.

12. The integrated circuit device according to claim 11, wherein a width of a top surface of the enlarged conductive plug in the second horizontal direction is greater than a width of a top surface of the lower conductive plug in the second horizontal direction.

13. The integrated circuit device according to claim 10, wherein the conductive plug includes two sidewalls contacting two adjacent insulating fences among the plurality of insulating fences, and each sidewall of the two sidewalls extends flat from a region between the pair of conductive lines to a region between the pair of insulating capping patterns.

14. The integrated circuit device according to claim 10, wherein the conductive plug integrally extends from a space between the pair of conductive lines to a space between the pair of insulating capping patterns.

15. The integrated circuit device according to claim 10, wherein the lower insulating spacer has a line shape extending side by side with each conductive line; and the integrated circuit device includes a plurality of upper insulating spacers, each upper insulating spacer of the plurality of upper insulating spacers having a ring shape configured to surround a conductive plug of each contact structure of the plurality of contact structures and has the width smaller than the width of the lower insulating spacer in the second horizontal direction.

16. The integrated circuit device according to claim 10, wherein the lower insulating spacer has a line shape extending side by side with each conductive line; and the upper insulating spacer is between each insulating capping pattern and each contact structure of the plurality of contact structures and has the width smaller than the width of the lower insulating spacer in the second horizontal direction.

17. The integrated circuit device according to claim 16, wherein the lower insulating spacer includes an insulating liner, an air spacer, a second insulating spacer, and a third insulating spacer, the insulating liner, the air spacer, the second insulating spacer, and the third insulating spacer sequentially located in a space between a sidewall of each conductive line and the conductive plug along the second horizontal direction, the third insulating spacer includes a bottom portion horizontally extending to contact the insulating liner in a vicinity of a bottom surface of each conductive line, and an end of the air spacer in a vicinity of the bottom surface of each conductive line is surrounded by the insulating liner, the second insulating spacer, and the bottom portion of the third insulating spacer.

18. The integrated circuit device according to claim 16, wherein the lower insulating spacer includes a lower air spacer having a line shape extending side by side with each conductive line, the upper insulating spacer includes an upper air spacer having a ring shape configured to surround the conductive plug and communicating with the lower air spacer, and a width of the upper air spacer in the second horizontal direction is smaller than a width of the lower air spacer in the second horizontal direction.

19. The integrated circuit device according to claim 16, wherein the lower insulating spacer includes a lower air spacer having a line shape extending side by side with each conductive line, the upper insulating spacer includes an upper air spacer having a line shape configured to extend side by side with each conductive line and communicating with the lower air spacer, and a width of the upper air spacer in the second horizontal direction is smaller than a width of the lower air spacer in the second horizontal direction.

* * * * *